United States Patent
Smeys et al.

(10) Patent No.: US 8,410,576 B2
(45) Date of Patent: Apr. 2, 2013

(54) INDUCTIVE STRUCTURE AND METHOD OF FORMING THE INDUCTIVE STRUCTURE WITH AN ATTACHED CORE STRUCTURE

(75) Inventors: Peter Smeys, San Jose, CA (US); Andrei Papou, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 423 days.

(21) Appl. No.: 12/816,788

(22) Filed: Jun. 16, 2010

(65) Prior Publication Data

US 2011/0310579 A1    Dec. 22, 2011

(51) Int. Cl.
 *H01F 27/28* (2006.01)
(52) U.S. Cl. ........ 257/531; 257/277; 257/379; 257/516; 257/528; 257/E21.003; 257/E21.022; 438/3; 438/238; 438/329; 438/381; 29/602.1; 29/606; 336/212; 336/220
(58) Field of Classification Search .......... 257/277, 257/528, 531, E21.022, 379, 516, E21.003; 438/3, 238, 329, 381; 29/602.1, 606; 336/212, 336/220
See application file for complete search history.

(56) References Cited

U.S. PATENT DOCUMENTS

| | | | |
|---|---|---|---|
| 5,336,921 A * | 8/1994 | Sundaram et al. | 257/531 |
| 5,852,866 A * | 12/1998 | Kuettner et al. | 29/608 |
| 6,054,329 A | 4/2000 | Burghartz et al. | |
| 6,083,802 A * | 7/2000 | Wen et al. | 438/381 |
| 6,639,298 B2 * | 10/2003 | Chaudhry et al. | 257/531 |
| 6,667,536 B2 * | 12/2003 | Chaudhry et al. | 257/531 |
| 7,262,680 B2 | 8/2007 | Wang | |
| 7,462,317 B2 | 12/2008 | Lotfi et al. | |
| 7,468,899 B1 | 12/2008 | Hopper et al. | |
| 7,584,533 B2 | 9/2009 | Smeys et al. | |
| 7,705,411 B2 | 4/2010 | Smeys et al. | |
| 7,755,463 B2 | 7/2010 | Hopper et al. | |
| 7,842,544 B2 | 11/2010 | Smeys et al. | |
| 7,843,056 B2 | 11/2010 | Smeys et al. | |
| 7,898,068 B2 | 3/2011 | Smeys et al. | |
| 7,901,981 B2 | 3/2011 | Smeys et al. | |
| 7,901,984 B2 | 3/2011 | Smeys et al. | |
| 7,902,661 B2 | 3/2011 | Smeys et al. | |
| 7,936,246 B2 | 5/2011 | Hopper et al. | |
| 2004/0195652 A1 * | 10/2004 | Okada | 257/531 |
| 2005/0170554 A1 * | 8/2005 | Griglione et al. | 438/104 |
| 2006/0157798 A1 | 7/2006 | Hayashi et al. | |
| 2007/0148947 A1 * | 6/2007 | Davies | 438/599 |
| 2009/0038142 A1 | 2/2009 | Hopper et al. | |

(Continued)

OTHER PUBLICATIONS

U.S. Appl. No. 13/013,563, filed Jan. 25, 2011 to Peter Smeys et al.

(Continued)

*Primary Examiner* — Matthew Reames
*Assistant Examiner* — Ermias Woldegeorgis
(74) *Attorney, Agent, or Firm* — Eugene C. Conser; Wade J. Brady, III; Frederick J. Telecky, Jr.

(57) ABSTRACT

An inductor is formed on a wafer by attaching a first core structure to the wafer with a pick and place operation, forming a coil with one or more thick metal layers over the first core structure, and then attaching a second core structure to the first core structure with the pick and place operation after the coil has been formed. In addition, the pick and place operation can also be used to attach one or more integrated circuits to the wafer to form an integrated inductive device.

6 Claims, 62 Drawing Sheets

U.S. PATENT DOCUMENTS

| | | |
|---|---|---|
| 2009/0140383 A1 | 6/2009 | Chang et al. |
| 2009/0160592 A1 | 6/2009 | Hopper et al. |
| 2009/0181473 A1 | 7/2009 | Smeys et al. |
| 2009/0256667 A1 | 10/2009 | Smeys et al. |
| 2010/0190311 A1 | 7/2010 | Smeys et al. |

OTHER PUBLICATIONS

U.S. Appl. No. 12/943,391, filed Nov. 10, 2010 to Peter Smeys et al.
U.S. Appl. No. 12/603,086, filed Oct. 21, 2009 to Peter Smeys et al.
U.S. Appl. No. 13/098,656, filed May 2, 2011 to Peter Smeys et al.
Mathuna et al., "Magnetics on Silicon: An Enabling Technology for Power Supply on Chip", IEEE Transactions on Power Electronics, vol. 20, No. 3, May 2005, pp. 585-592.
Lotfi et al., "Issues and Advances in High-Frequency Magnetics for Switching Power Supplies", Proceedings of the IEEE, vol. 89, No. 6, Jun. 2001, pp. 833-845.
PCT International Search Report for PCT/US2011/038483.
PCT Written Opinion of the International Searching Authority for PCT/US2011/038483.

* cited by examiner

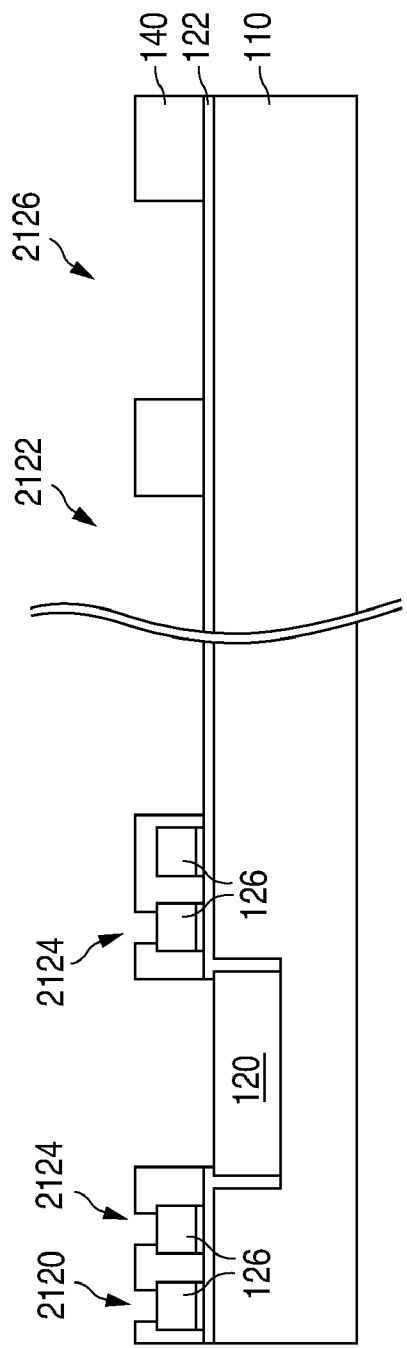
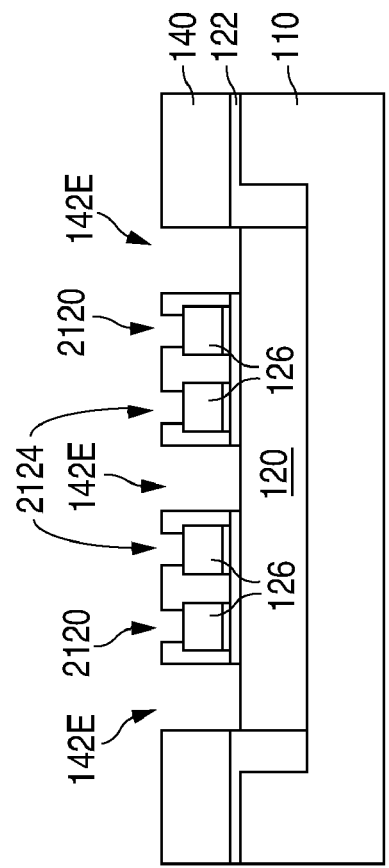

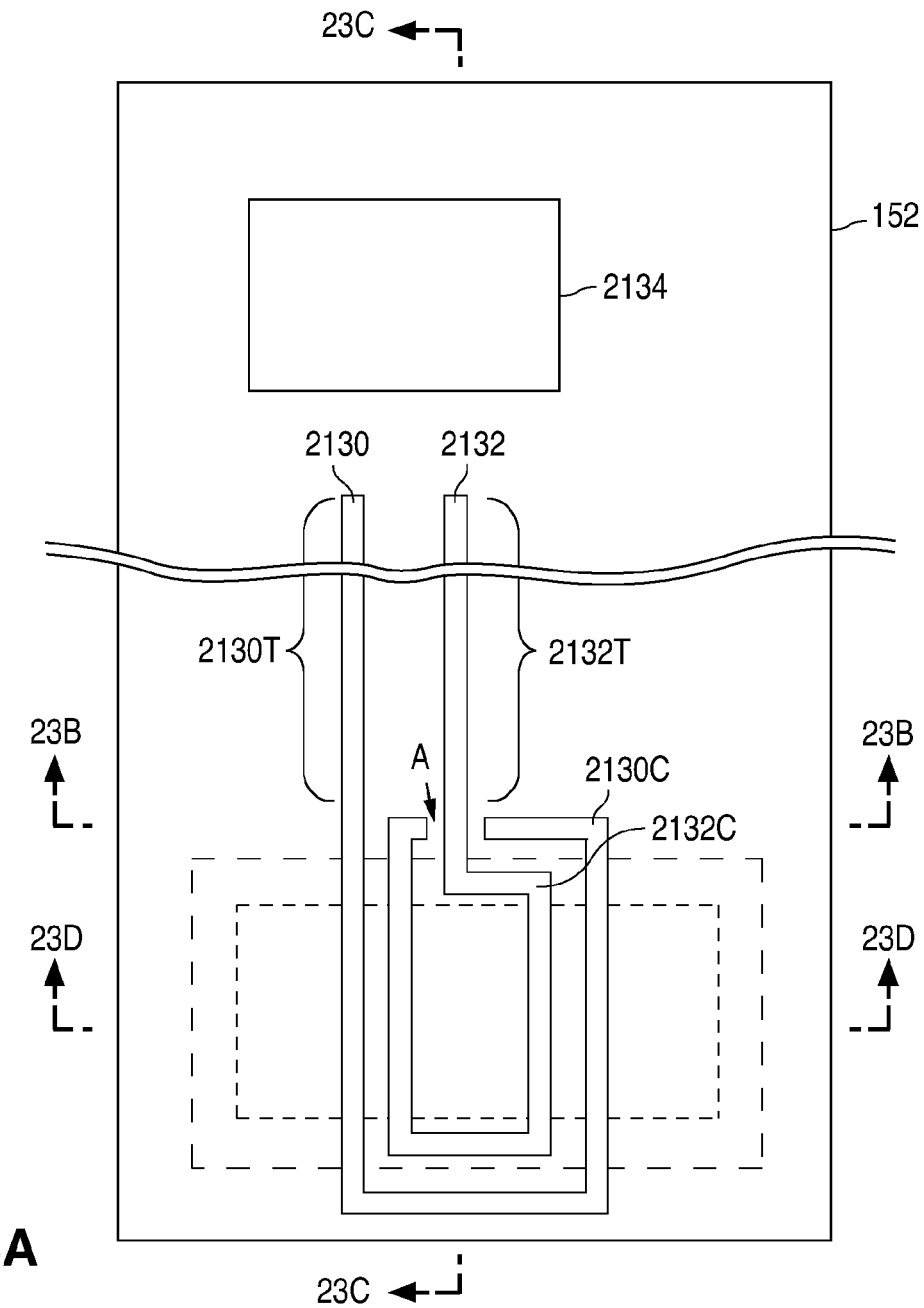
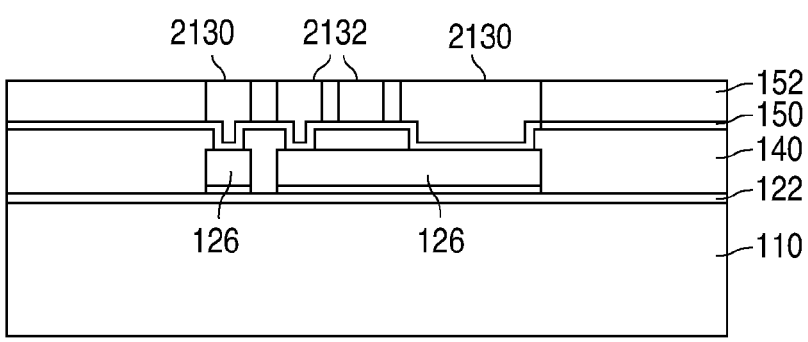
FIG. 23A
FIG. 23B

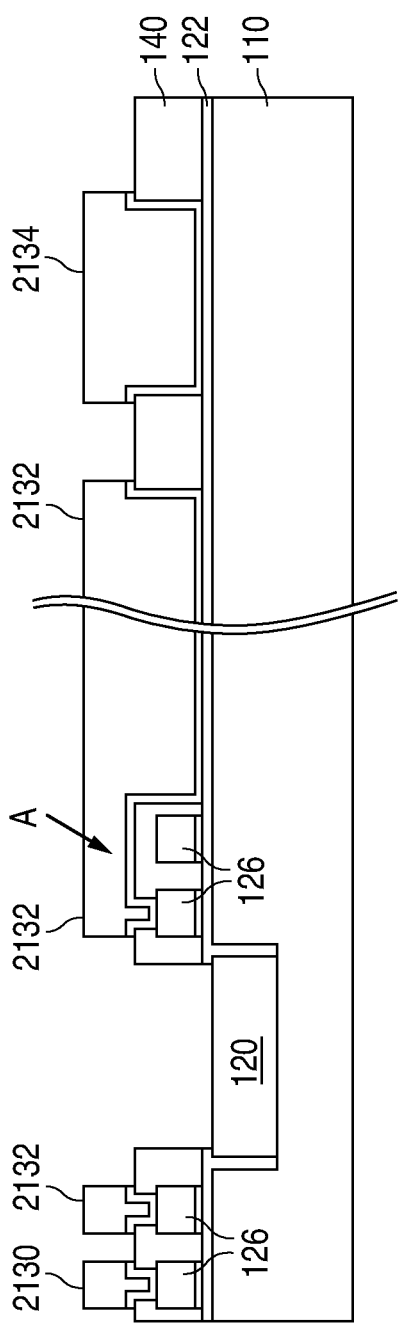
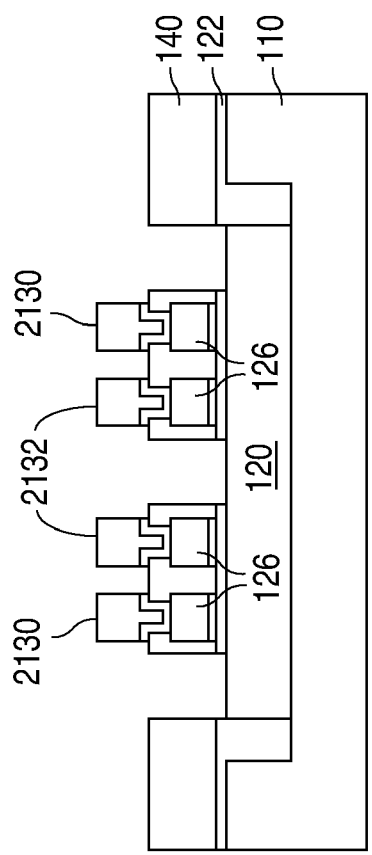
FIG. 24C
FIG. 24D

INDUCTIVE STRUCTURE AND METHOD OF FORMING THE INDUCTIVE STRUCTURE WITH AN ATTACHED CORE STRUCTURE

BACKGROUND OF THE INVENTION

1. Field of the Invention

The present invention relates to inductive structures and, more particularly, to an inductive structure and a method of forming the inductive structure with an attached core structure.

2. Description of the Related Art

Inductors are well-known structures that store electromagnetic energy, whereas transformers are well-known structures that inductively transfer electrical energy from a primary coil to a secondary coil. Inductors and transformers commonly use a magnetic material, known as a core, to increase the inductance and the amount of energy stored or transferred from the primary coil to the secondary coil.

Semiconductor inductors and transformers are commonly formed during back end silicon processing. Although many techniques exist in the prior art for forming semiconductor inductors and transformers, there is a need for additional methods of forming semiconductor inductors and transformers.

BRIEF DESCRIPTION OF THE DRAWINGS

FIGS. 1A-20A are a series of plan views, while FIGS. 1B-20B are a series of cross-sectional views taken along lines 1B-20B, respectively, in FIGS. 1A-20A.

FIGS. 21A-21D through 37A-37D are a series of views illustrating an example of a method of forming an integrated inductive device 2100 in accordance with the present invention. FIGS. 21A-37A are a series of plan views, FIGS. 21B-37B are a series of cross-sectional views taken along lines 21B-37B, respectively, in FIGS. 21A-37A, FIGS. 21C-37C are a series of cross-sectional views taken along lines 21C-37C, respectively, in FIGS. 21A-37A, and FIGS. 21D-37D are a series of cross-sectional views taken along lines 21D-37D, respectively, in FIGS. 21A-37A.

FIG. 38A is a plan view, while FIG. 38B is a cross-sectional view taken along line 38B-38B of FIG. 38A.

DETAILED DESCRIPTION OF THE INVENTION

FIGS. 1A-1B through 20A-20B show a series of views that illustrate an example of a method of forming an inductor 100 in accordance with the present invention. FIGS. 1A-20A show a series of plan views, while FIGS. 1B-20B show a series of cross-sectional views taken along lines 1B-20B, respectively, in FIGS. 1A-20A.

As described in greater detail below, the present invention forms an inductor on a wafer by attaching a bottom core structure to the wafer with a pick and place operation, forming a coil with one or more thick metal layers over the bottom core structure, and then attaching a top core structure to the bottom core structure with the pick and place operation after the coil has been formed. In addition, the pick and place operation can also be used to attach one or more integrated circuits to the wafer to form an integrated inductive device.

Figure 1A:
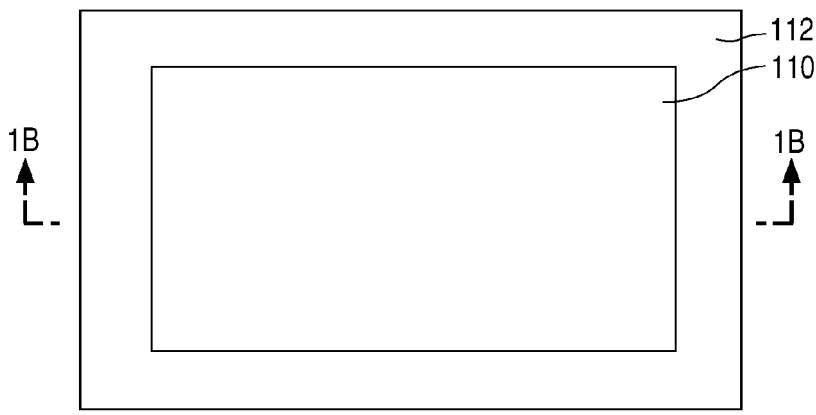
FIGS. 1A-1B through 20A-20B are a series of views illustrating an example of a method of forming an inductor 100 in accordance with the present invention.
Figure 1B:
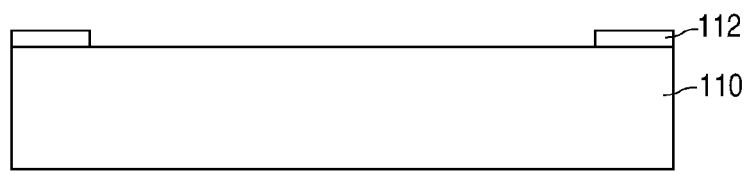

As shown in the FIGS. 1A-1B, the method of forming inductor 100 utilizes a conventionally-formed semiconductor wafer 110. Wafer 110, in turn, can be implemented with a conducting material, such as silicon, or a non-conducting material such as quartz or G10-FR4. As further shown in FIGS. 1A-1B, the method begins by forming a patterned photoresist layer 112 on the top surface of wafer 110.

Patterned photoresist layer 112 is formed in a conventional manner, which includes depositing a layer of photoresist, projecting a light through a patterned black/clear glass plate known as a mask to form a patterned image on the layer of photoresist that softens the photoresist regions exposed by the light, and removing the softened photoresist regions.

Figure 2A:
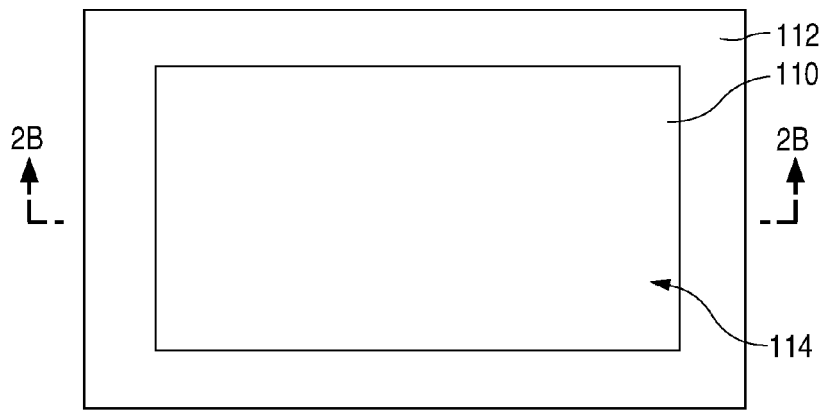
Figure 2B:

As shown in FIGS. 2A-2B, after patterned photoresist layer 112 has been formed, the exposed region of wafer 110 is etched in a conventional manner to form a cavity 114 in wafer 110. Following the formation of cavity 114, patterned photoresist layer 112 is removed in a conventional manner. If wafer 110 is conductive, a conformal non-conducting material, such as oxide or plasma nitride, can be optionally formed on wafer 110 to line cavity 114 so that the bottom surface of cavity 114 is non-conductive.

Figure 3A:
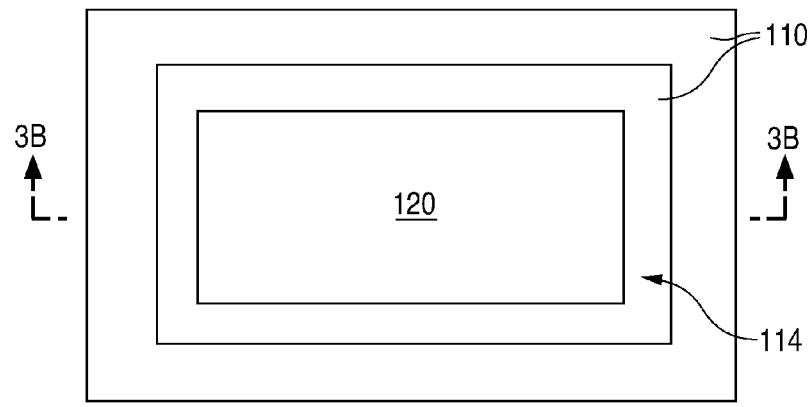
Figure 3B:
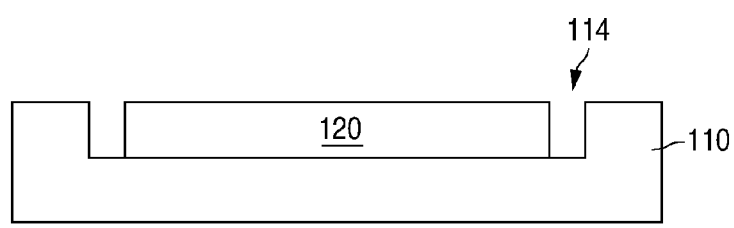

Next, as shown in FIGS. 3A-3B, a bottom core section 120 is placed in cavity 114 and attached to the bottom surface of cavity 114. Bottom core section 120 can be placed in cavity 114 using a conventional pick and place machine, and attached in a conventional manner using, for example, conventional conductive or non-conductive adhesives, such as a die attach film. The die attach film can be, for example, 25 µm thick. In addition, bottom core section 120, which is formed in a conventional manner in a separate process, can be implemented with, for example, electroplated alloys of (Co)NiFe or soft ferrites, such as NiZn and MnZn.

Figure 4A:
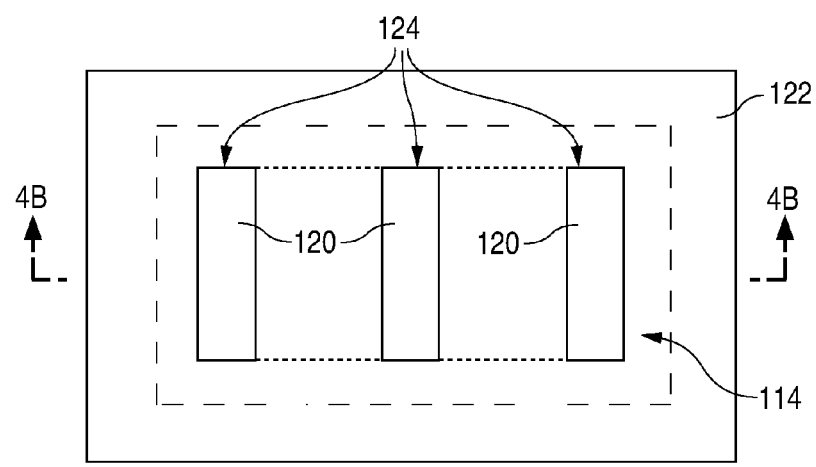
Figure 4B:
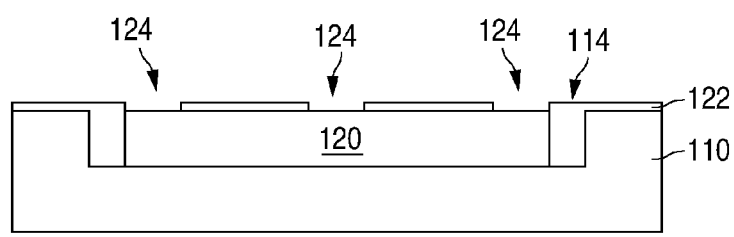

As shown in FIGS. 4A-4B, after bottom core section 120 has been attached to the bottom surface of cavity 114, a non-conductive layer 122 is deposited on bottom core section 120 and wafer 110. As shown, non-conductive layer 122 also fills up the remainder of cavity 114. After non-conductive layer 122 has been deposited, a number of openings 124 are formed in non-conductive layer 122 to expose the top surface of bottom core section 120.

In the present example, non-conductive layer 122 is formed with a layer of photoimageable epoxy or polymer, such as SU-8, which is substantially self planarizing. Once the photoimageable epoxy or polymer has been deposited, the openings 124 are formed by projecting a light through a mask to form a patterned image on non-conductive layer 122 that softens the regions of non-conductive layer 122 that are exposed by the light, and then removing the softened regions of non-conductive layer 122.

Figure 5A:
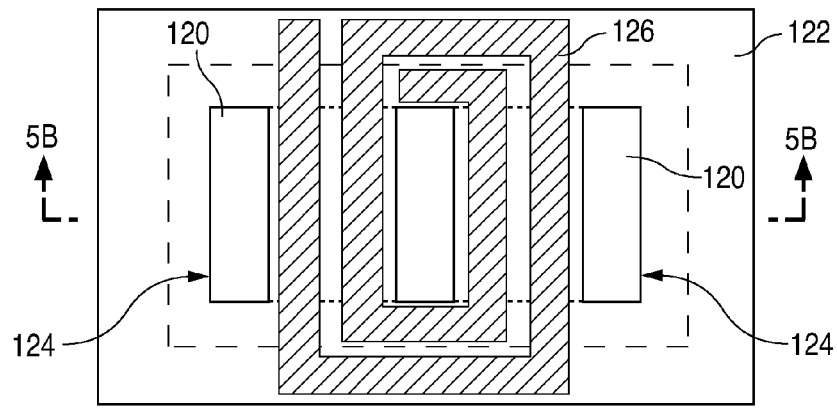
Figure 5B:
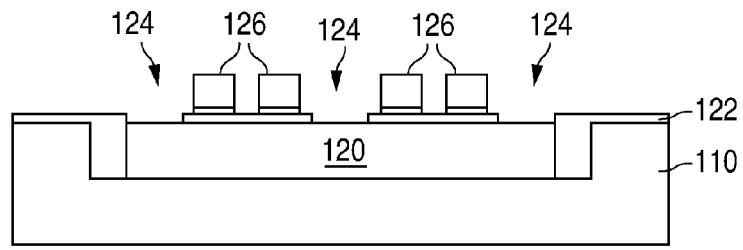
Figure 6A:
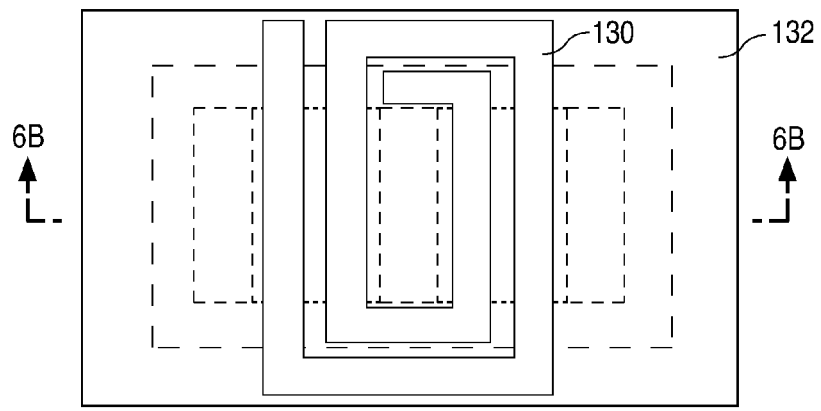
Figure 6B:
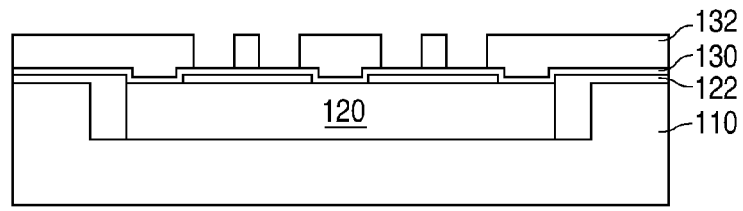

Following the formation of the openings 124, as shown in FIGS. 5A-5B, a coil structure 126 is formed on non-conductive layer 122 to lie over a portion of bottom core section 120. As shown in FIGS. 6A-6B, coil structure 126 is formed by first forming a seed layer 130 on non-conductive layer 122 to line the openings 124 and touch the top surface of bottom core section 120.

For example, seed layer 130 can be formed by depositing 300 Å of titanium, 3000 Å of copper, and 300 Å of titanium. Once seed layer 130 has been formed, a plating mold 132 is formed on the top surface of seed layer 130. Plating mold 132, in turn, has an opening that exposes a portion of seed layer 130 and defines the shape of the to-be-formed coil structure.

Figure 7A:
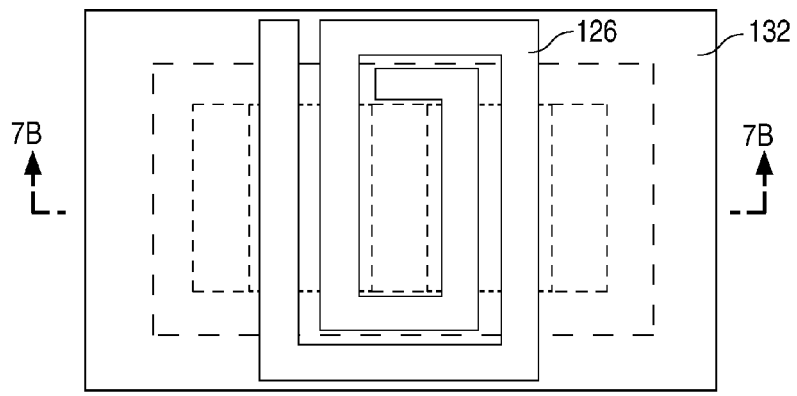
Figure 7B:
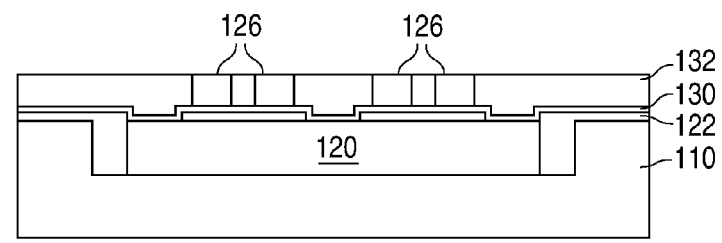
Figure 8A:
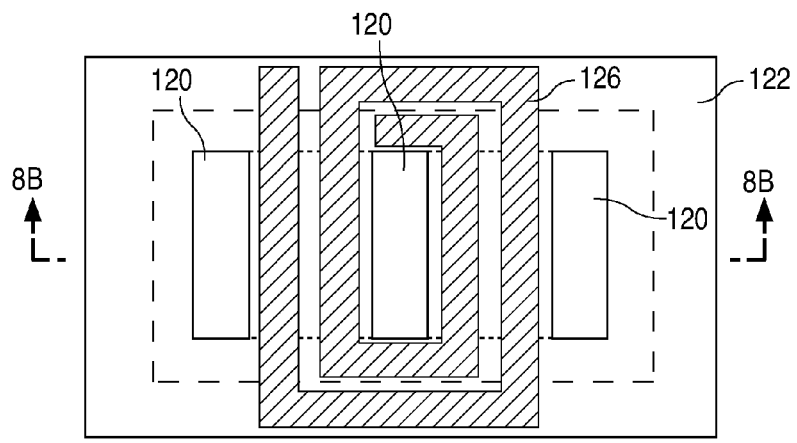
Figure 8B:
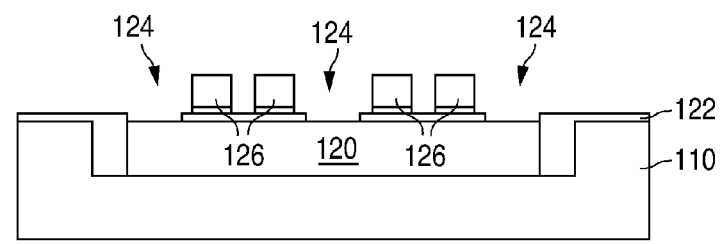

As shown in FIGS. 7A-7B, following the formation of plating mold 132, the top titanium layer is stripped and copper is deposited by electroplating to form coil structure 126. As shown in FIGS. 8A-8B, after the electroplating, plating mold 132 and the underlying regions of seed layer 130 are removed.

Figure 9A:
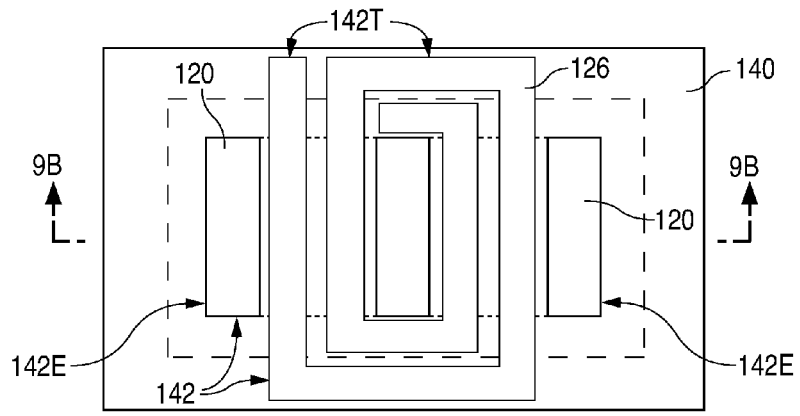
Figure 9B:
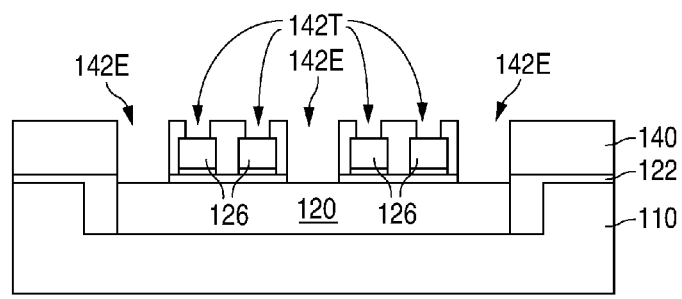

After coil structure 126 has been formed, as shown in FIGS. 9A-9B, a non-conductive layer 140 is deposited on coil structure 126, non-conductive layer 122, and the top surface of bottom core section 120. After non-conductive layer 140 has been deposited, a number of openings 142 are formed in non-conductive layer 140.

In the present example, non-conductive layer 140 is formed with a layer of photoimageable epoxy or polymer, such as SU-8, which is substantially self planarizing. Once the photoimageable epoxy or polymer has been deposited, the openings 142 are formed by projecting a light through a mask to form a patterned image on non-conductive layer 140 that softens the regions of non-conductive layer 140 that are exposed by the light, and then removing the softened regions of non-conductive layer 140.

If coil structure 126 is sufficiently thick to provide the required inductance, then coil structure 126 forms the coil of inductor 100. In this case, the openings 142 include only openings 142E that expose the same regions of the top surface of bottom core section 120 that were previously exposed by the openings 124. On the other hand, if coil structure 126 is not sufficiently thick to provide the required inductance, then the openings 142 also include a trench opening 142T that exposes coil structure 126 as shown in FIGS. 9A-9B.

In the present example, trench opening 142T exposes the top surface of coil structure 126 from one end of coil structure 126 to the other end of coil structure 126. Alternately, rather than forming trench opening 142T, a number of spaced-apart via openings can be formed to expose the top surface of coil structure 126.

Figure 10A:
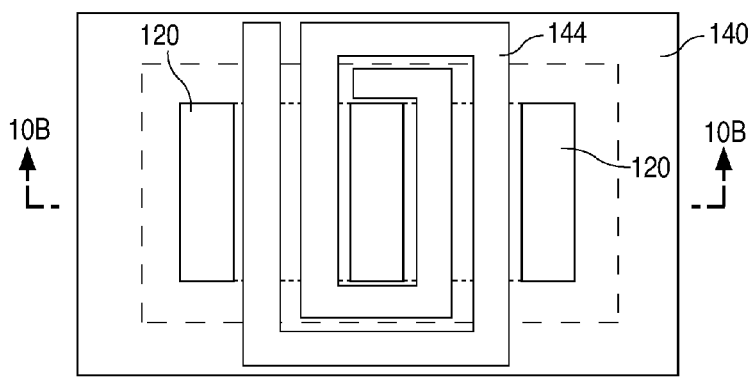
Figure 10B:
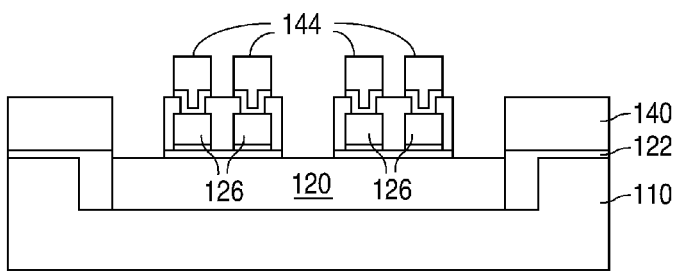
Figure 11A:
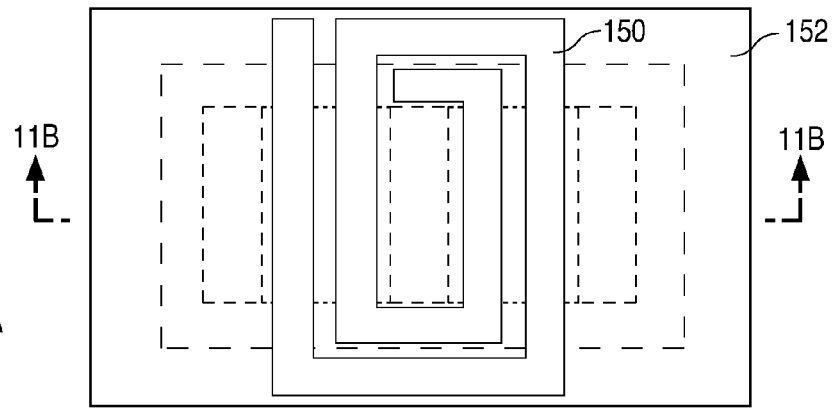
Figure 11B:
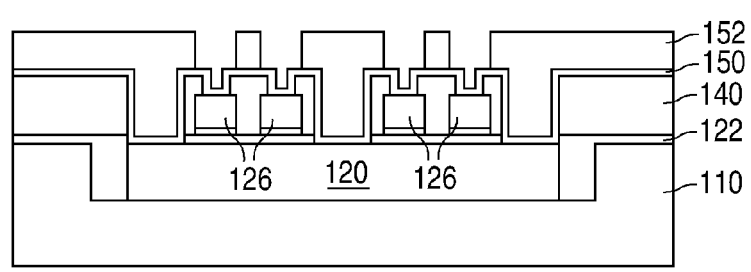

As shown in FIGS. 10A-10B, when coil structure 126 is not sufficiently thick, a coil structure 144 is formed on coil structure 126 to provide a thicker coil. As shown in FIGS. 11A-11B, coil structure 144 is formed by first forming a seed layer 150 on non-conductive layer 140 to line the openings 142 and touch coil structure 126 and the top surface of bottom core section 120.

For example, seed layer 150 can be formed by depositing 300 Å of titanium, 3000 Å of copper, and 300 Å of titanium. Once seed layer 150 has been formed, a plating mold 152 is formed on the top surface of the seed layer 150. Plating mold 152, in turn, has an opening that exposes a portion of seed layer 150 and defines the shape of the to-be-formed coil structure.

Figure 12A:
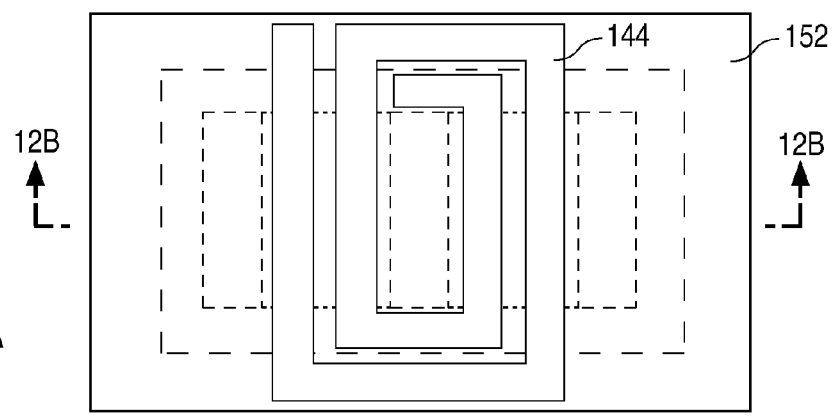
Figure 12B:
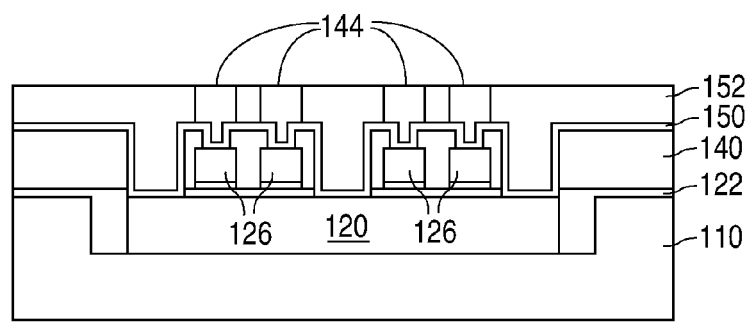
Figure 13A:
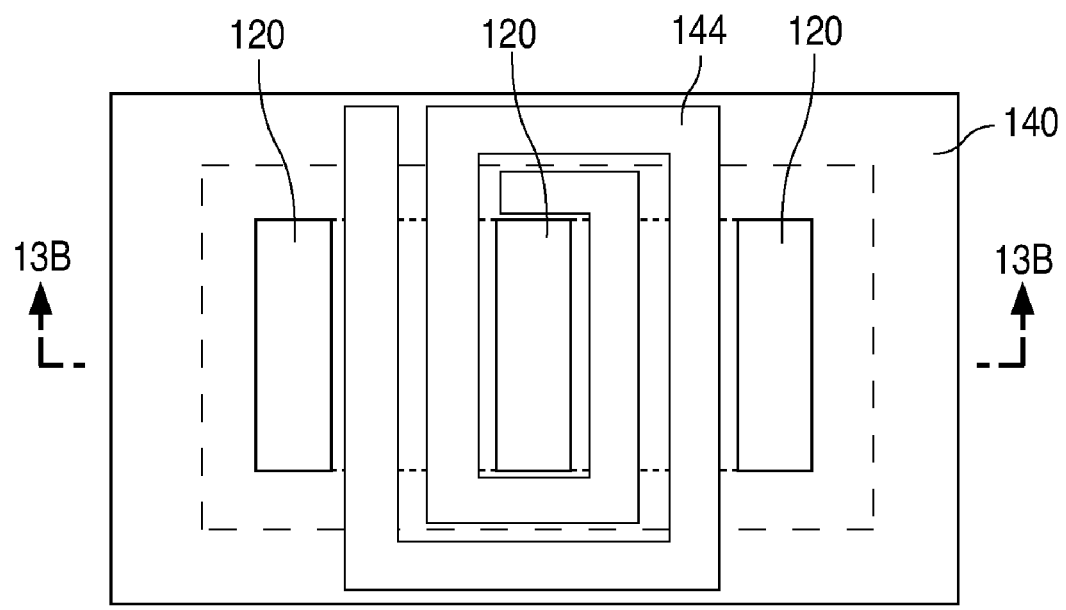
Figure 13B:
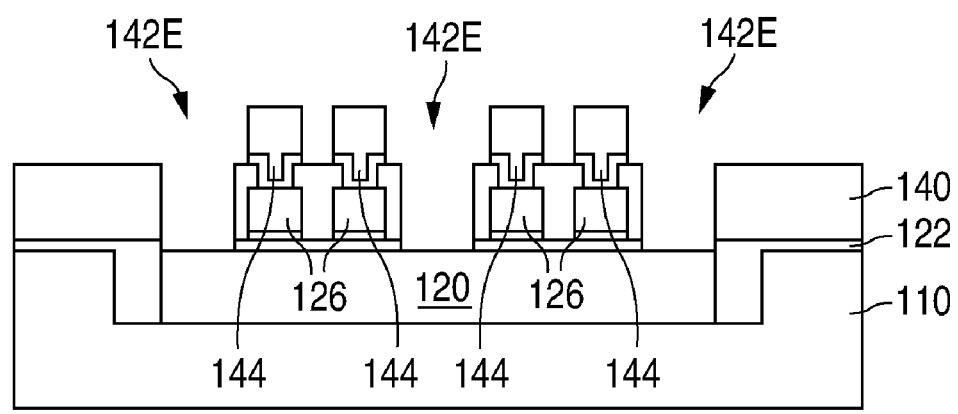

As shown in FIGS. 12A-12B, following the formation of plating mold 152, the top titanium layer is stripped and copper is deposited by electroplating to form coil structure 144. Coil structure 144 includes the copper formed in trench opening 142T or the optional via openings. As shown in FIGS. 13A-13B, after the electroplating, plating mold 152 and the underlying regions of seed layer 150 are removed.

Figure 14A:
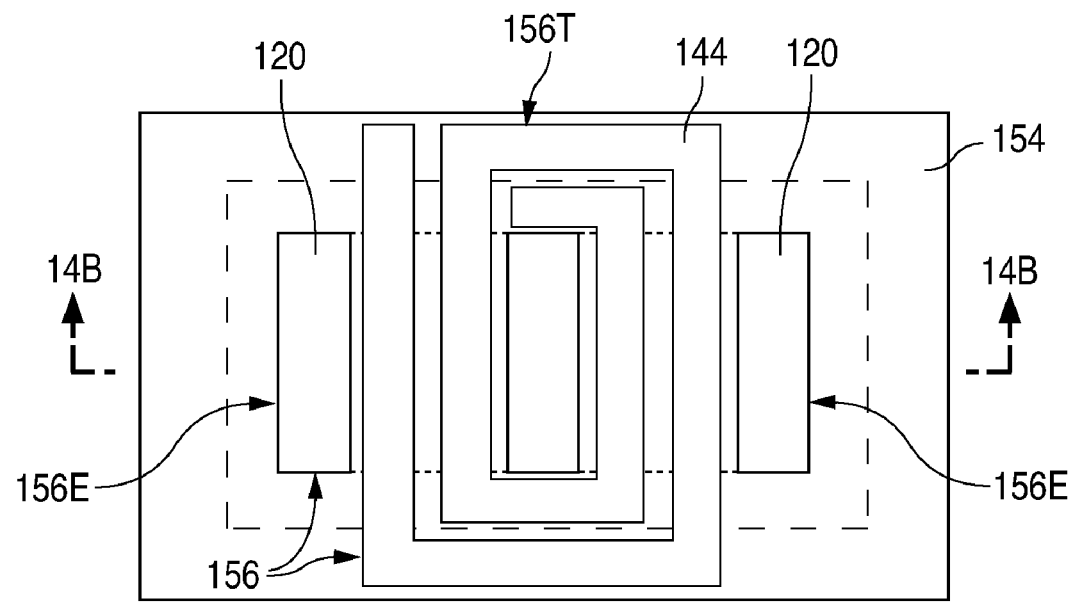
Figure 14B:
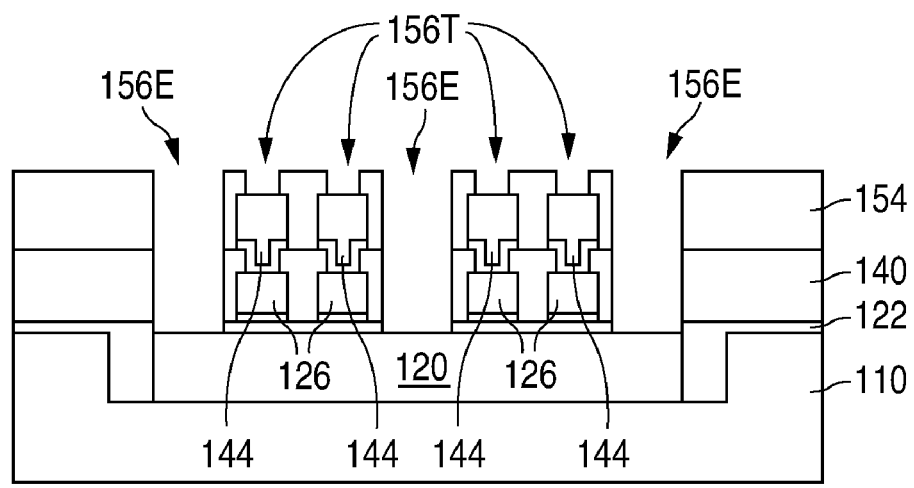

After coil structure 144 has been formed, as shown in FIGS. 14A-14B, a non-conductive layer 154 is deposited on coil structure 144, non-conductive layer 140, and the top surface of bottom core section 120. After non-conductive layer 154 has been deposited, a number of openings 156 are formed in non-conductive layer 154.

In the present example, non-conductive layer 154 is formed with a layer of photoimageable epoxy or polymer, such as SU-8, which is substantially self planarizing. Once the photoimageable epoxy or polymer has been deposited, the openings 156 are formed by projecting a light through a mask to form a patterned image on non-conductive layer 154 that softens the regions of non-conductive layer 154 that are exposed by the light, and then removing the softened regions of non-conductive layer 154.

If the combination of coil structure 126 and coil structure 144 is sufficiently thick to provide the required inductance, then the combination of coil structure 126 and coil structure 144 forms the coil of inductor 100. In this case, the openings 156 include only openings 156E that expose the same regions of the top surface of bottom core section 120 that were previously exposed by the openings 124 and 142E. On the other hand, if the combination of coil structure 126 and coil structure 144 is not sufficiently thick to provide the required inductance, then the openings 156 also include a trench opening 156T that exposes coil structure 144 as shown in FIGS. 14A-14B.

In the present example, trench opening 156T exposes the top surface of coil structure 144 from one end of coil structure 144 to the other end of coil structure 144. Alternately, rather than forming trench opening 156T, a number of spaced-apart via openings can be formed to expose the top surface of coil structure 144.

Figure 15A:
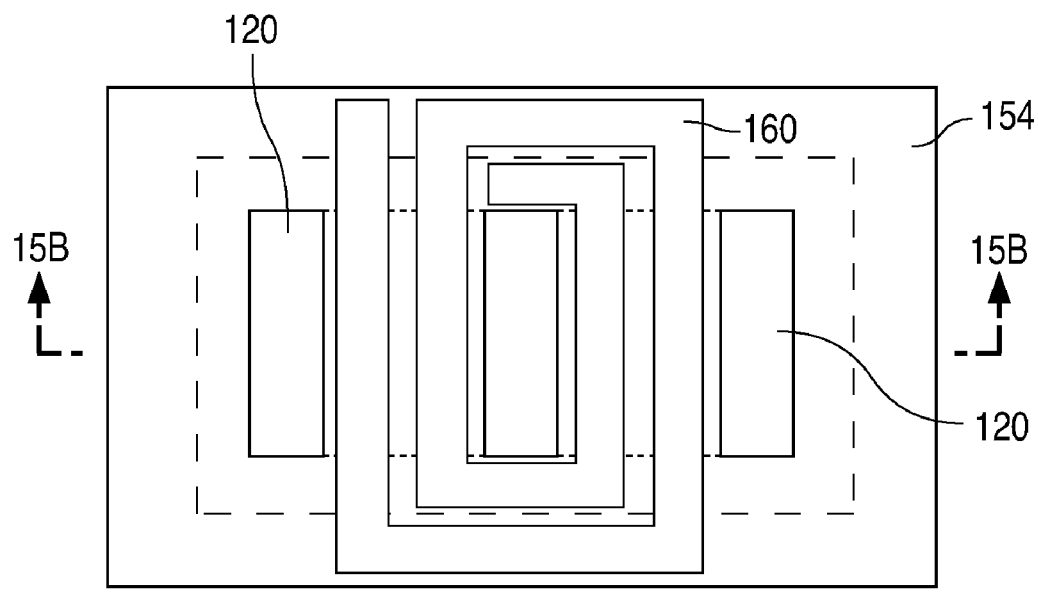
Figure 15B:
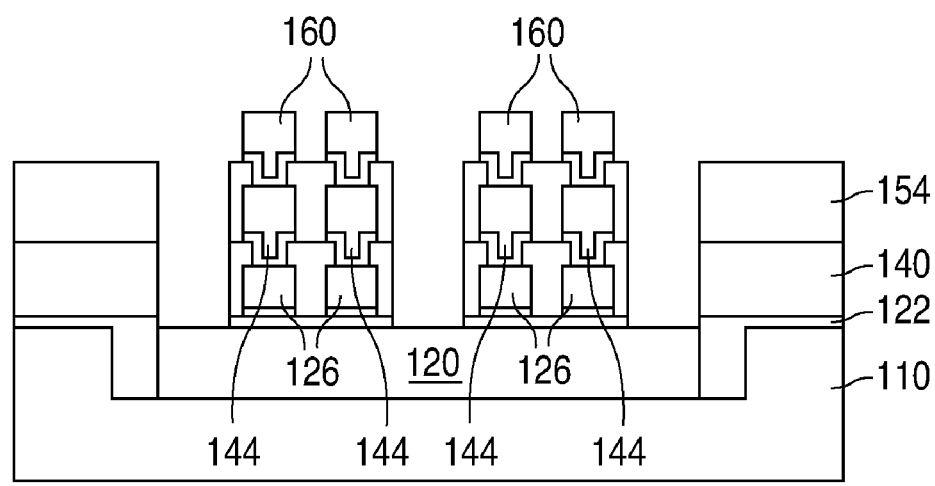
Figure 16A:
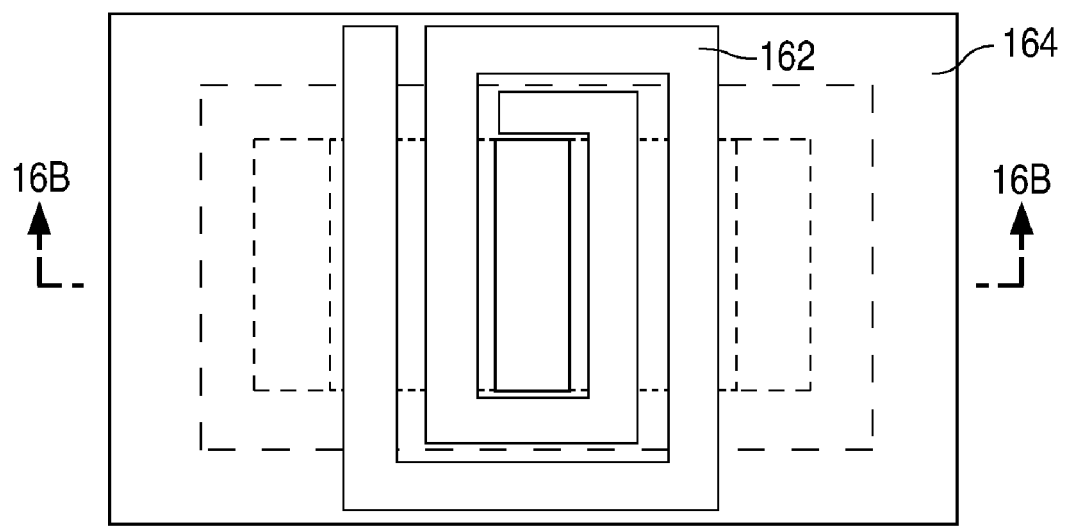
Figure 16B:
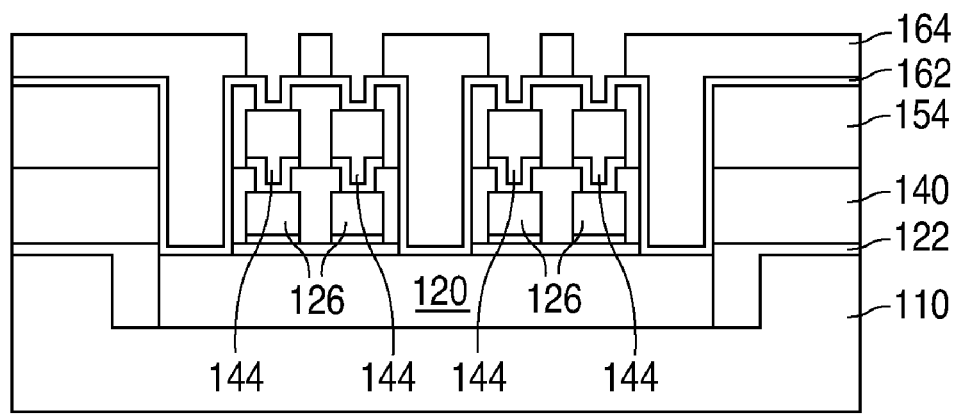

As shown in FIGS. 15A-15B, when the combination of coil structure 126 and coil structure 144 is not sufficiently thick, a coil structure 160 is formed on coil structure 144 to provide a thicker coil. As shown in FIGS. 16A-16B, coil structure 160 is formed by first forming a seed layer 162 on non-conductive layer 154 to line the openings 156 and touch coil structure 144 and the top surface of bottom core section 120.

For example, seed layer 162 can be formed by depositing 300 Å of titanium, 3000 Å of copper, and 300 Å of titanium. Once seed layer 162 has been formed, a plating mold 164 is formed on the top surface of the seed layer 162. Plating mold 164, in turn, has an opening that exposes a portion of seed layer 162 and defines the shape of the to-be-formed coil structure.

Figure 17A:
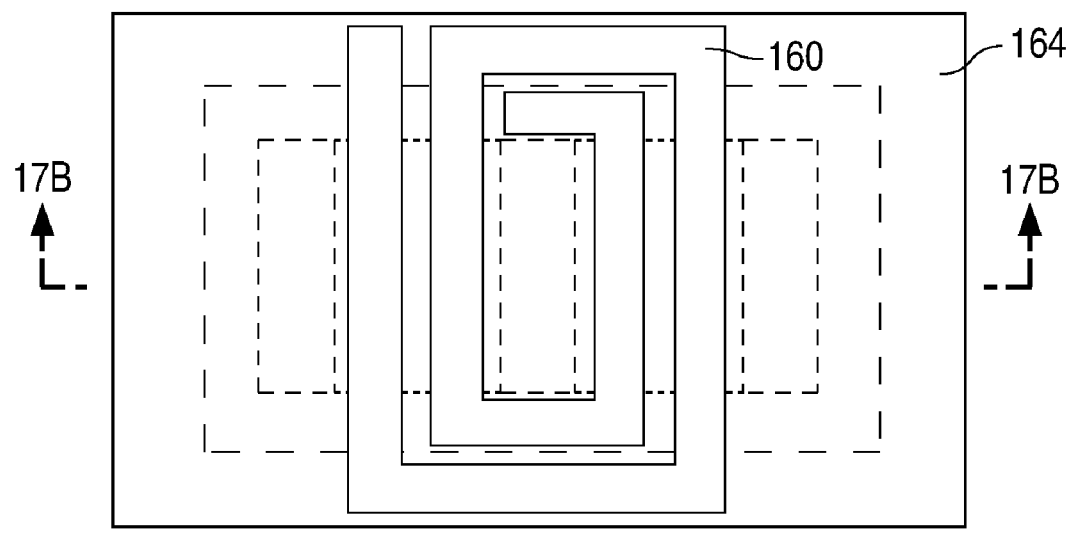
Figure 17B:
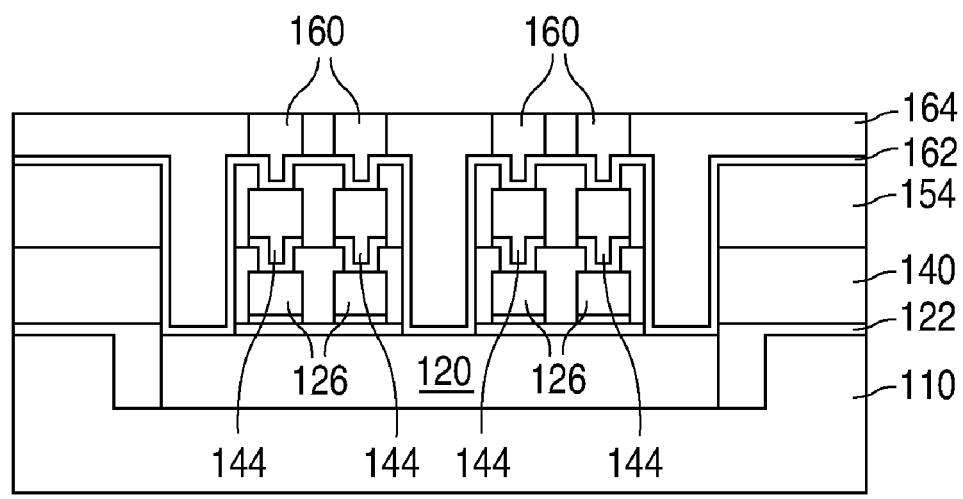
Figure 18A:
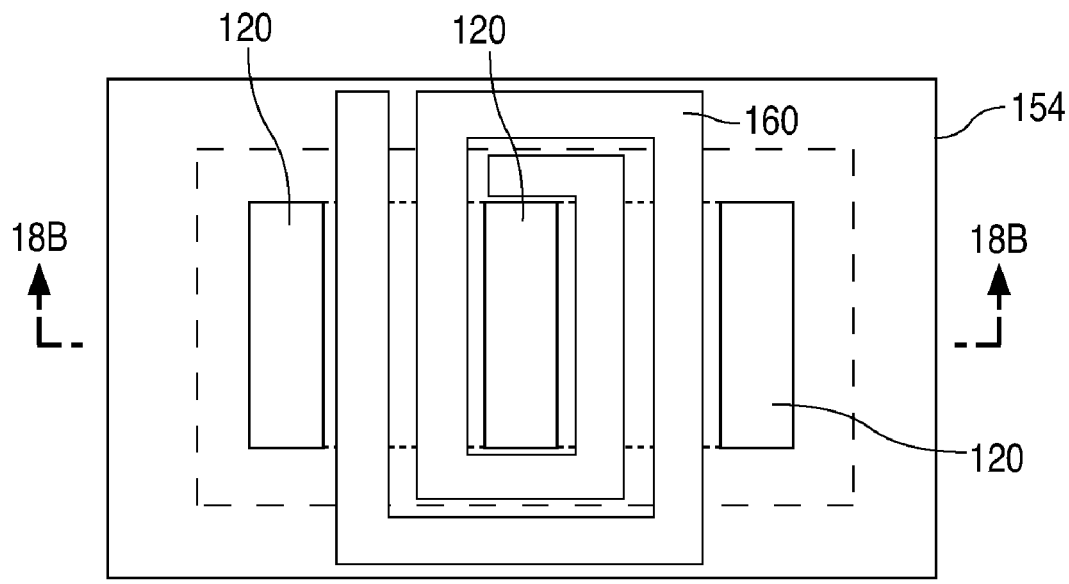
Figure 18B:
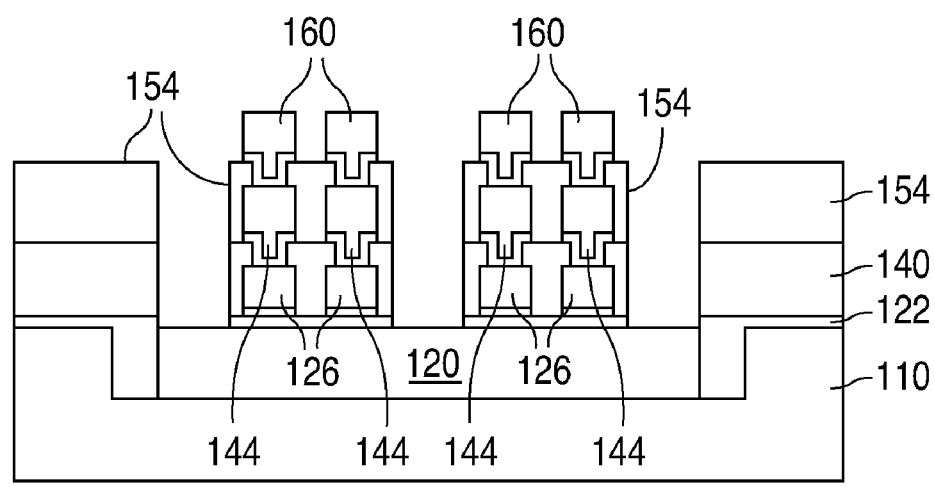

As shown in FIGS. 17A-17B, following the formation of plating mold 164, the top titanium layer is stripped and copper is deposited by electroplating to form coil structure 160. Coil structure 160 includes the copper formed in trench opening 156T or the optional via openings. As shown in FIGS. 18A-18B, after the electroplating, plating mold 164 and the underlying regions of seed layer 162 are removed.

Figure 19A:
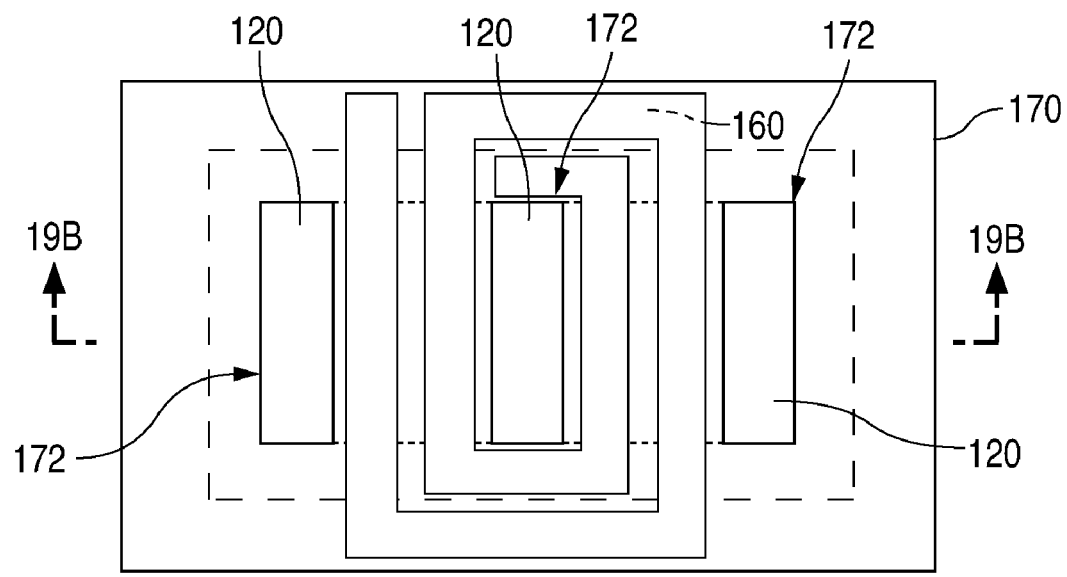
Figure 19B:
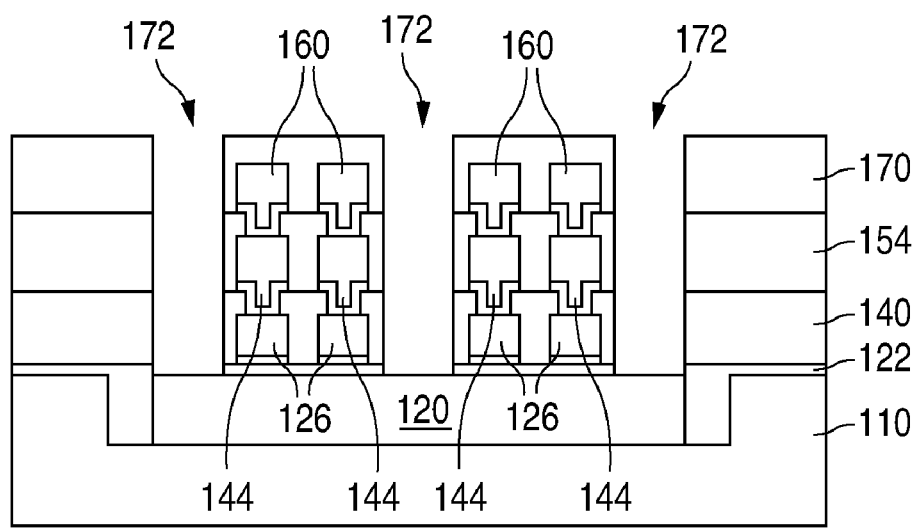

After coil structure 160 has been formed, as shown in FIGS. 19A-19B, a non-conductive layer 170 is deposited on coil structure 160, non-conductive layer 154, and the top surface of bottom core section 120. After non-conductive layer 170 has been deposited, a number of openings 172 are formed in non-conductive layer 170.

In the present example, non-conductive layer 170 is formed with a layer of photoimageable epoxy or polymer, such as SU-8, which is substantially self planarizing. Once the photoimageable epoxy or polymer has been deposited, the openings 172 are formed by projecting a light through a mask to form a patterned image on non-conductive layer 170 that softens the regions of non-conductive layer 170 that are exposed by the light, and then removing the softened regions of non-conductive layer 170.

If the combination of coil structure 126, coil structure 144, and coil structure 160 is not sufficiently thick to provide the required inductance, then the openings 172 expose both coil structure 160 and the top surface of bottom core section 120. Following this, additional coil structures with overlying non-conductive layers are formed in the same manner as described above until the combined coil structures form a coil that is thick enough to provide the required inductance.

On the other hand, as in the present example, if the combination of coil structure 126, coil structure 144, and coil structure 160 is sufficiently thick to provide the required inductance, then the combination of coil structure 126, coil structure 144, and coil structure 160 forms the coil of inductor 100. In this case, as shown in FIGS. 19A-19B, the openings 172 only expose the top surface of bottom core section 120.

Figure 20A:
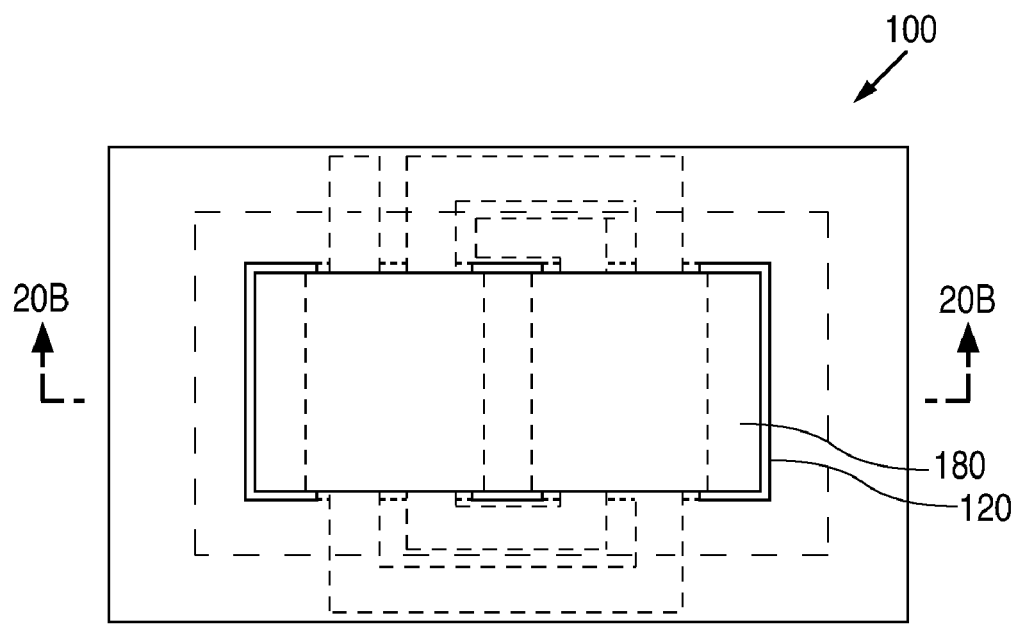
Figure 20B:
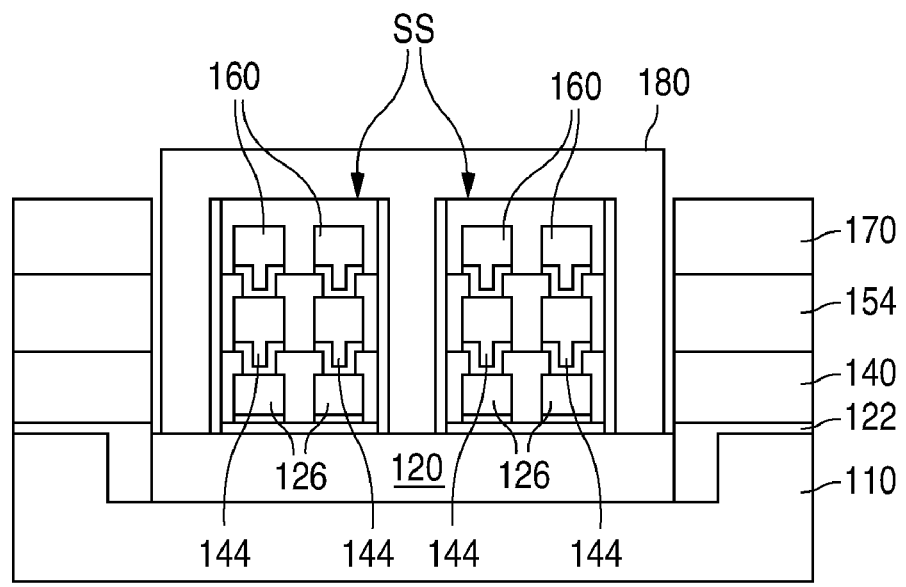
Figure 21A:
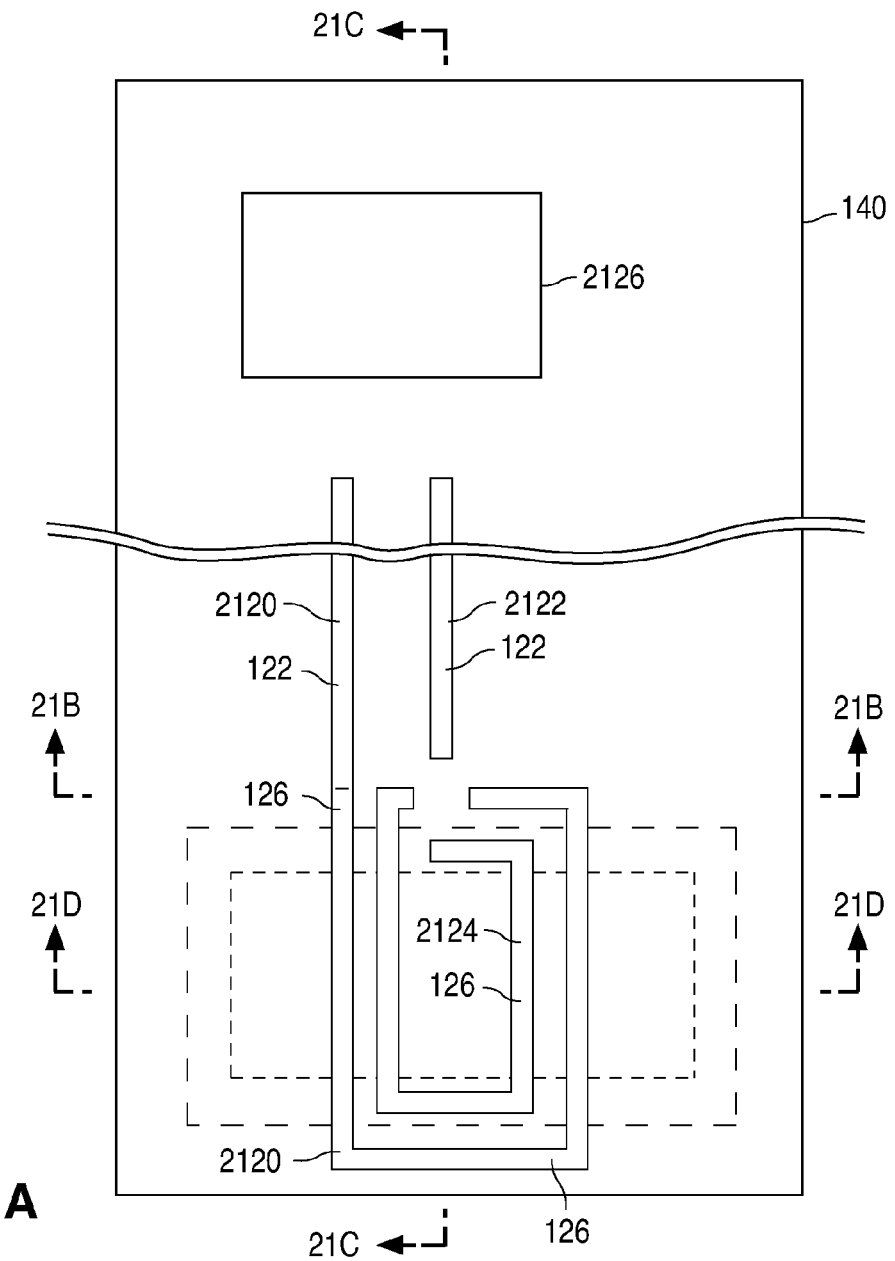
Figure 21B:
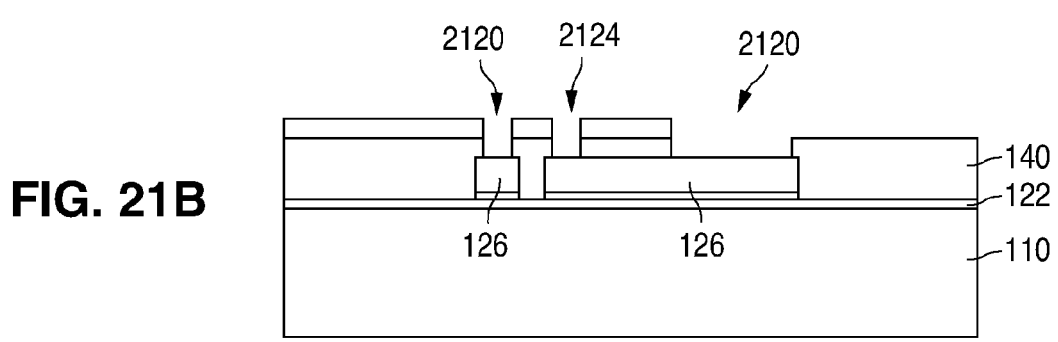
Figure 22A:
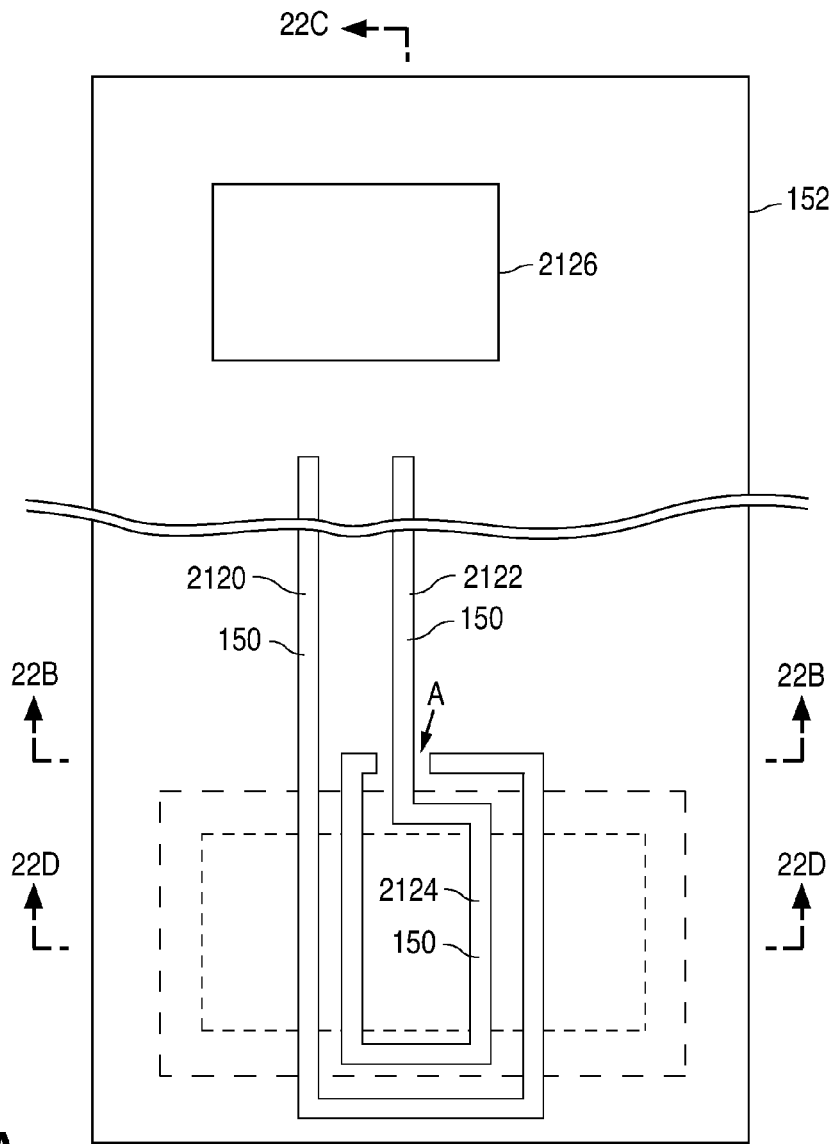
Figure 22B:
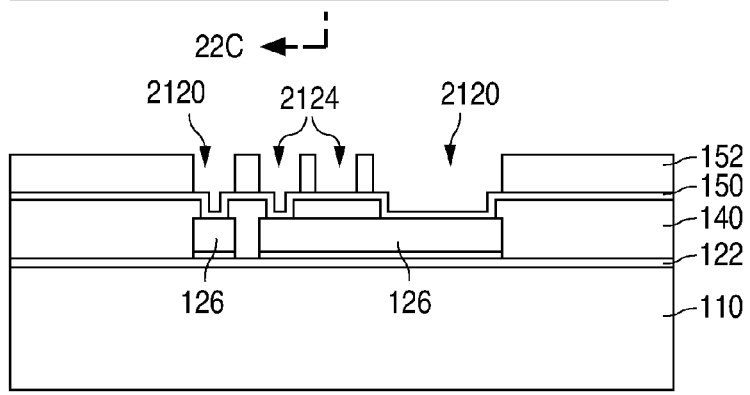
Figure 22C:
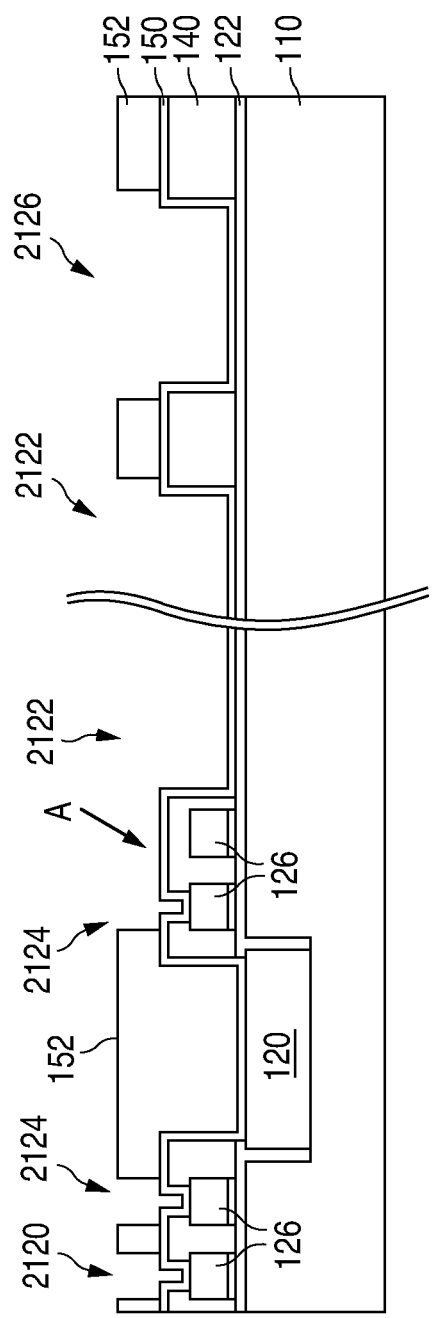
Figure 22D:
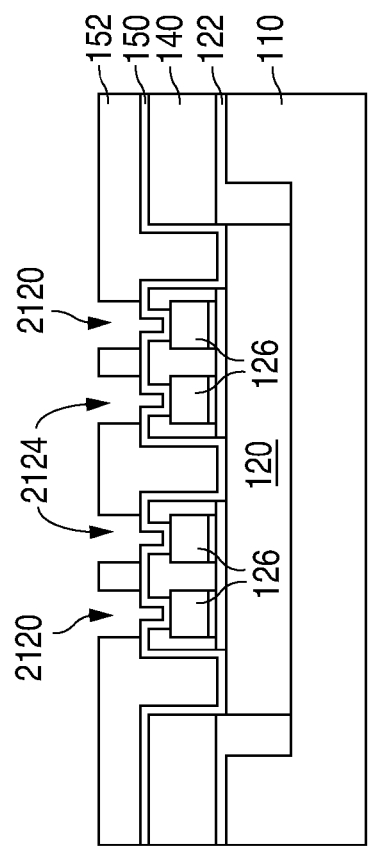

Once openings have been formed in the non-conductive layer that touches the top coil structure to expose the top surface of bottom core section 120, a top core section is placed in the openings. In the present example, as shown in FIGS. 20A-20B, a top core section 180 is placed in the openings 172 and attached to the top surface of non-conductive layer 170 along the sections SS of the top surface of non-conductive layer 170 to complete the formation of inductor 100. In the present example, top core section 180 may touch, but is not attached to bottom core section 120.

Top core section 180 can be placed in the openings 172 using a conventional pick and place machine, and attached in a conventional manner using, for example, conventional conductive or non-conductive adhesives, such as a die attach film. The die attach film can be, for example, 20 µm thick. In addition, top core section 180, which is formed in a conventional manner in a separate process, can be implemented with, for example, electroplated alloys of (Co)NiFe or soft ferrites, such as NiZn and MnZn.

After top core section 180 has been placed in the openings 172 and adhesively attached to the top surface of non-conductive layer 170 to complete the formation of inductor 100, fabrication continues with conventional back end processing steps, such as the formation of an overlying passivation layer and/or the formation of openings that expose the top surfaces of the ends of the coil, e.g., the ends of coil structure 160 in the present example. In addition, once the ends of the coil have been exposed, a metal, such as aluminum, aluminum-copper, or gold, can be formed on the ends of the coil prior to dicing and wire bonding to improve the adhesion of the wire bond.

Thus, a method of forming an inductor has been described that forms a thick core by utilizing conventional pick and place technology to attach the bottom and top core sections 120 and 180, and a thick coil by utilizing a number of coil structures. As noted above, the number of coil structures that are utilized depends on the required thickness of the coil. Thus, coil structure 126 alone, the combination of coil structures 126 and 144, the combination of coil structures 126, 144, and 160, or the combination of coil structures 126, 144, 160, and one or more additional coil structures can be used depending upon the required thickness of the coil.

One of the advantages of the present invention is that the thick coil of inductor 100, which is made of one or more coil structures, has a low resistance which, in turn, allows inductor 100 to carry a large current. In addition, another advantage is that a thick core in combination with a large current capacity increases the quality factor.

FIGS. 21A-21D through 37A-37D show a series of views that illustrate an example of a method of forming an integrated inductive device 2100 in accordance with the present invention. FIGS. 21A-37A show a series of plan views, FIGS. 21B-37B show a series of cross-sectional views taken along lines 21B-37B, respectively, in FIGS. 21A-37A, FIGS. 21C-37C show a series of cross-sectional views taken along lines 21C-37C, respectively, in FIGS. 21A-37A, and FIGS. 21D-37D show a series of cross-sectional views taken along lines 21D-37D, respectively, in FIGS. 21A-37A.

The method of forming integrated inductive device 2100 follows the same steps as the method illustrated in FIGS. 1A-1B through 8A-8B, and first differs in the patterning of the non-conductive layer and the subsequent formation of the next-to-the-top coil structure which, in the present example, is non-conductive layer 140 and coil structure 144.

The patterning of the non-conductive layer and the subsequent formation of the next-to-the-top coil structure in FIGS. 21A-21D through FIGS. 24A-24D differs from the patterning of non-conductive layer 140 and the subsequent formation of coil structure 144 in FIGS. 9A-9B through FIGS. 13A-13B in that, as shown in FIGS. 21A-21D, the mask used to pattern non-conductive layer 140 is modified to form trench openings 2120, 2122, and 2124 in lieu of trench opening 142T, and an additional integrated circuit (IC) opening 2126. The openings 142E are also formed as before. (Alternately, via openings can be formed in lieu of the trench openings 2120, 2122, and 2124.)

Trench opening 2120 exposes both coil structure 126 and the top surface of non-conductive layer 122, trench opening 2122 exposes only the top surface of non-conductive layer 122, and trench opening 2124 exposes only coil structure 126. IC opening 2126, in turn, exposes only the top surface of non-conductive layer 122.

In addition, as shown in FIGS. 22A-22D, plating mold 152 is modified to expose the trench openings 2120, 2122, and 2124 and the IC opening 2126, and to connect trench opening 2122 to an end of trench opening 2124 at point A. As a result, as shown in FIGS. 23A-23D and 24A-24D, the electroplating forms coil sections 2130 and 2132 in lieu of coil structure 144, and an IC heat sink 2134.

Coil sections 2130 and 2132, which include the copper formed in the trench openings or the optional via openings, are electrically connected together by way of coil structure 126. Further, coil section 2130 includes a coil portion 2130C and a trace portion 2130T, while coil section 2132 includes a coil portion 2132C and a trace portion 2132T.

Figure 23C:
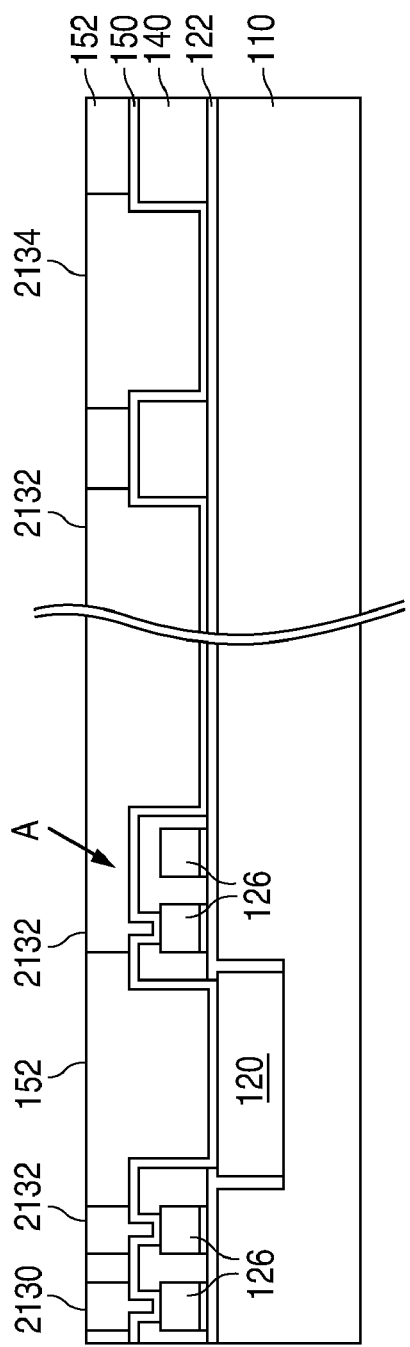
Figure 23D:
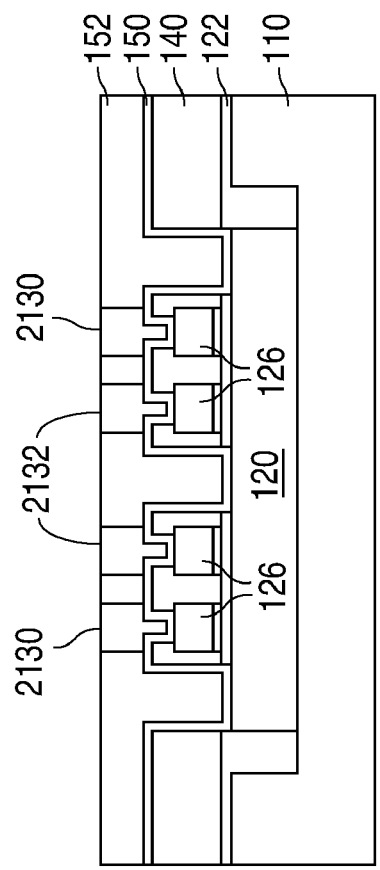
Figure 24A:
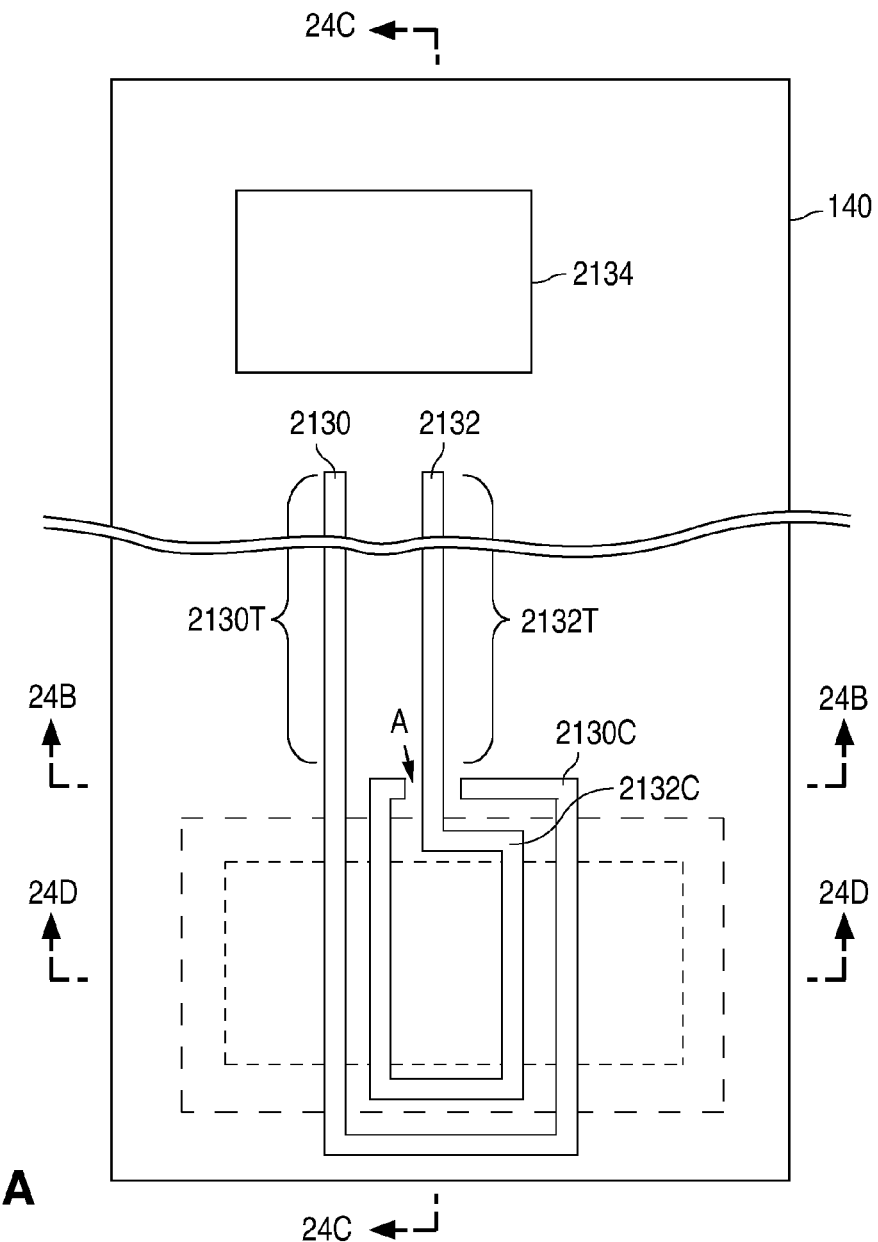
Figure 24B:
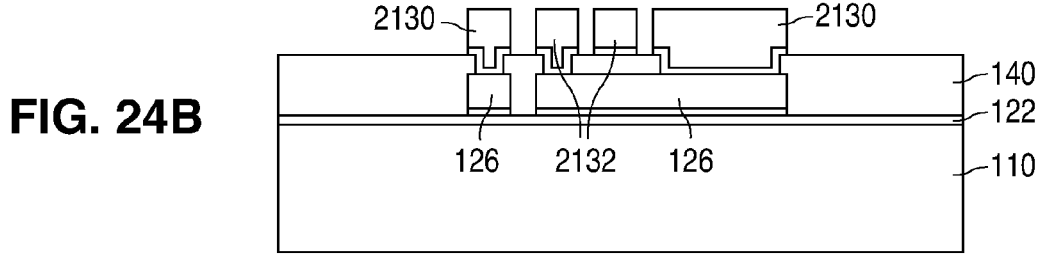
Figure 25A:
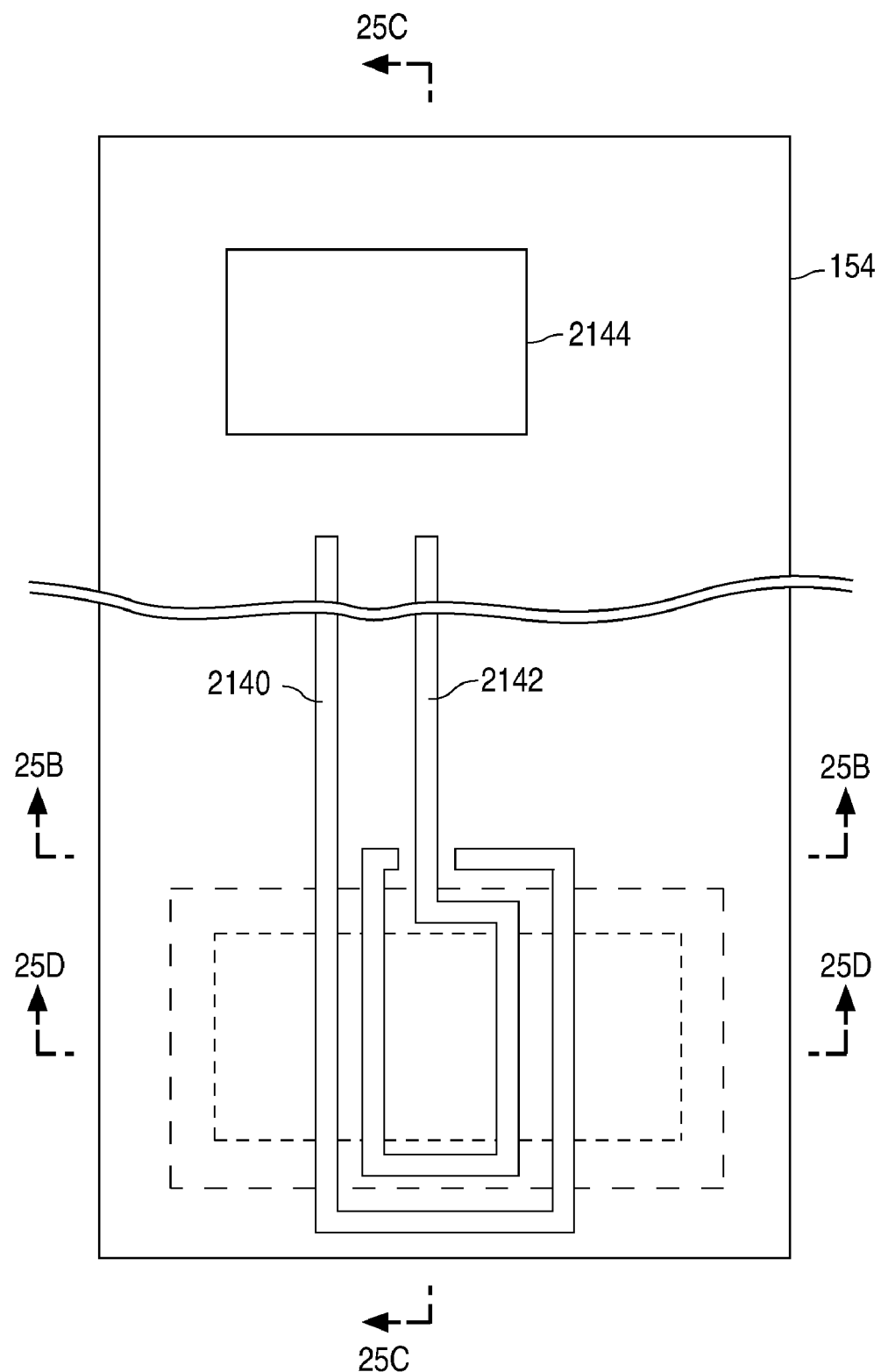
Figure 25B:
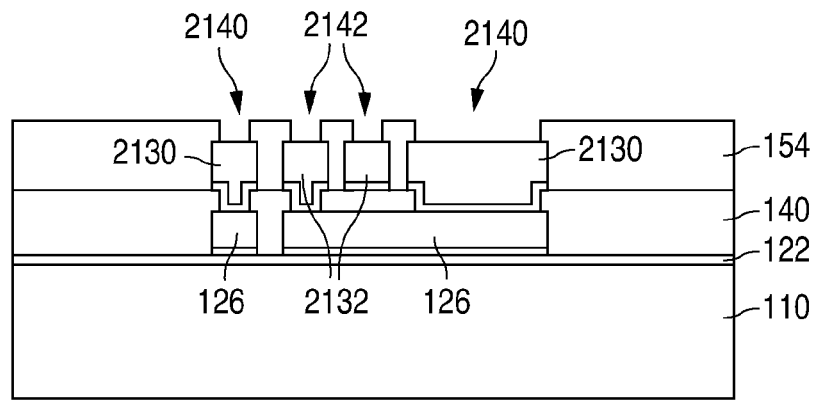
Figure 25D:
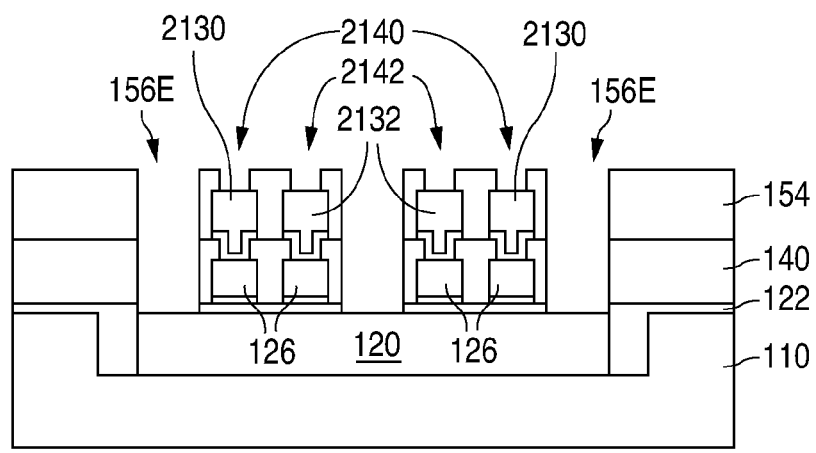
Figure 25C:
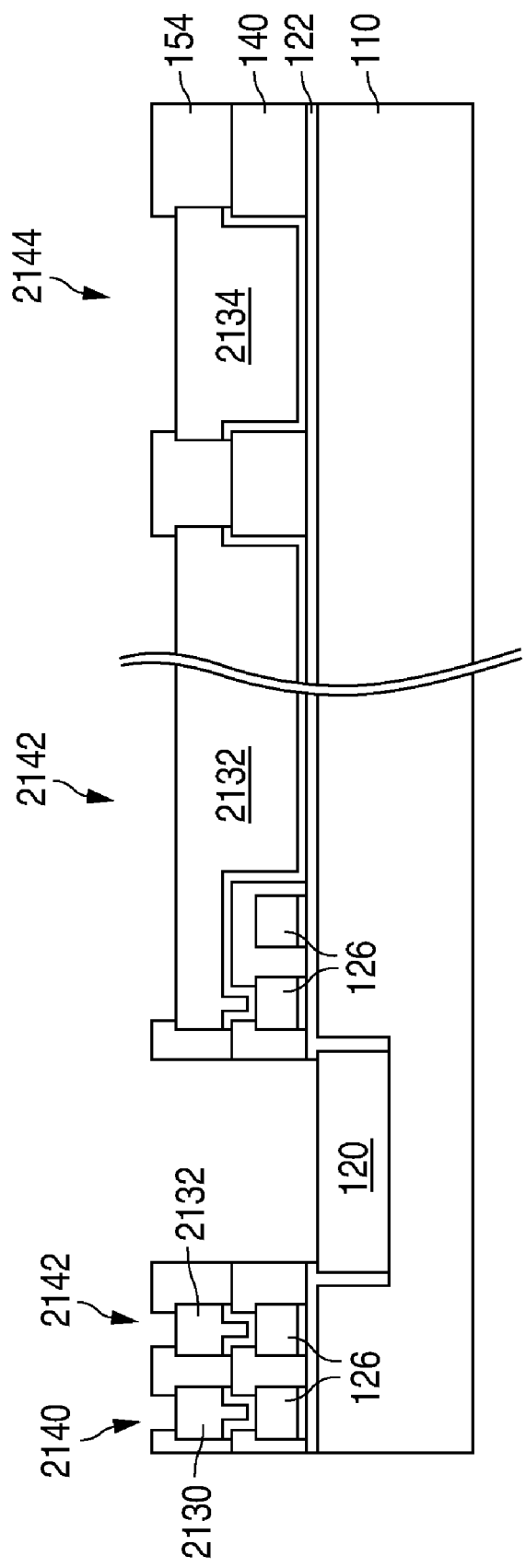
Figure 26A:
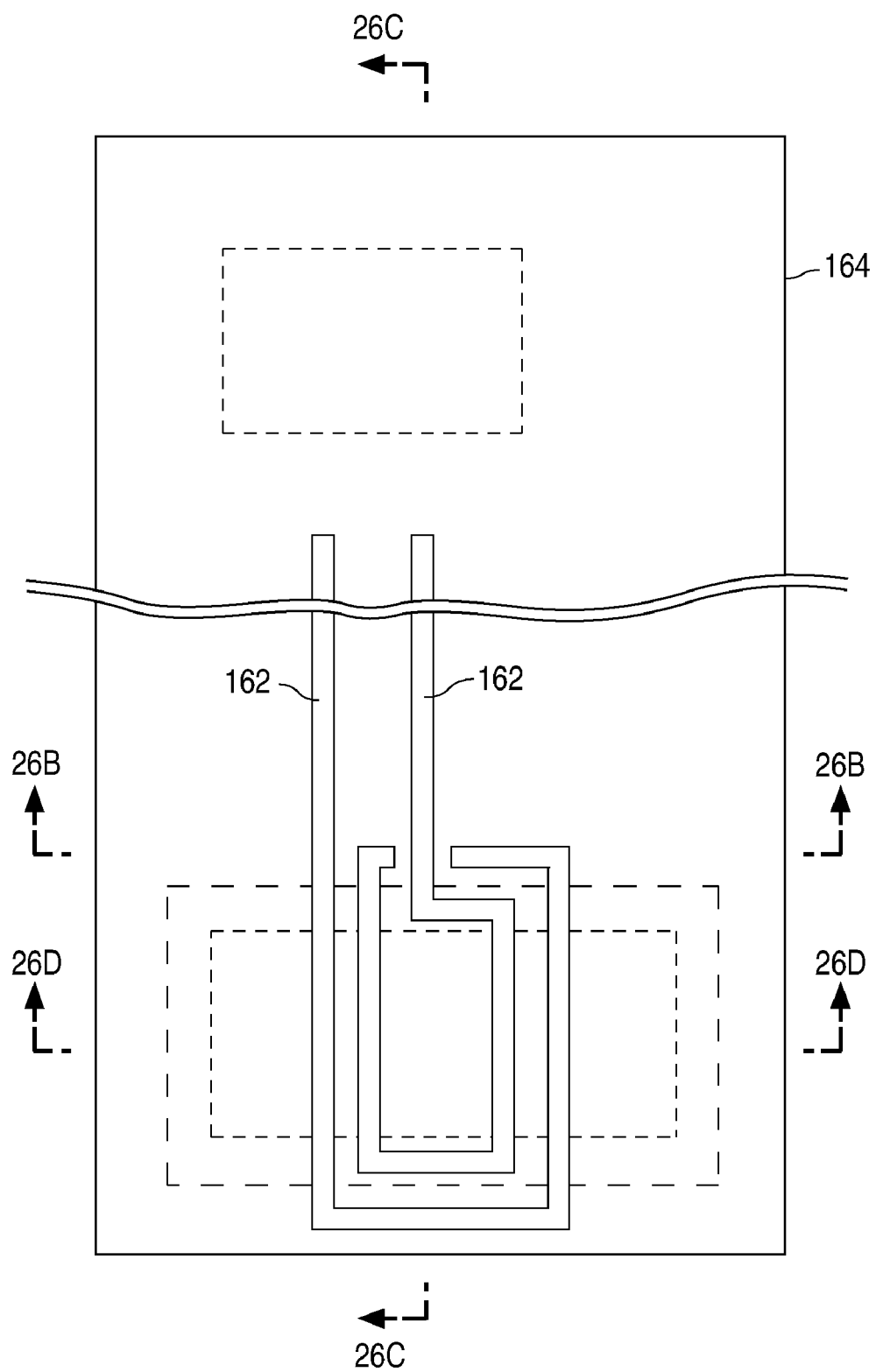
Figure 26B:
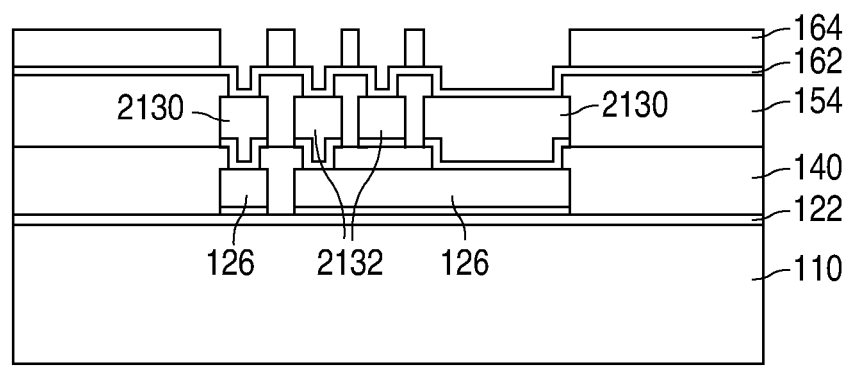
Figure 26D:
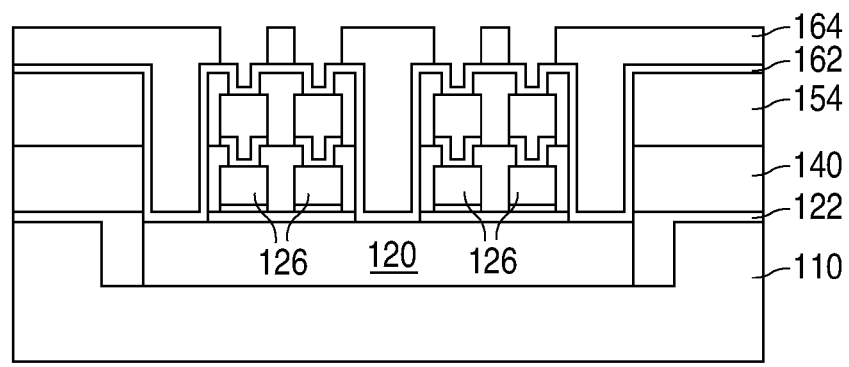
Figure 26C:
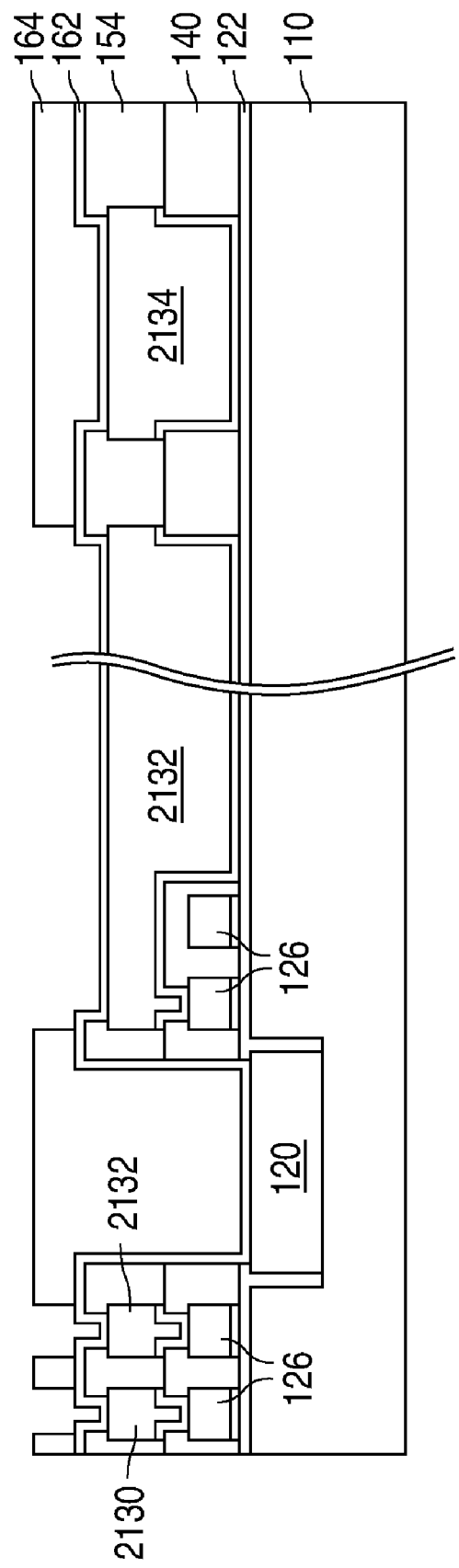
Figure 27A:
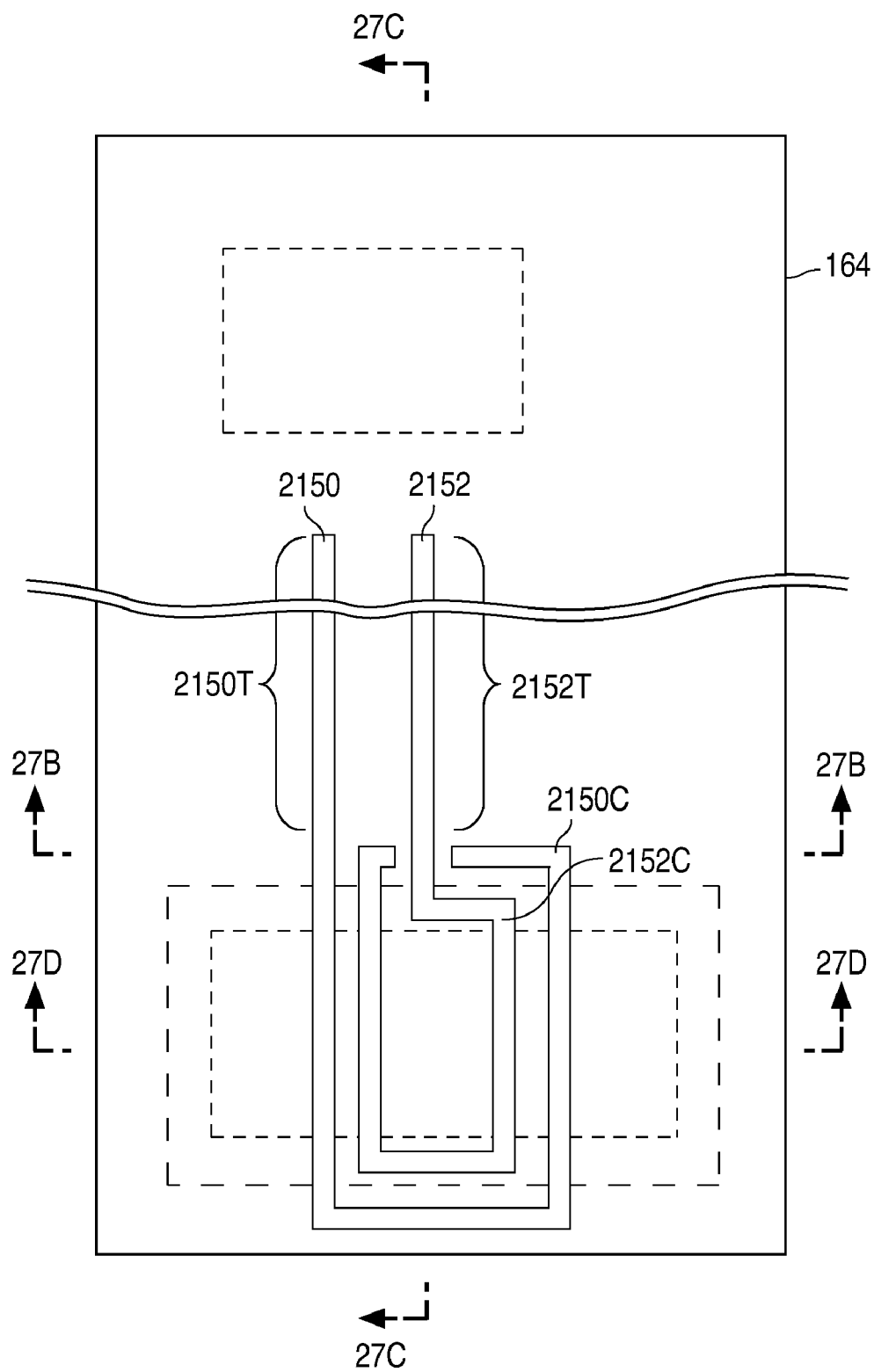
Figure 27B:
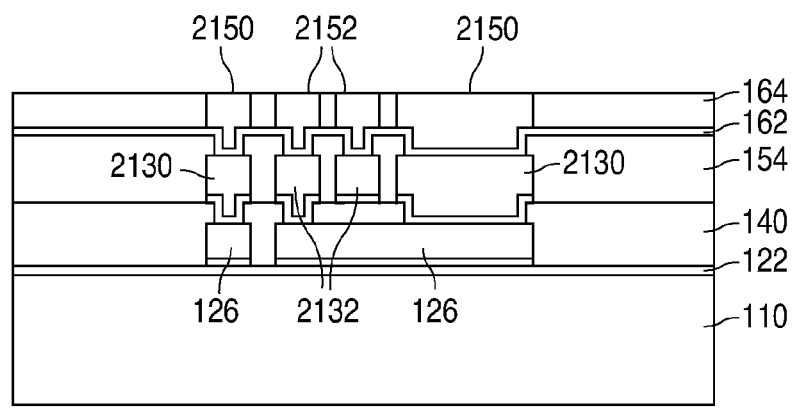
Figure 27D:
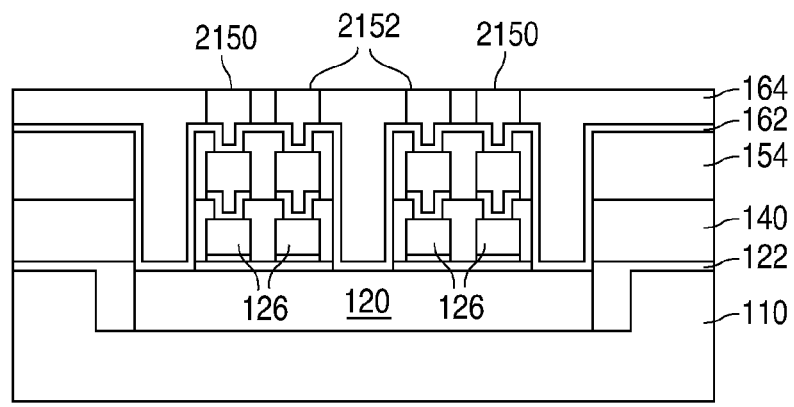
Figure 27C:
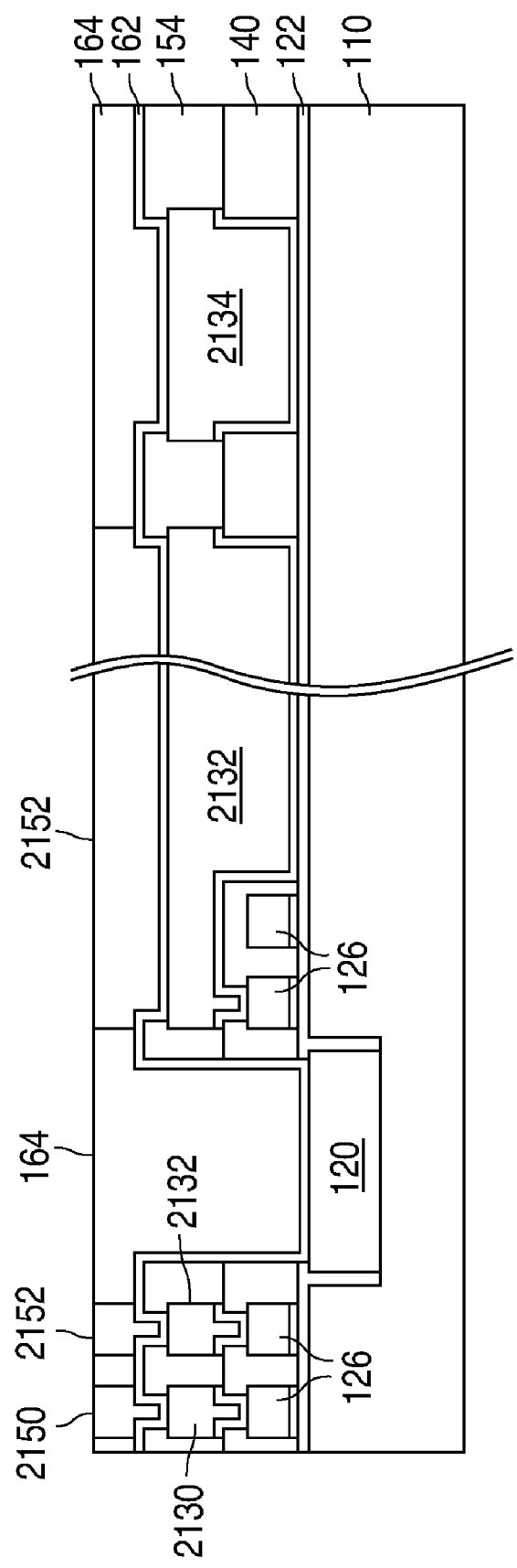
Figure 28A:
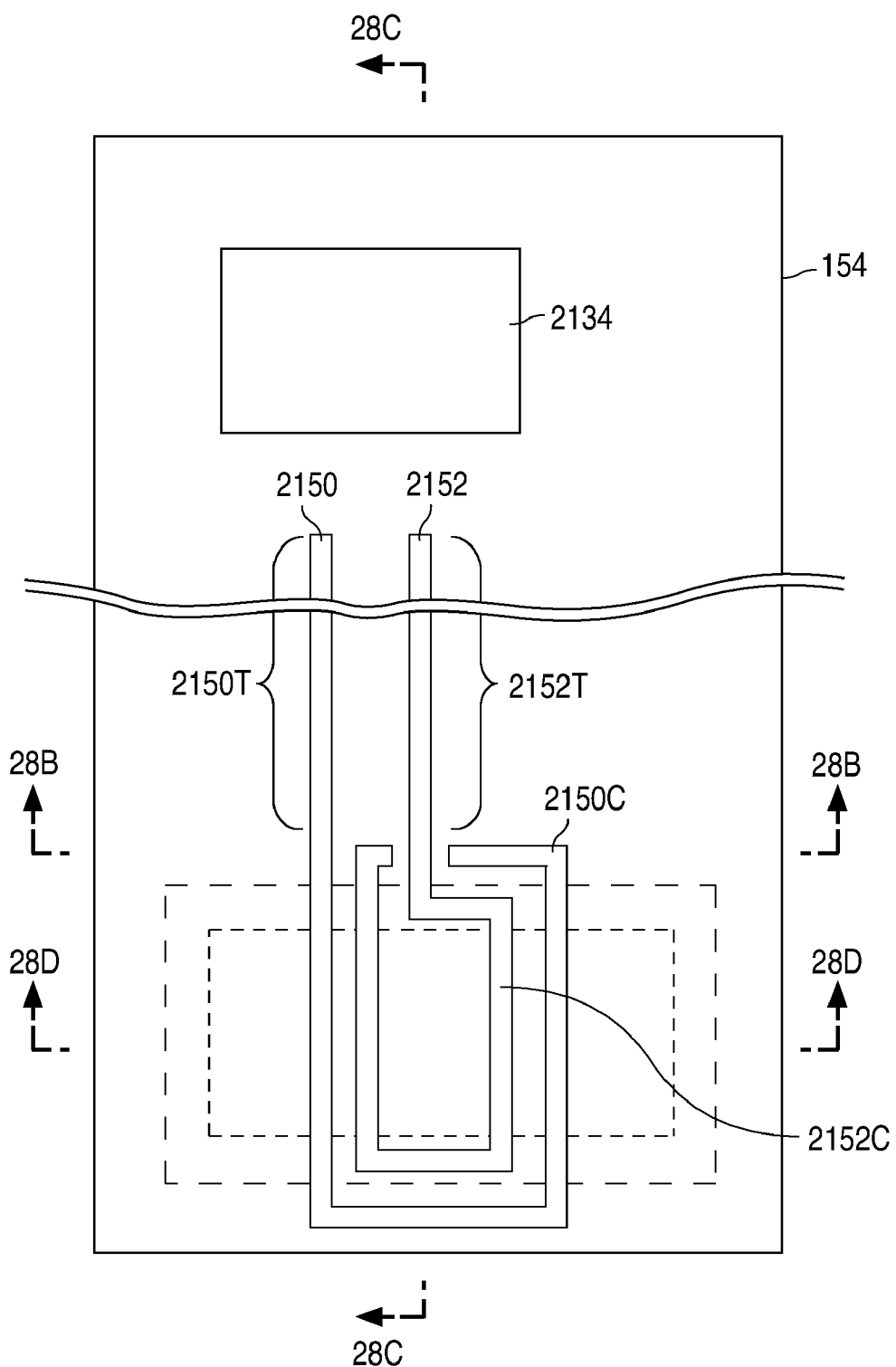
Figure 28B:
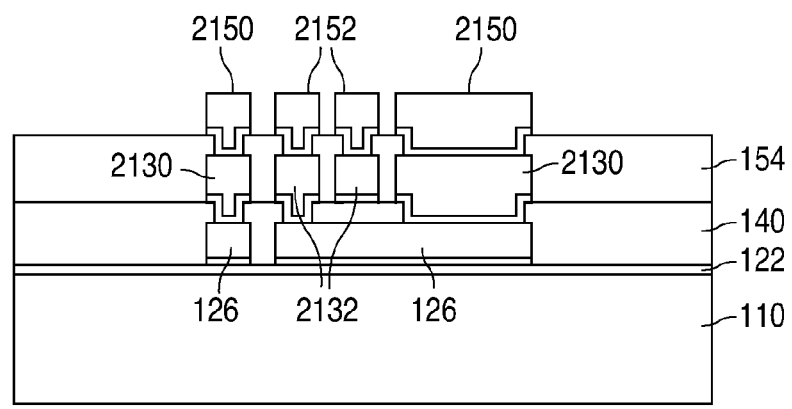
Figure 28D:
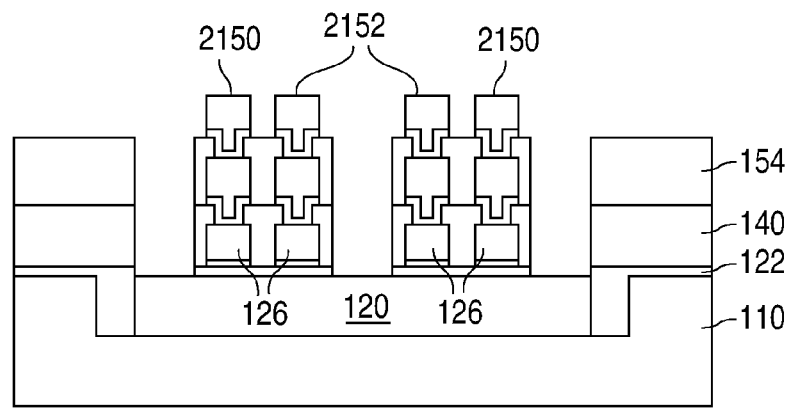
Figure 28C:
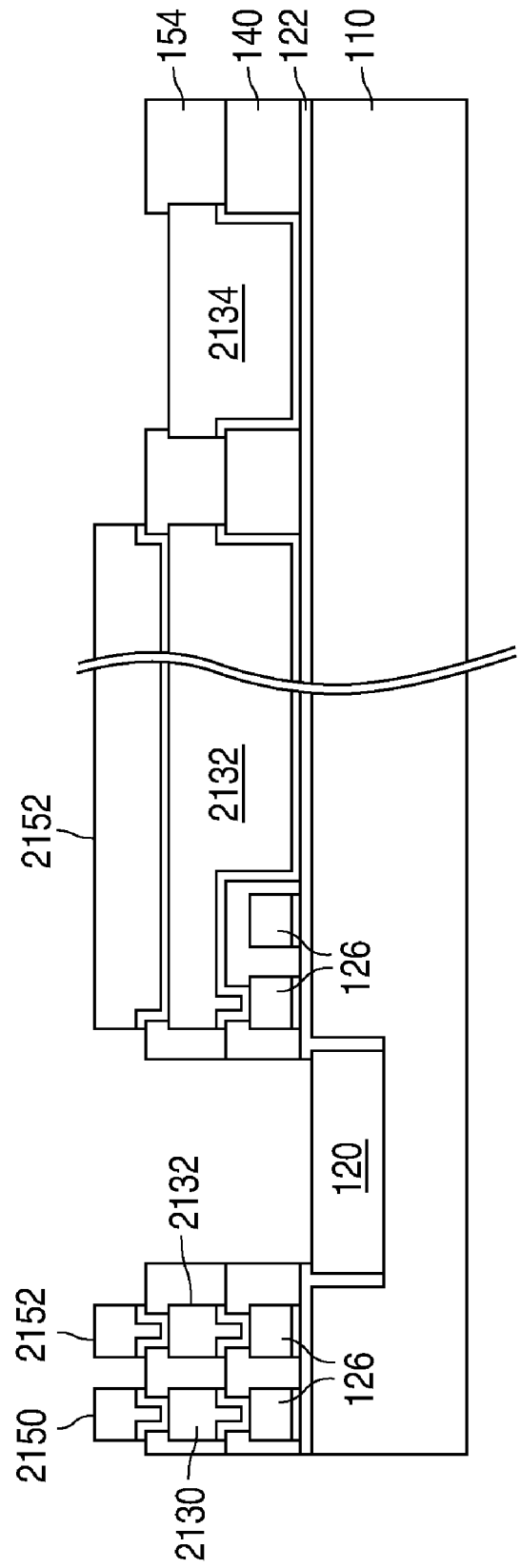
Figure 29A:
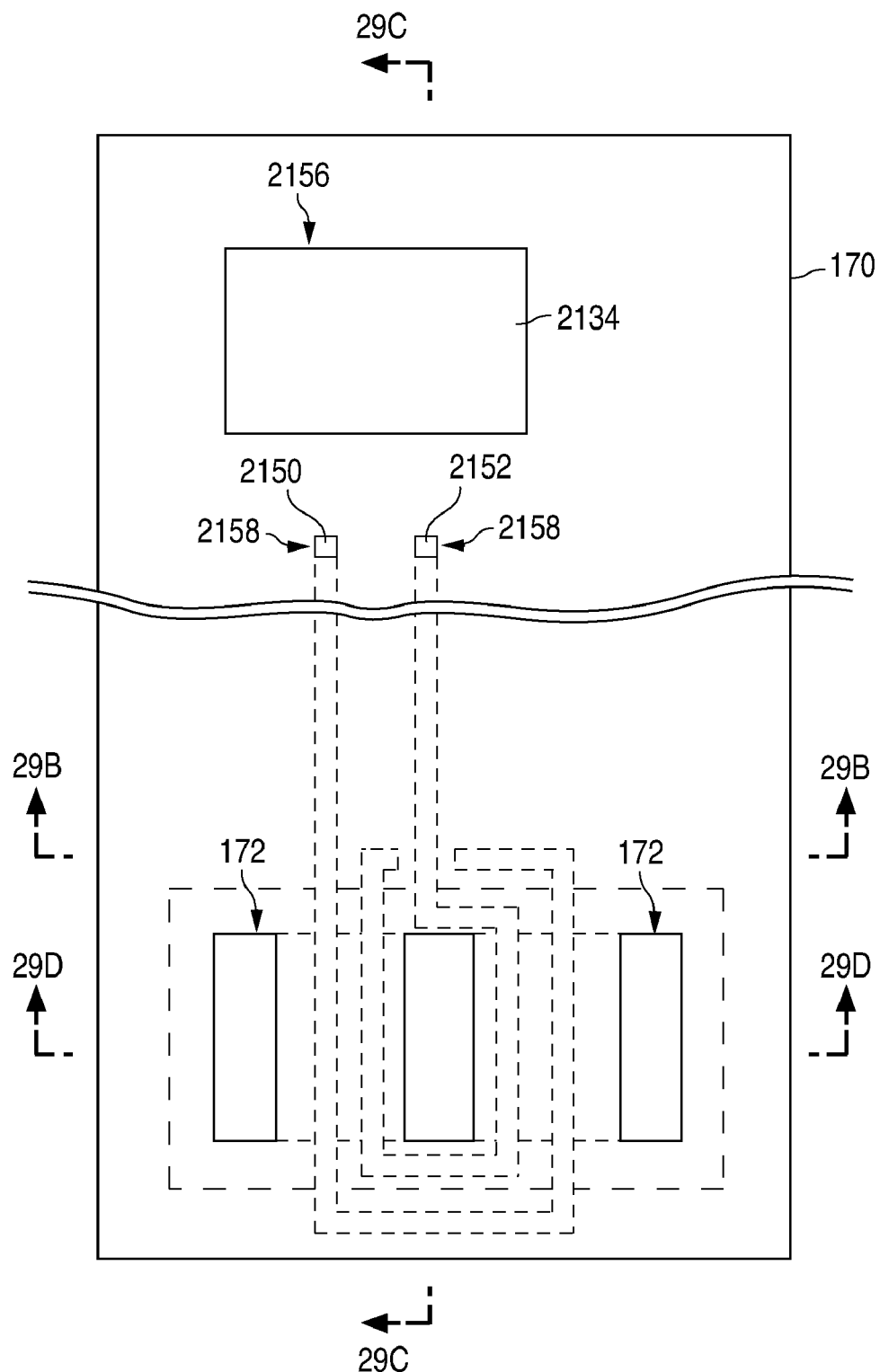
Figure 29B:
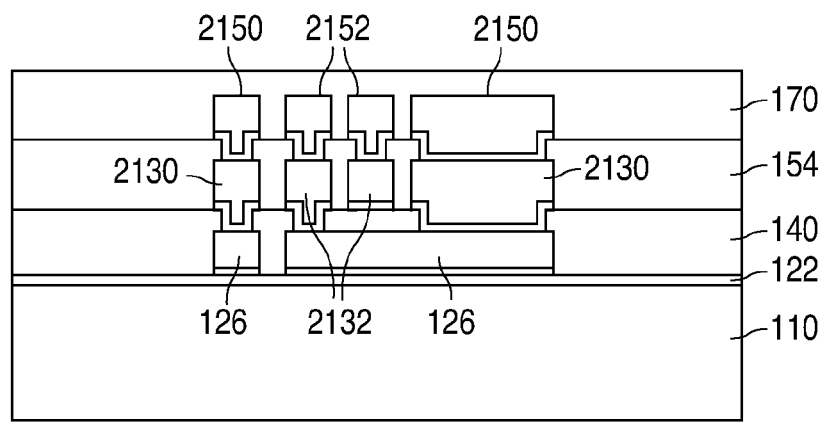
Figure 29D:
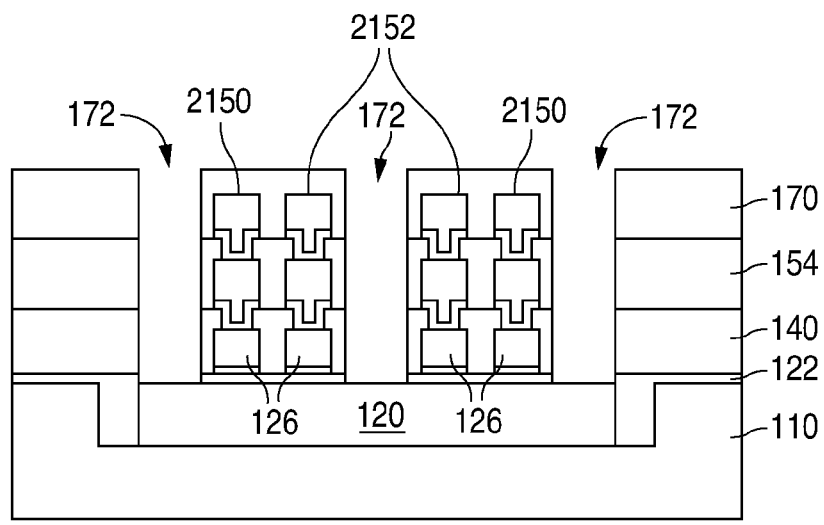
Figure 29C:
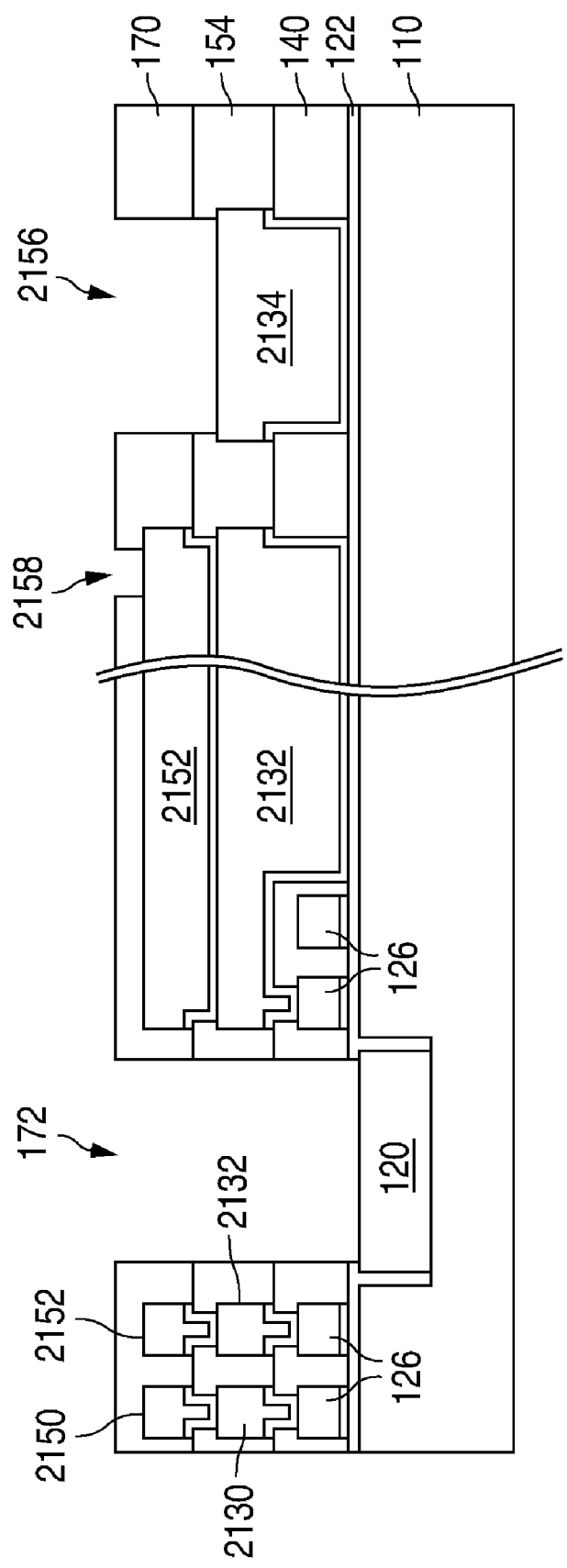
Figure 30A:
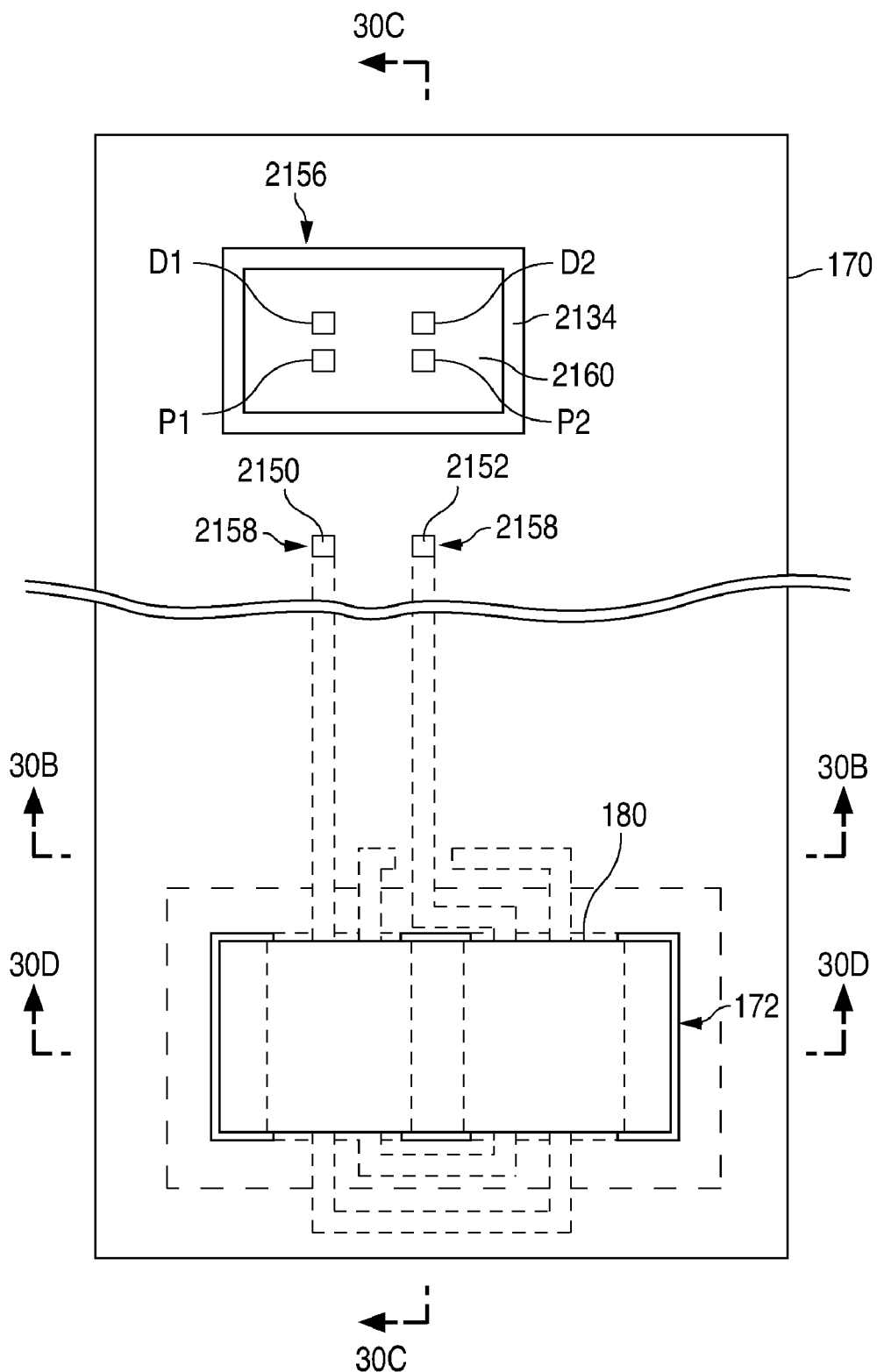
Figure 30B:
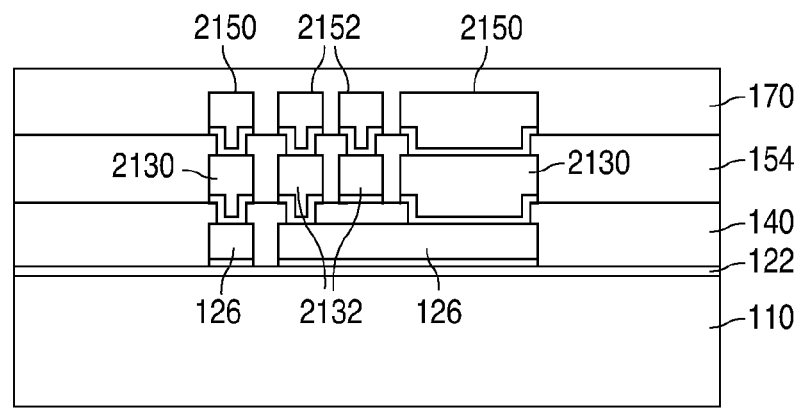
Figure 30D:
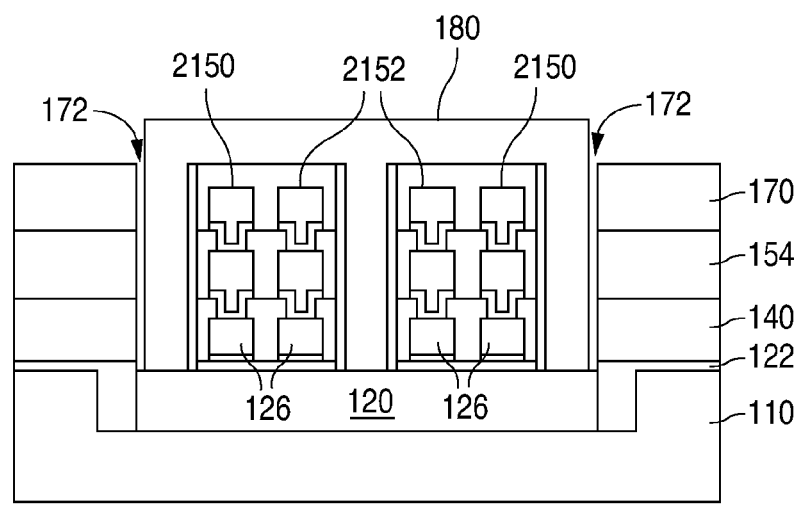
Figure 30C:
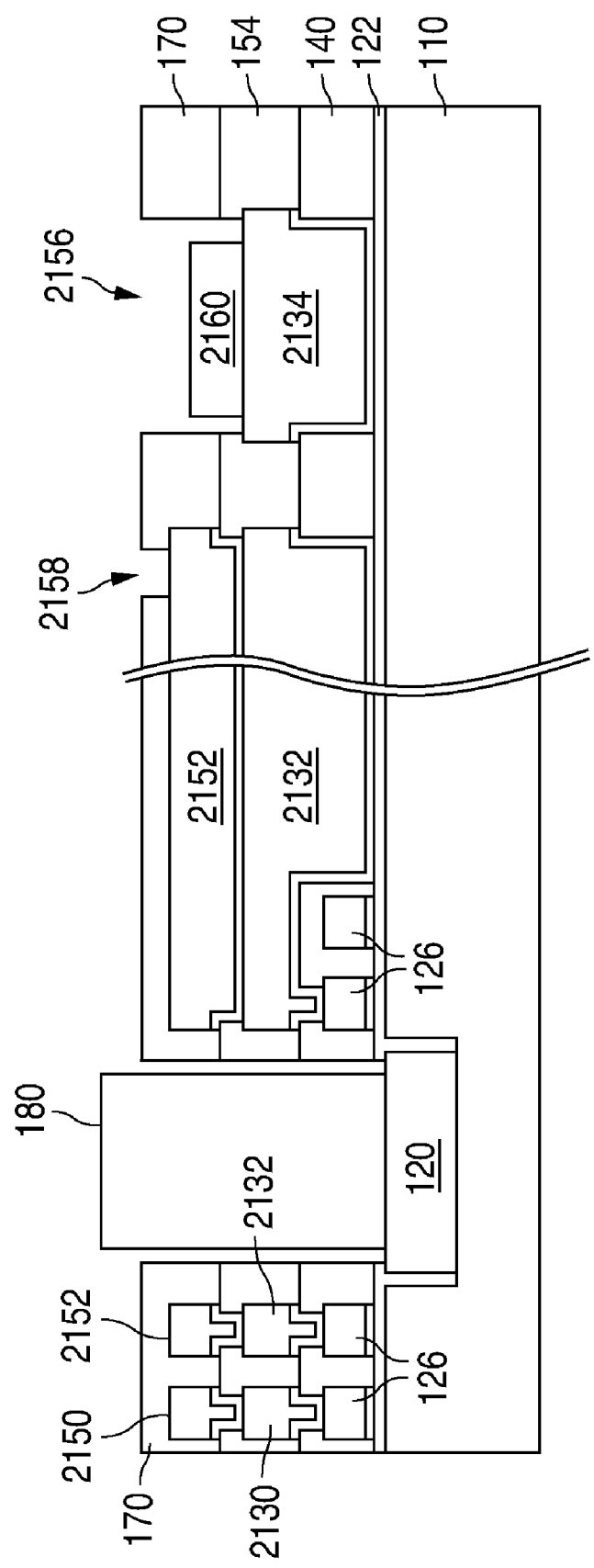
Figure 31A:
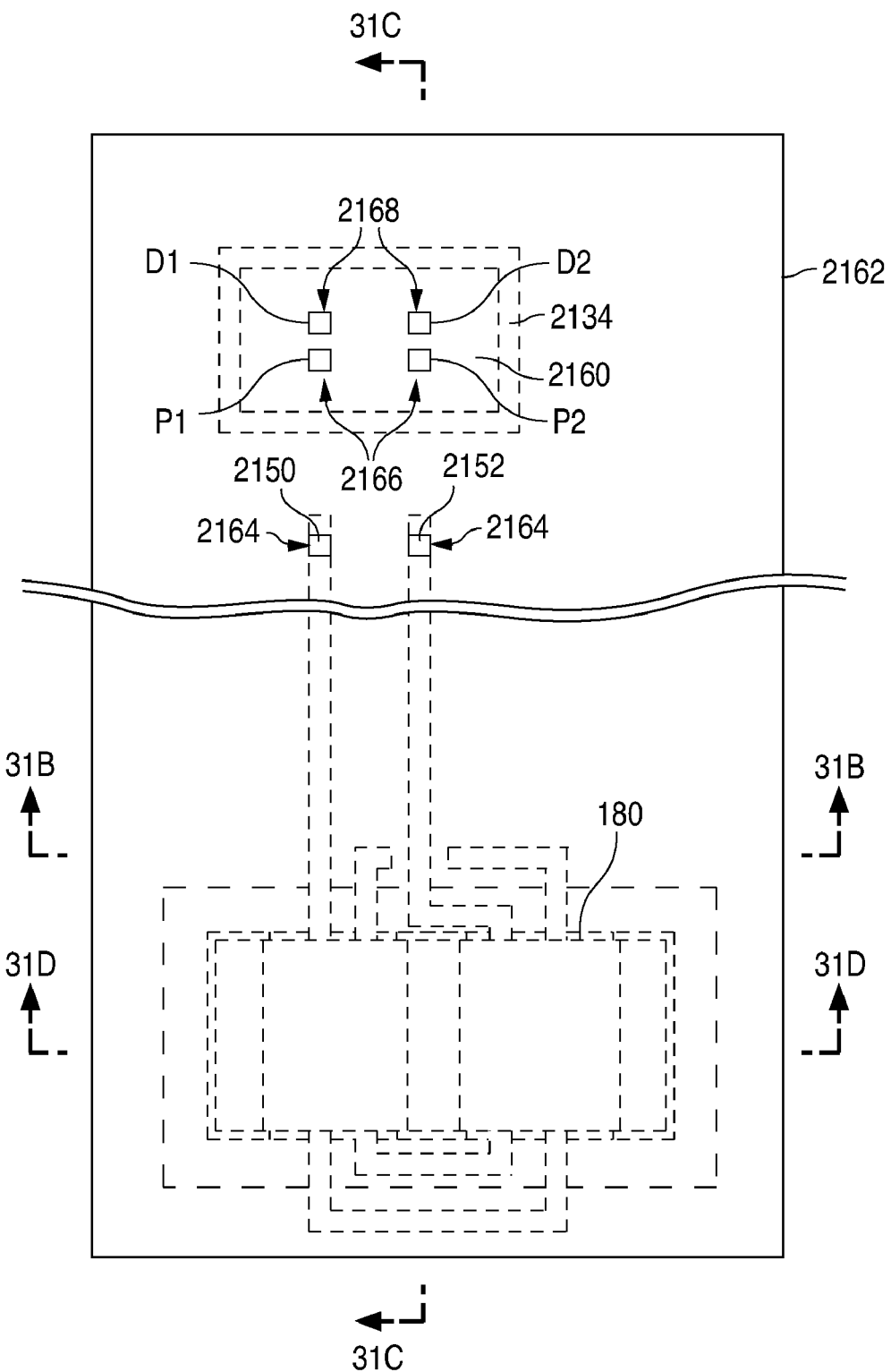
Figure 31B:
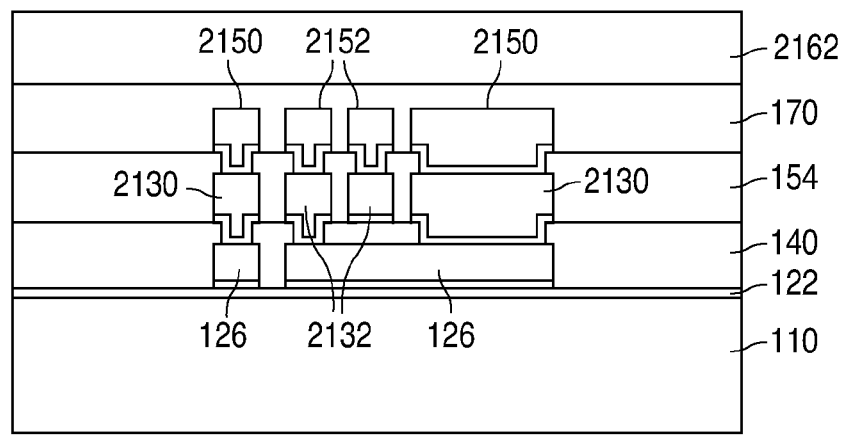
Figure 31D:
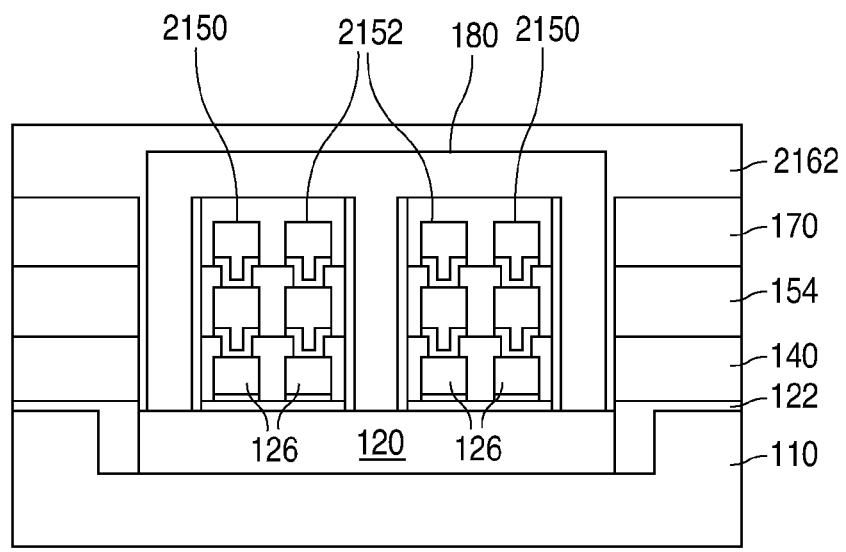
Figure 31C:
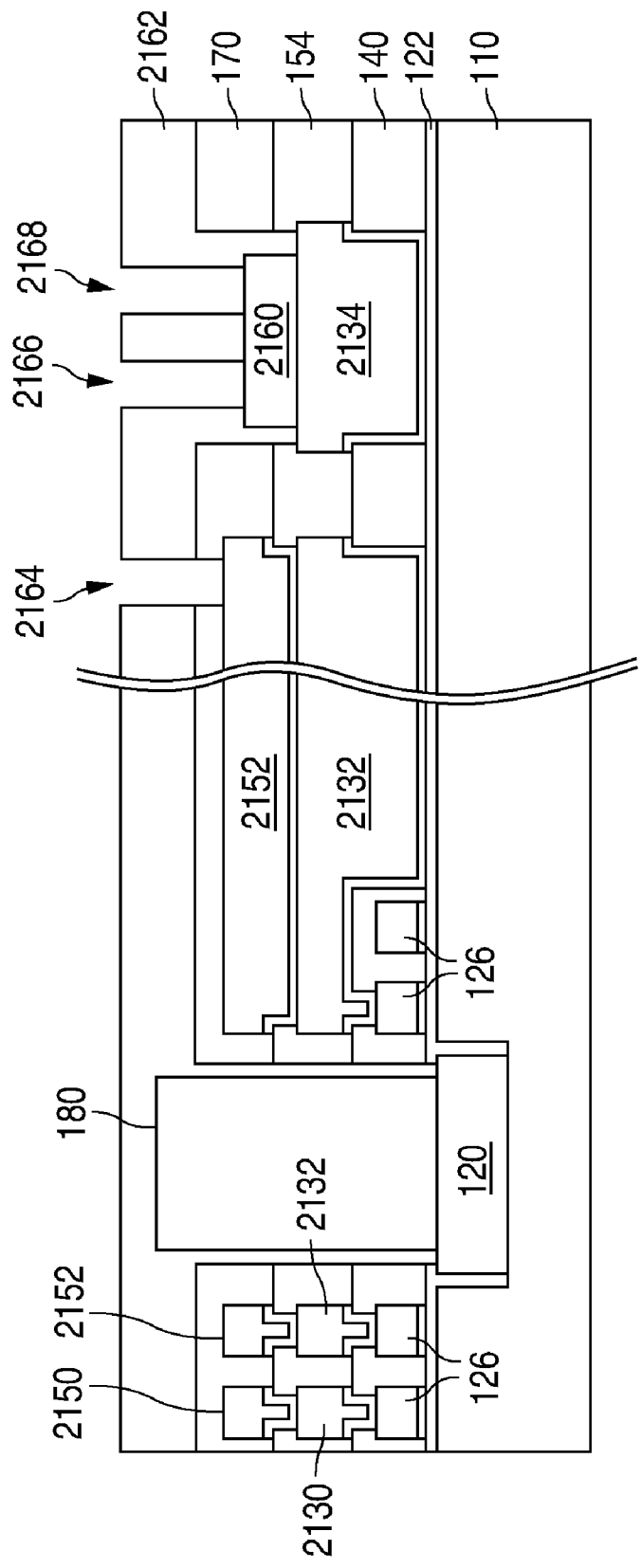
Figure 32A:
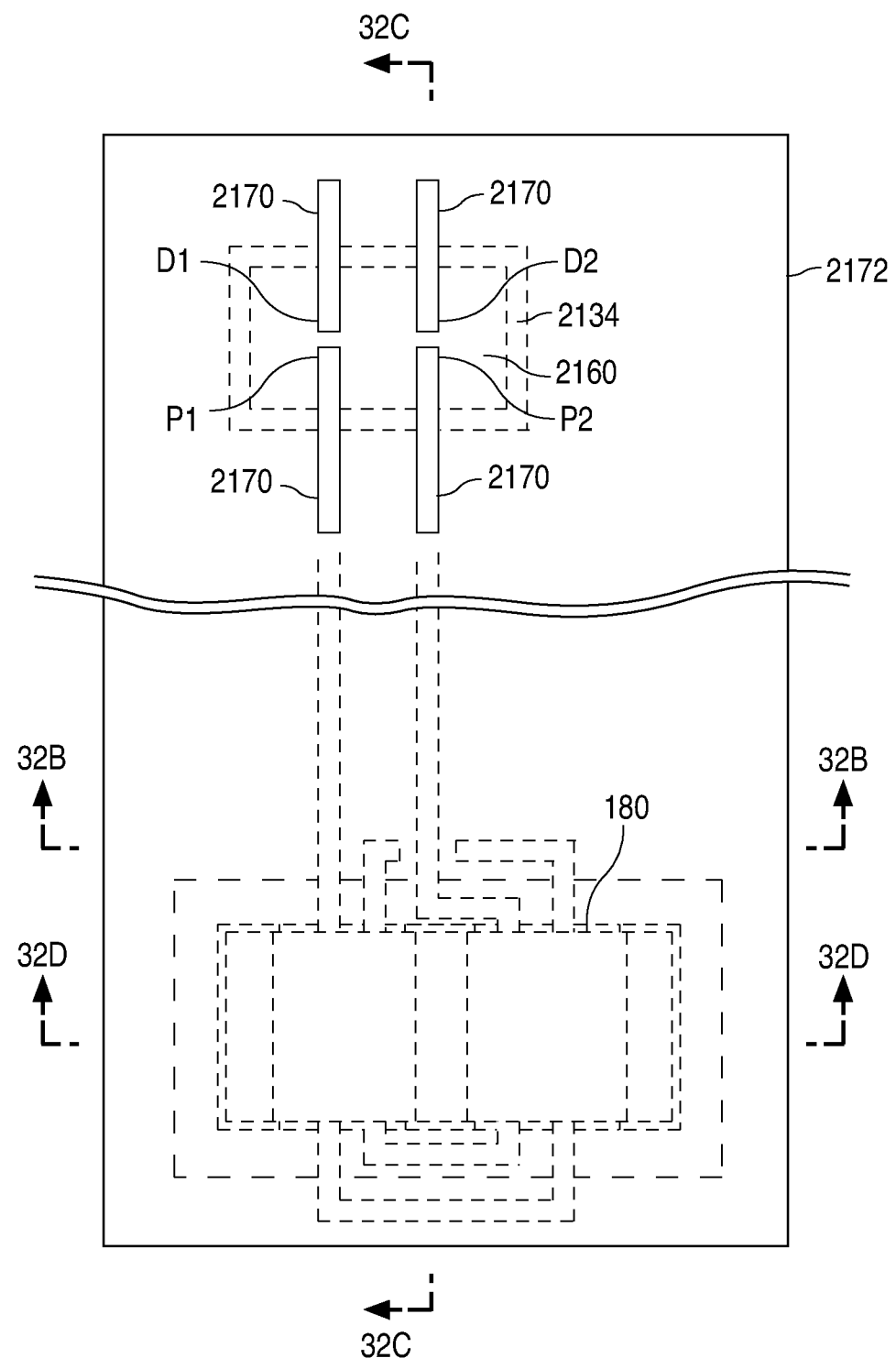
Figure 32B:
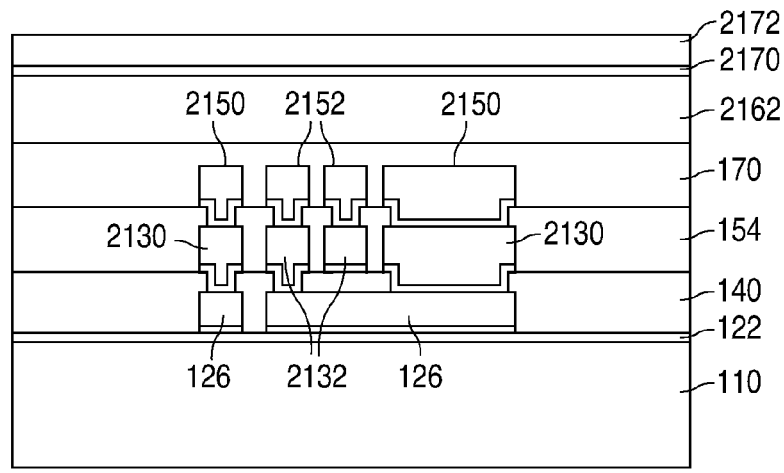
Figure 32D:
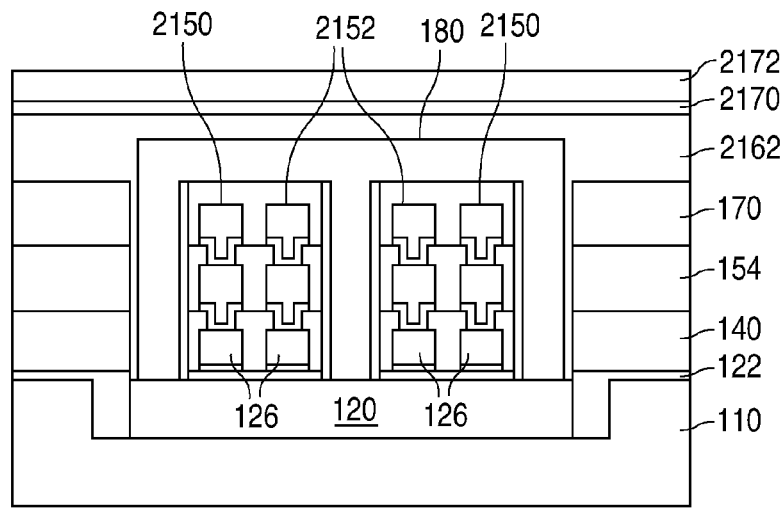
Figure 32C:
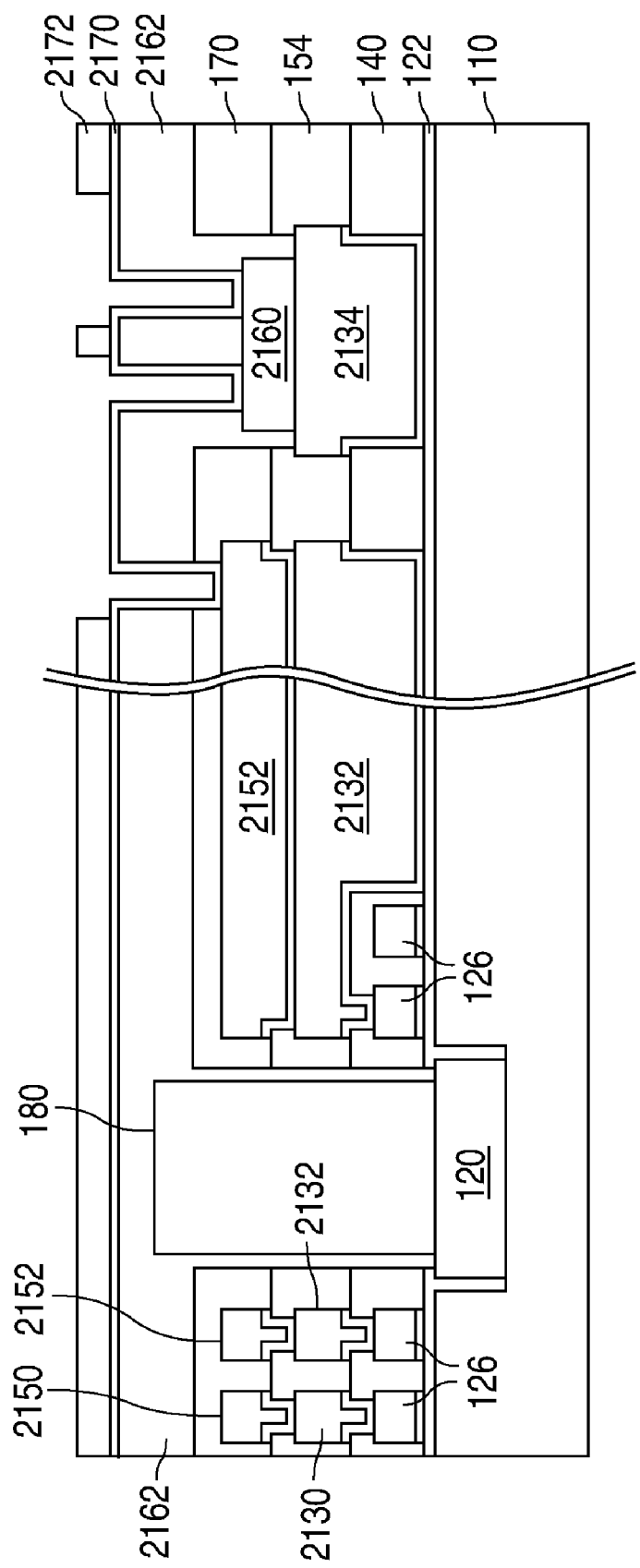
Figure 33A:
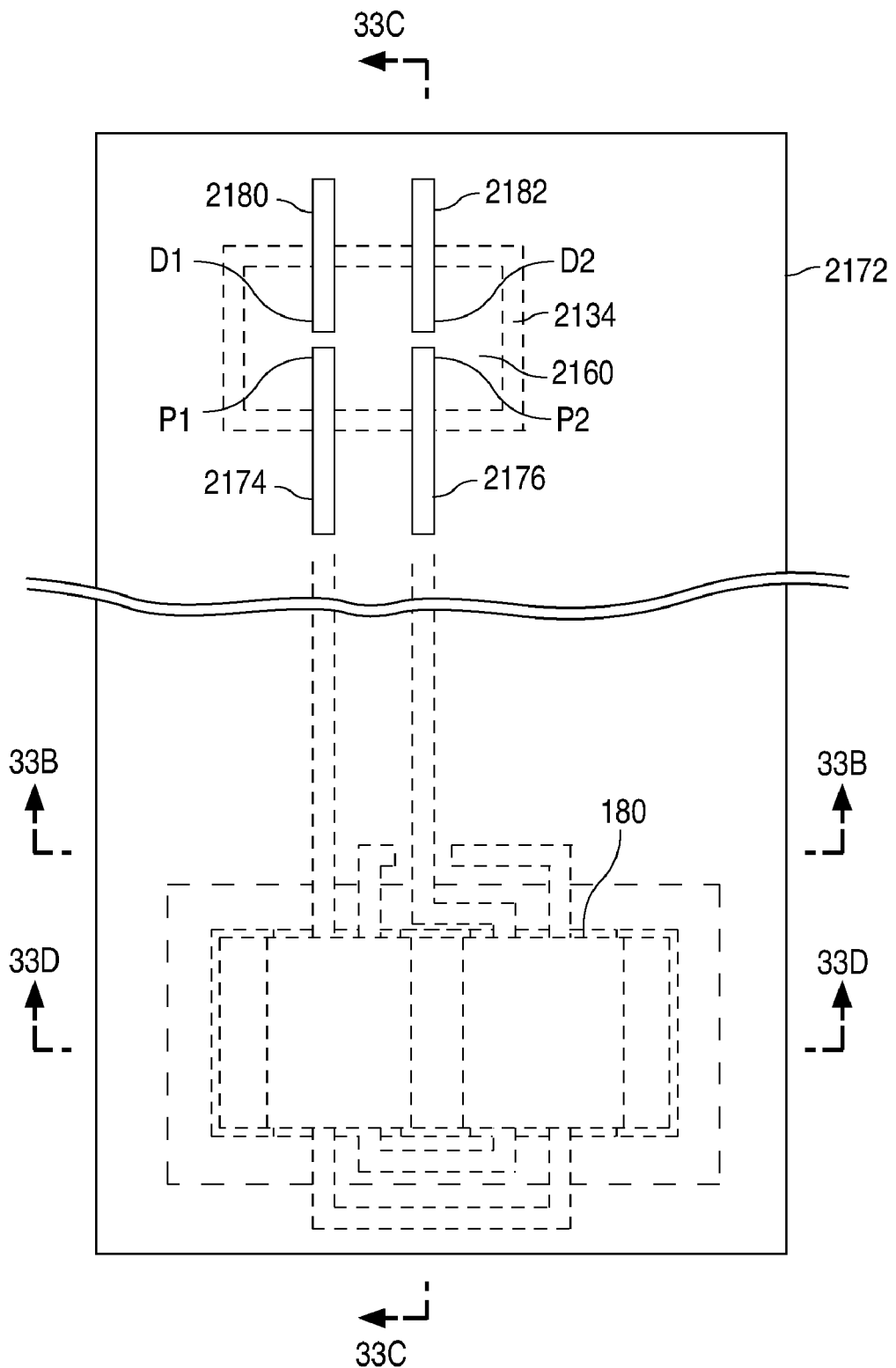
Figure 33B:
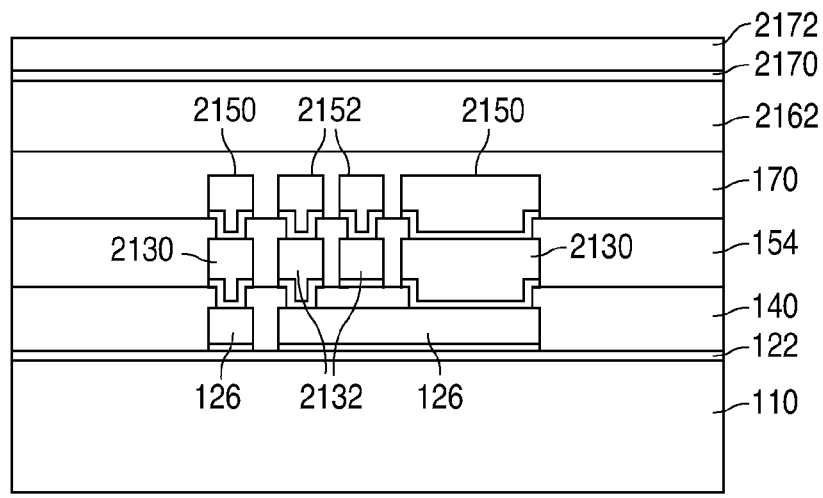
Figure 33D:
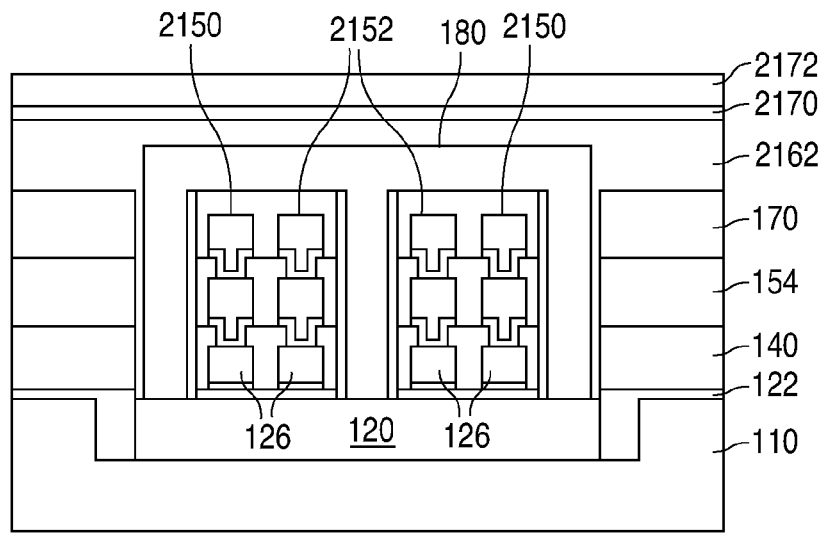
Figure 33C:
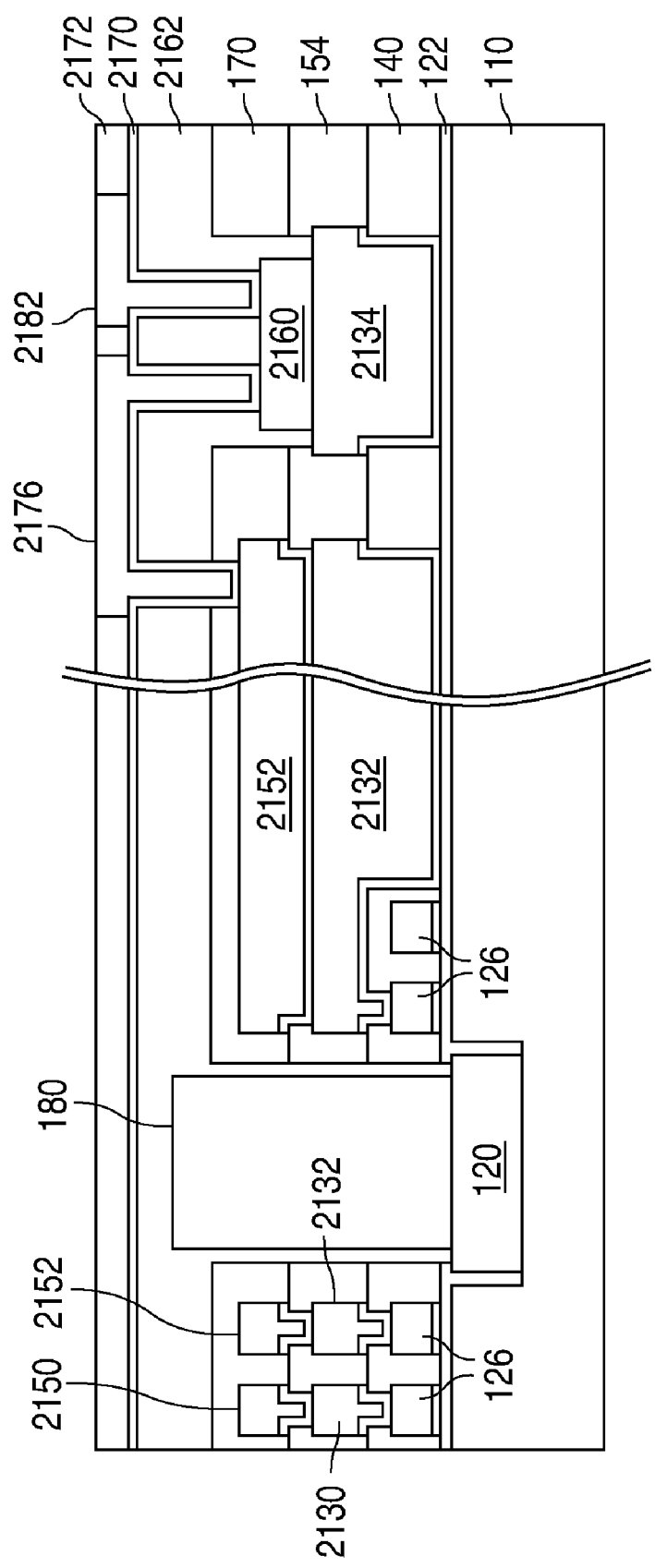
Figure 34A:
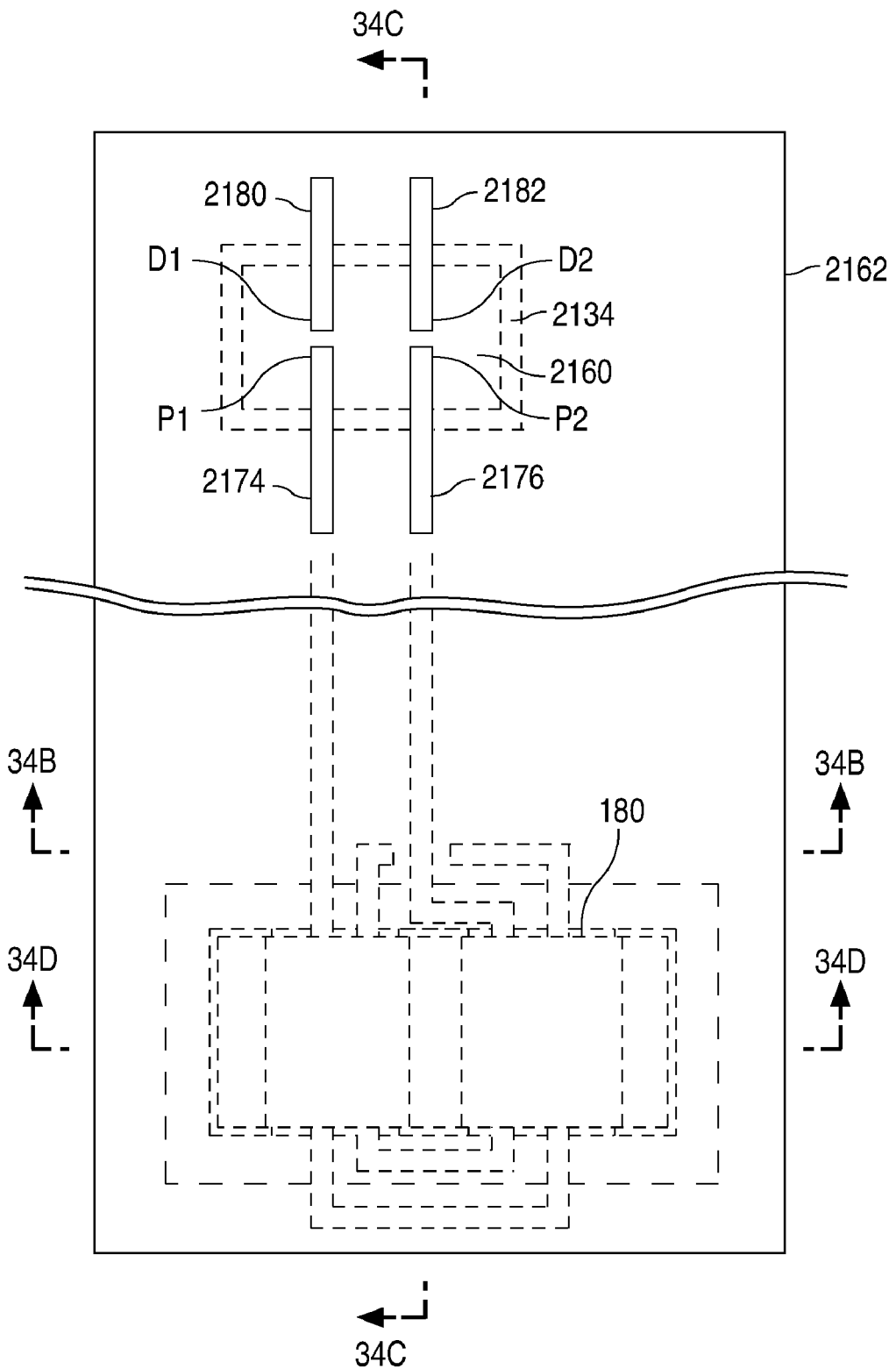
Figure 34B:
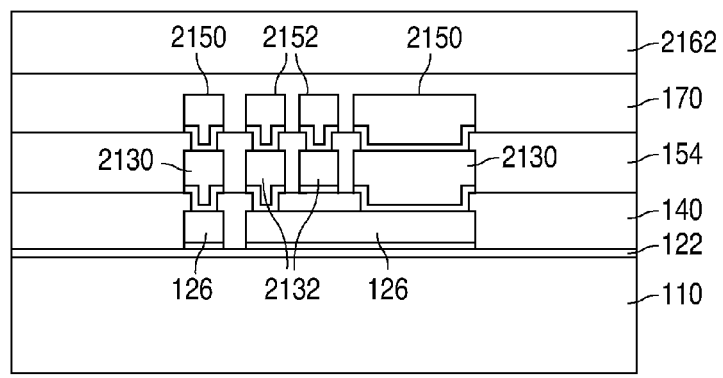
Figure 34D:
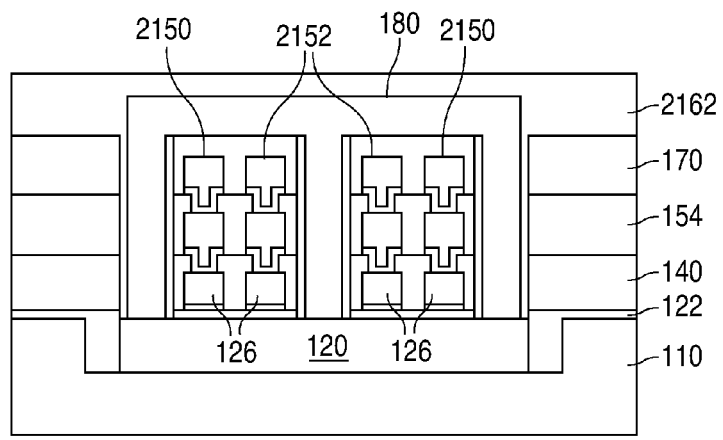
Figure 34C:
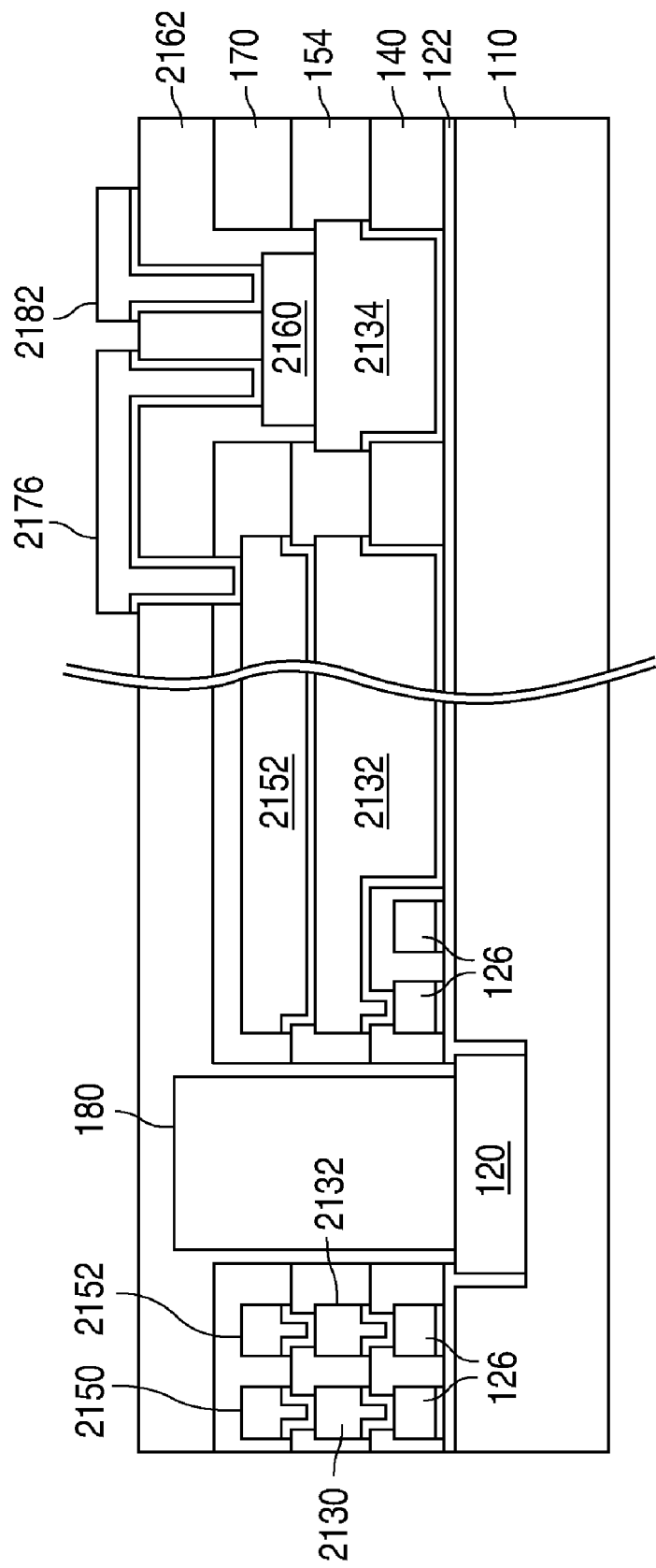
Figure 35A:
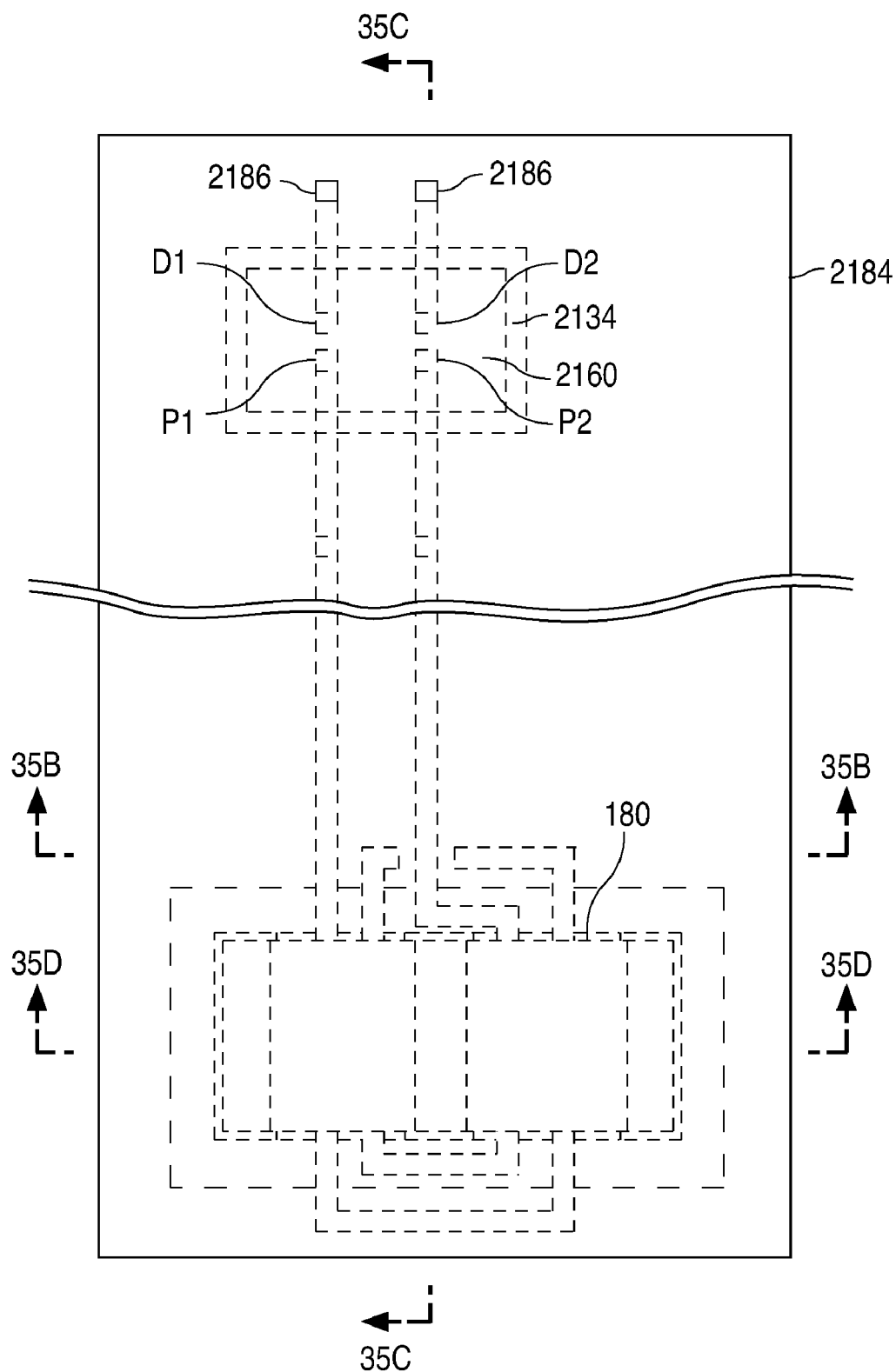
Figure 35B:
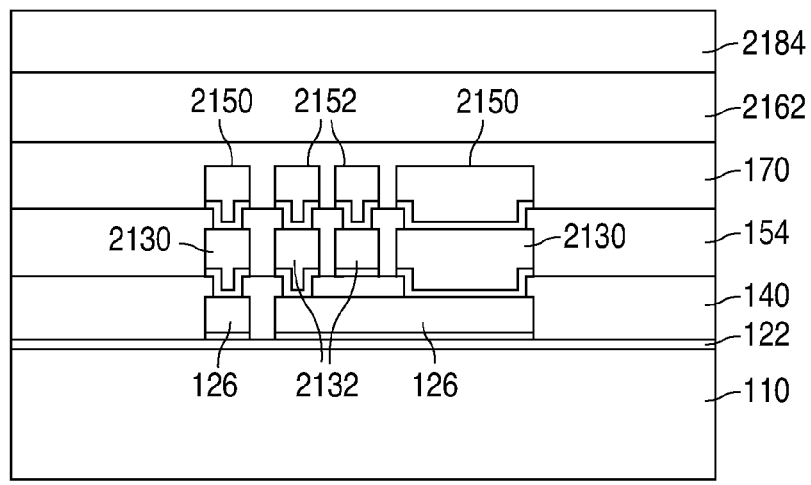
Figure 35D:
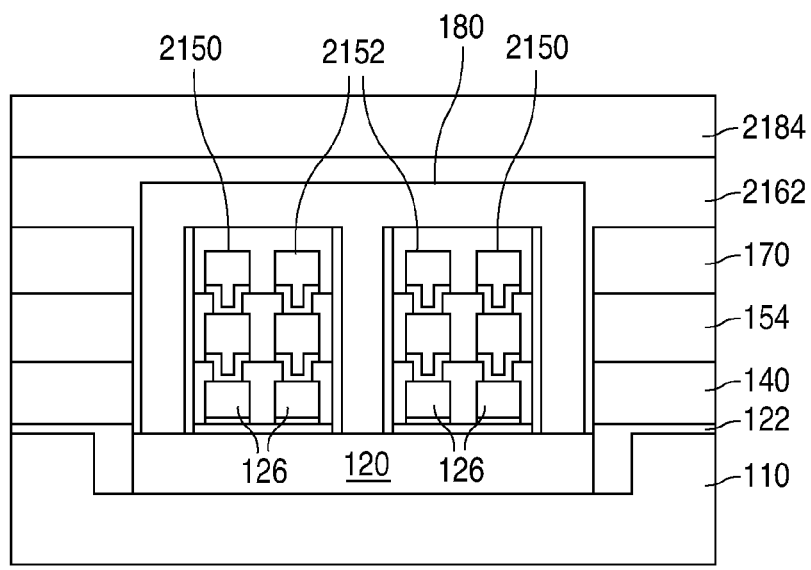
Figure 35C:
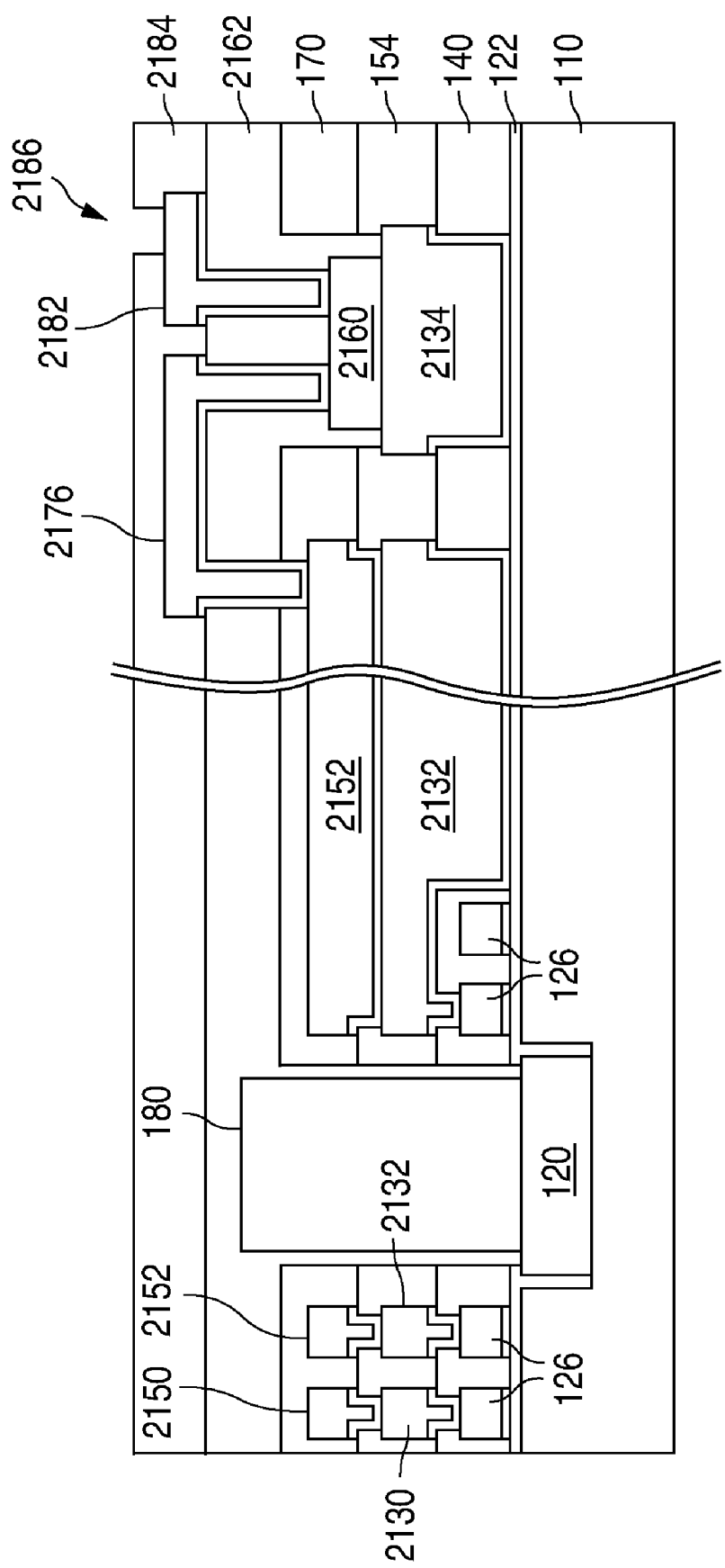
Figure 36A:
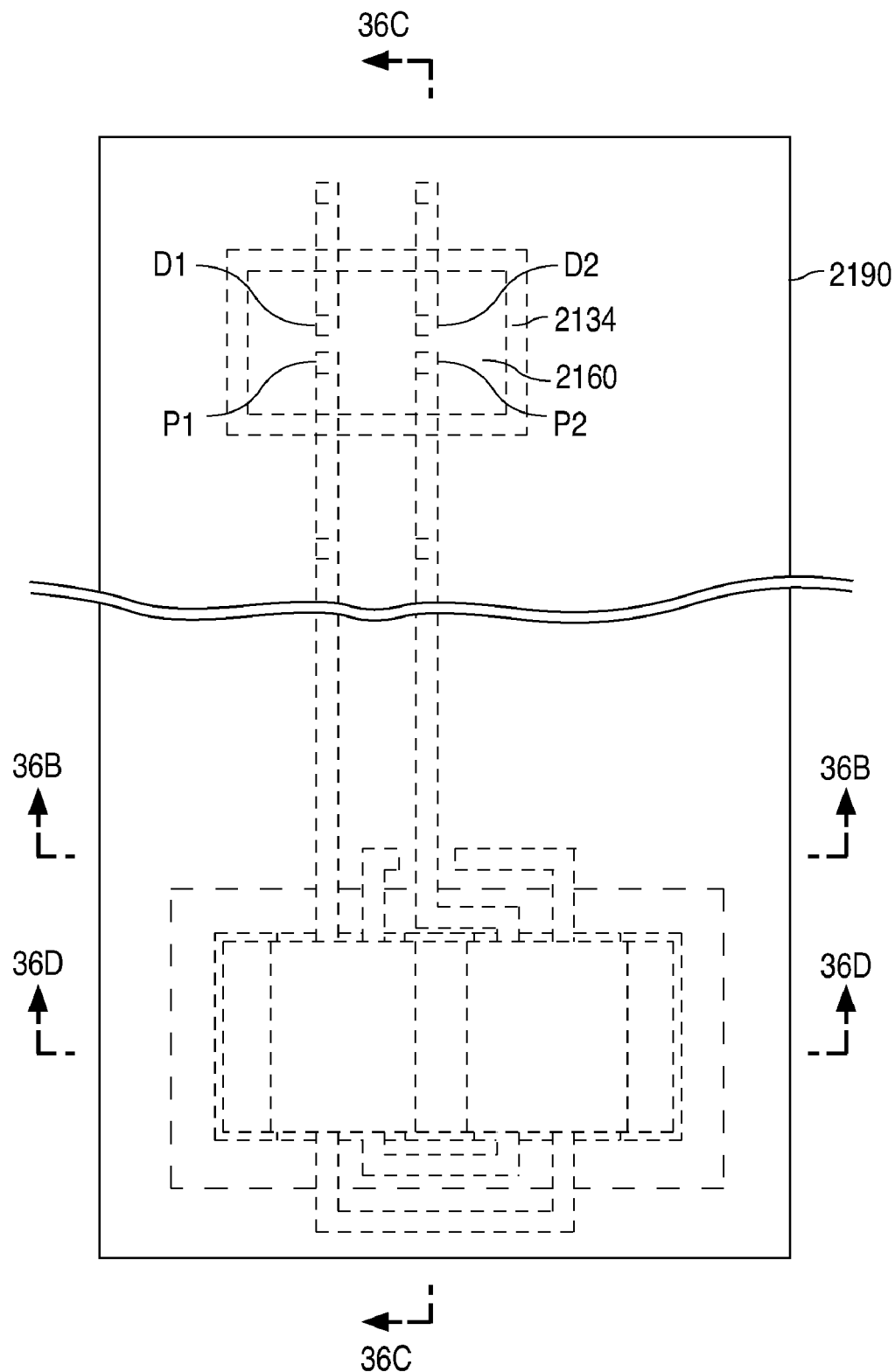
Figure 36B:
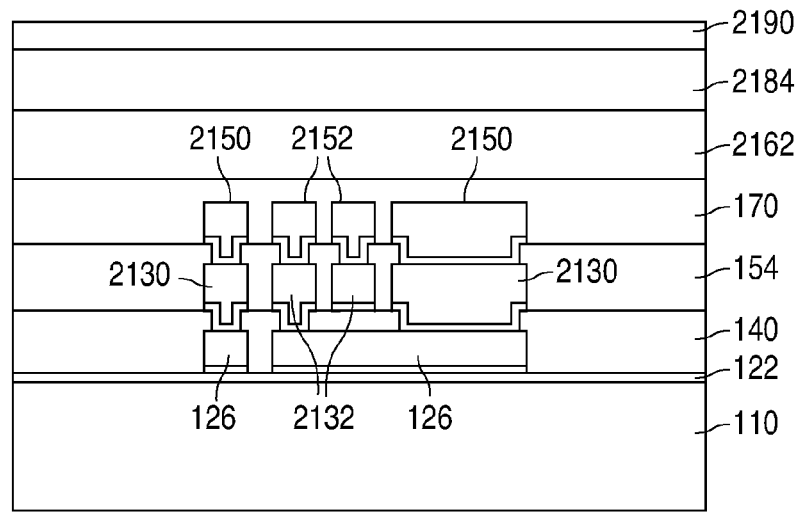
Figure 36D:
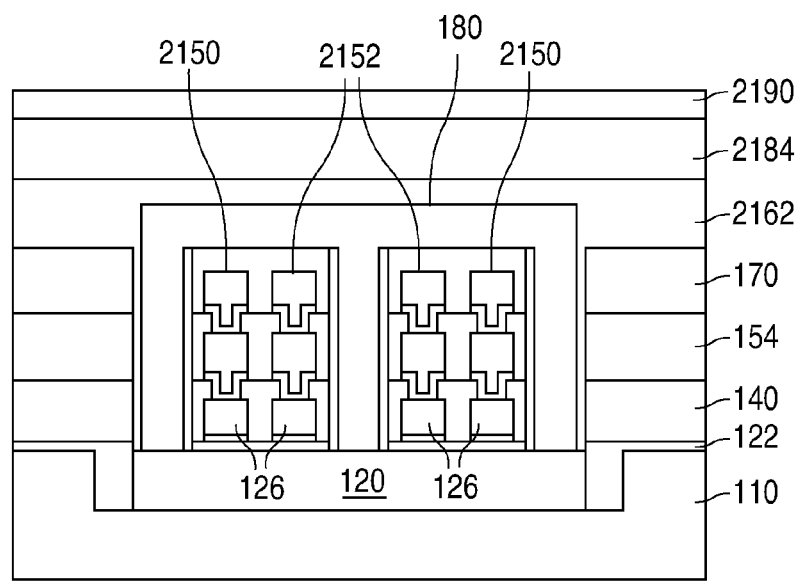
Figure 36C:
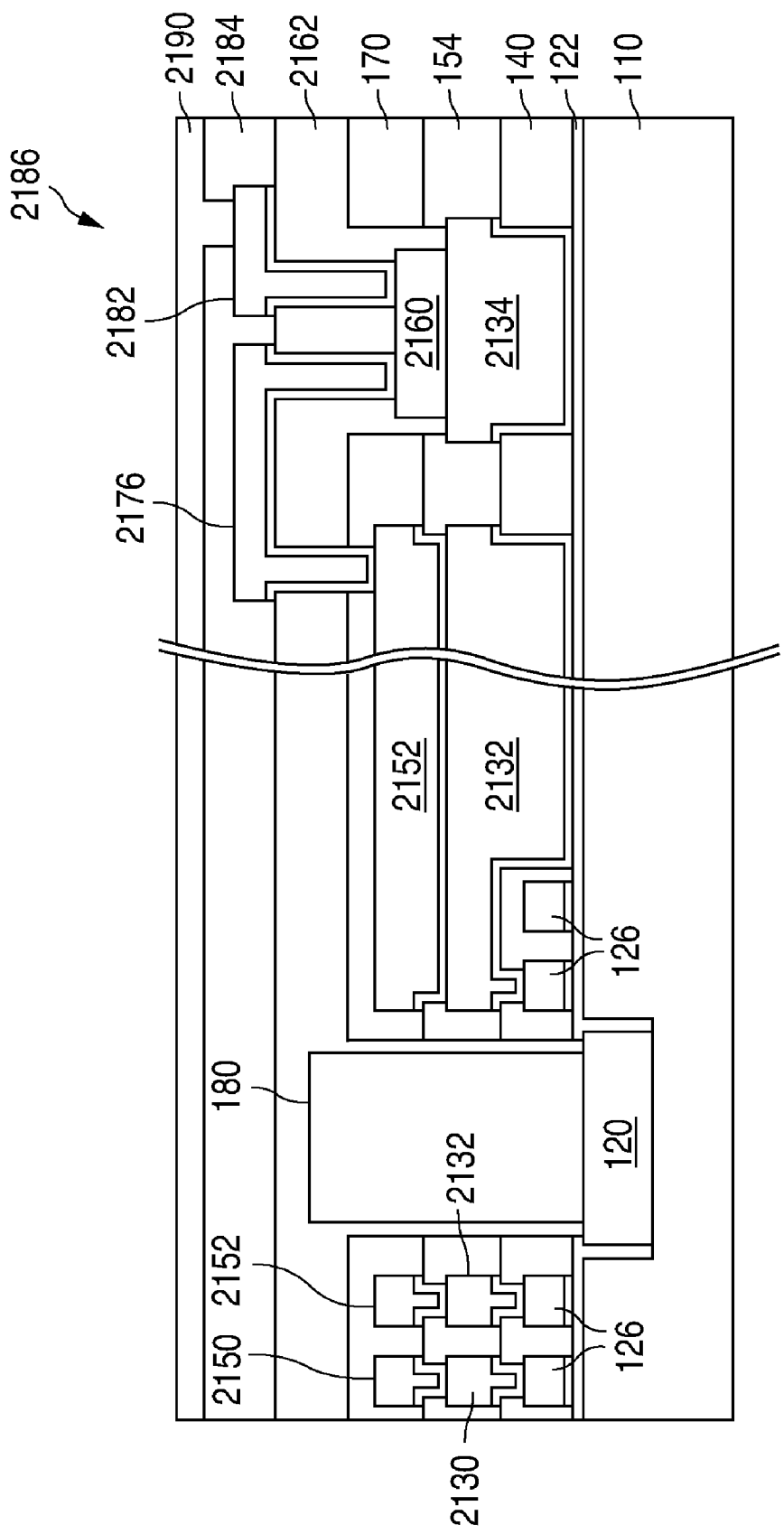
Figure 37A:
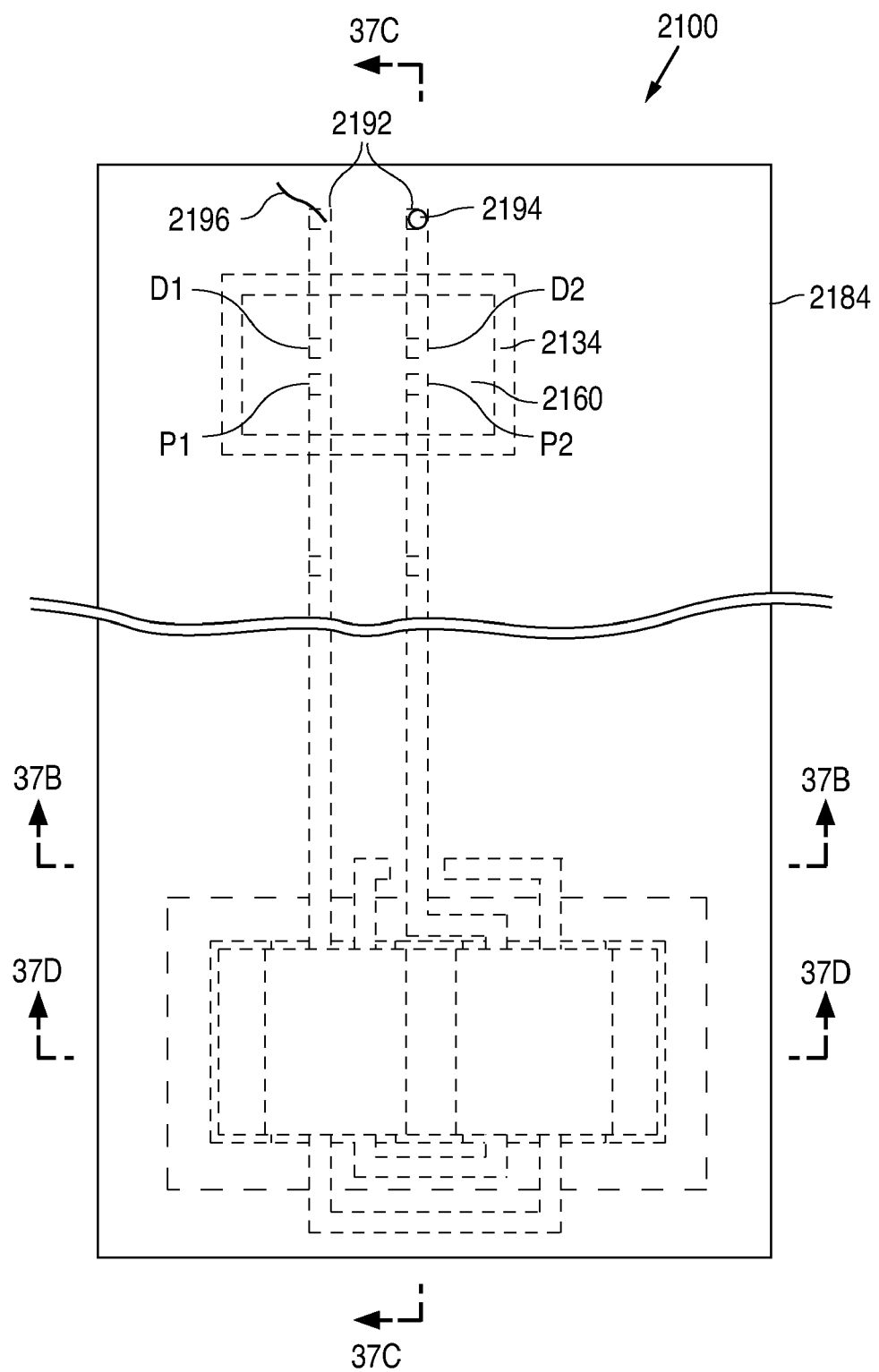
Figure 37B:
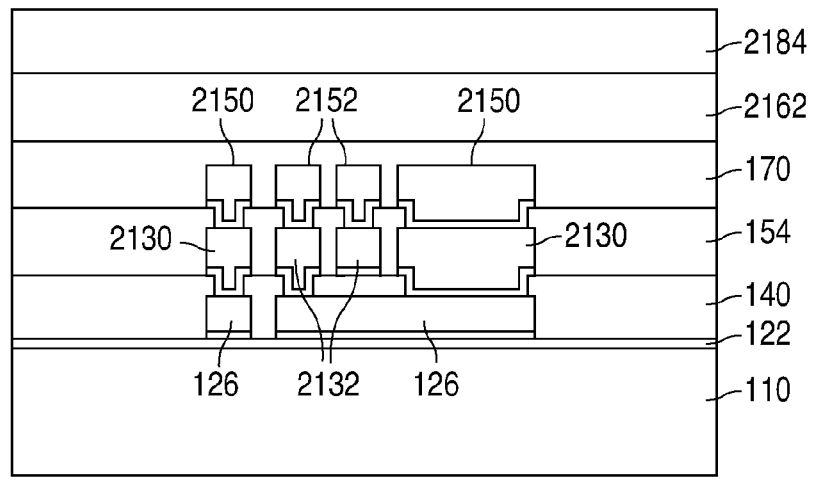
Figure 37D:
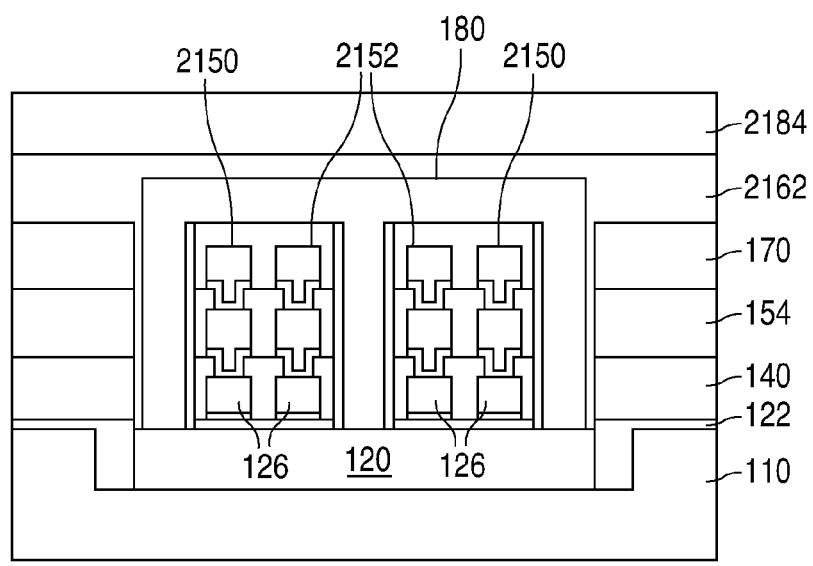
Figure 37C:
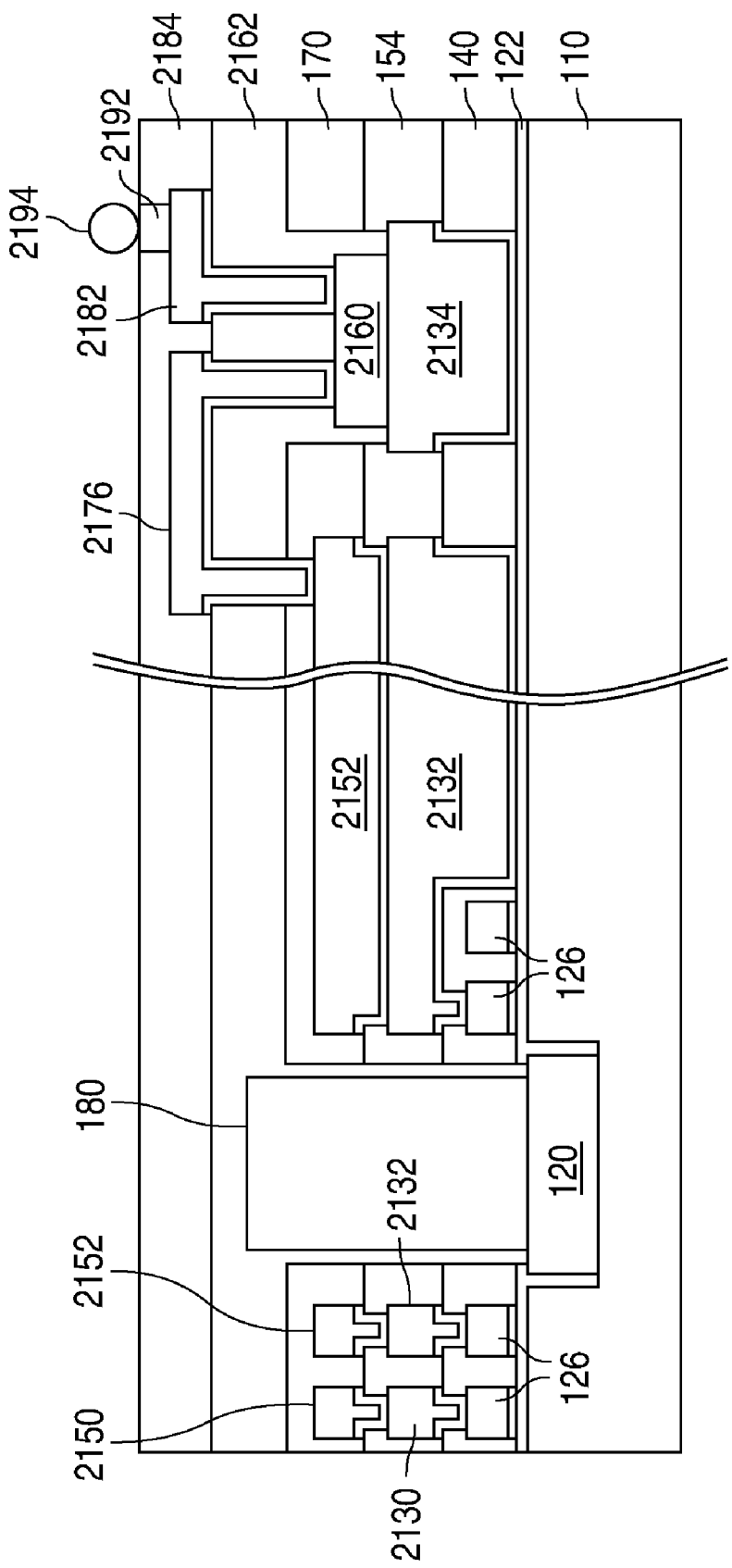

Thus, as shown in FIGS. 23C and 24C, a coil that includes coil sections 2130 and 2132 and coil structure 126 differs from a coil that includes coil structures 126 and 144 in that coil section 2132 steps over a loop of coil structure 126 at point A to provide a connection to the inner end of coil structure 126.

The method of forming integrated inductive device 2100 next differs in the patterning of the non-conductive layer and the subsequent formation of the top coil structure which, in the present example, is non-conductive layer 154 and coil structure 160. The patterning of the non-conductive layer and the subsequent formation of the top coil structure in FIGS. 25A-25D through FIGS. 28A-28D differs from the patterning of non-conductive layer 154 and the subsequent formation of coil structure 160 in FIGS. 14A-14B through FIGS. 18A-18B in that, as shown in FIGS. 25A-25D, the mask used to pattern non-conductive layer 154 is modified to form trench openings 2140 and 2142 in lieu of trench opening 156T, and an additional IC opening 2144. The openings 156E are also formed as before. (Alternately, via openings can be formed in lieu of the trench openings 2140 and 2142.)

Trench opening 2140 exposes coil section 2130 from one end of coil section to the other end of coil section 2130, trench opening 2142 exposes coil section 2132 from one end of coil section 2132 to the other end of coil section 2132, and IC opening 2144 exposes the top surface of heat sink 2134.

In addition, as shown in FIGS. 26A-26D, plating mold 164 is modified to expose the trench openings 2140 and 2142. Thus, as shown in FIGS. 27A-27D and 28A-28D, the electroplating forms coil sections 2150 and 2152 in lieu of coil structure 160. Coil sections 2150 and 2152, which include the copper formed in the trench openings or the optional via openings, are electrically connected together by way of coil sections 2130 and 2132 and coil structure 126. Further, coil section 2150 includes a coil portion 2150C and a trace portion 2150T, while coil section 2152 includes a coil portion 2152C and a trace portion 2152T.

The method of forming integrated inductive device 2100 next differs in the patterning of non-conductive layer 170. The patterning of non-conductive layer 170 in FIGS. 29A-29D differs from the patterning of non-conductive layer 170 in FIGS. 19A-19B in that, as shown in FIGS. 29A-29D, the mask used to pattern non-conductive layer 170 is modified to form an IC opening 2156 and interconnect openings 2158 in addition to the openings 172.

Following the formation of openings 172, 2156, and 2158, as shown in FIGS. 30A-30D, top core section 180 is placed in the openings 172 and attached to the top surface of non-conductive layer 170 in the same manner as illustrated in FIGS. 20A-20D. In addition, in accordance with the present invention, as further shown in FIGS. 30A-30D, after top core section 180 has been attached, an IC 2160 is placed in opening 2156 and attached to heat sink 2134.

IC 2160 can be implemented with any IC that utilizes an inductor, such as a buck converter, and can be thinned as needed by back grinding the wafer before dicing to form IC 2160. In addition, IC 2160 has inductor pads P1 and P2, and a number of operating pads, including pads D1 and D2. The operating pads include input/output, power, and ground pads. (Only two operating pads are shown for clarity.)

Further, IC 2160 can be placed in opening 2156 using a conventional pick and place machine, and attached in a conventional manner using, for example, conventional conductive or non-conductive adhesives, such as a die attach film. The die attach film can be, for example, 25 μm thick. (Alternately, the order of attaching top core section 180 and IC 2160 can be reversed.) Thus, sequential pick and place operations are utilized to attach top core section 180 and IC 2160, thereby minimizing the number of times the process flow must be interrupted to perform the pick and place operations.

As shown in FIGS. 31A-31D, after IC 2160 has been placed in opening 2156 and attached to heat sink 2134, the method continues by depositing a non-conductive layer 2162 on non-conductive layer 170, top core section 180, and IC 2160. In addition, non-conductive layer 2162 also fills up opening 2156 and the openings 172.

After non-conductive layer 2162 has been deposited, a pair of openings 2164 is formed in non-conductive layer 2162 to expose the top surface of coil sections 2150 and 2152, a pair of openings 2166 is formed to expose the top surfaces of pads P1 and P2, and openings 2168 are formed to expose the top surfaces of pads D1 and D2.

In the present example, non-conductive layer 2162 is formed with a layer of photoimageable epoxy or polymer, such as SU-8, which is substantially self planarizing. Once the photoimageable epoxy or polymer has been deposited, the openings 2164, 2166, and 2168 are formed by projecting a light through a mask to form a patterned image on non-conductive layer 2162 that softens the regions of non-conductive layer 2162 that are exposed by the light, and then removing the softened regions of non-conductive layer 2162.

After this, as shown in FIGS. 32A-32D, a seed layer 2170 is formed on non-conductive layer 2162 to line the openings 2164, 2166, and 2168. For example, seed layer 2170 can be formed by depositing 300 Å of titanium, 3000 Å of copper, and 300 Å of titanium. Once seed layer 2170 has been formed, a plating mold 2172 is formed on the top surface of seed layer 2170.

As shown in FIGS. 33A-33D, following the formation of plating mold 2172, the top titanium layer is stripped and copper is deposited by electroplating to form a metal line 2174 that is connected to coil section 2150 and pad P1, a metal line 2176 that is connected to coil section 2152 and pad P2, a metal line 2180 that is connected to pad D1, and a metal line 2182 that is connected to pad D2. As shown in FIGS. 34A-34D, after the electroplating, plating mold 2172 and the underlying regions of seed layer 2170 are removed.

As shown in FIGS. 35A-35D, after metal lines 2174, 2176, 2180, and 2182 have been formed, a non-conductive layer 2184 is deposited to touch the top surface of non-conductive layer 2162 and the lines 2174, 2176, 2180, and 2182. After non-conductive layer 2184 has been deposited, openings 2186 are formed in non-conductive layer 2184 to expose the top surfaces of pads D1 and D2.

In the present example, non-conductive layer 2184 is formed with a layer of photoimageable epoxy or polymer, such as SU-8, which is substantially self planarizing. Once the photoimageable epoxy or polymer has been deposited, the openings 2186 are formed by projecting a light through a mask to form a patterned image on non-conductive layer 2184 that softens the regions of non-conductive layer 2184 that are exposed by the light, and then removing the softened regions of non-conductive layer 2184.

Following this, as shown in FIGS. 36A-36D, a metal layer 2190, such as aluminum, aluminum-copper, or gold, is deposited on non-conductive layer 2184 and the metal structures 2180 and 2182. As shown in FIGS. 37A-37D, after metal layer 2190 has been deposited, metal layer 2190 is removed from the top surface of non-conductive layer 2184 to form a metal cap 2192, and complete the formation of integrated inductor device 2100. After forming metal cap 2192, fabrication continues with conventional back end processing steps, such as dicing wafer 110, and attaching a solder ball 2194 or a wire bond 2196 to metal cap 2192. Metal cap 2192 improves the adhesion of solder ball 2194 or wire bond 2196.

Thus, a method of forming an integrated inductive device has been described that forms an inductor and an IC on a common wafer. In addition, the method forms the inductor with a thick core by utilizing conventional pick and place technology to attach the bottom and top core sections 120 and 180, and also utilizes the pick and place technology to attach the IC.

Further, the method forms the inductor with a thick coil by utilizing a coil structure and a number of coil sections. Thus, the combination of coil structure 126 and coil sections 2130 and 2132, the combination of coil structure 126 and coil sections 2130, 2132, 2150, and 2152, or the combination of coil structure 126, coil sections 2130, 2132, 2150, and 2152, and a number of additional coil sections can be used depending upon the required thickness of the coil.

One of the advantages of the present example is that the present example illustrates the use of thick trace portions, i.e., trace portion 2130T and overlying trace portion 2150T of coil sections 2130 and 2150, and trace portion 2132T and overlying trace portion 2152T of coil sections 2132 and 2152, to provide a very low resistance connection between the inductor and the IC.

Thus, the thick coil and the thick trace portions of integrated inductive device 2100 have a very low resistance which, in turn, allows integrated inductive device 2100 to carry a large current. As a result, another advantage is that a thick core in combination with a large current capacity increases the quality factor.

Further, the use of a single wafer to carry an inductor and an IC substantially reduces the area required to implement the device when compared to discrete devices. (Although one IC is described, multiple ICs in the same or multiple layers can be alternately attached to wafer 110 to provide a further integrated device.

Figure 38A:
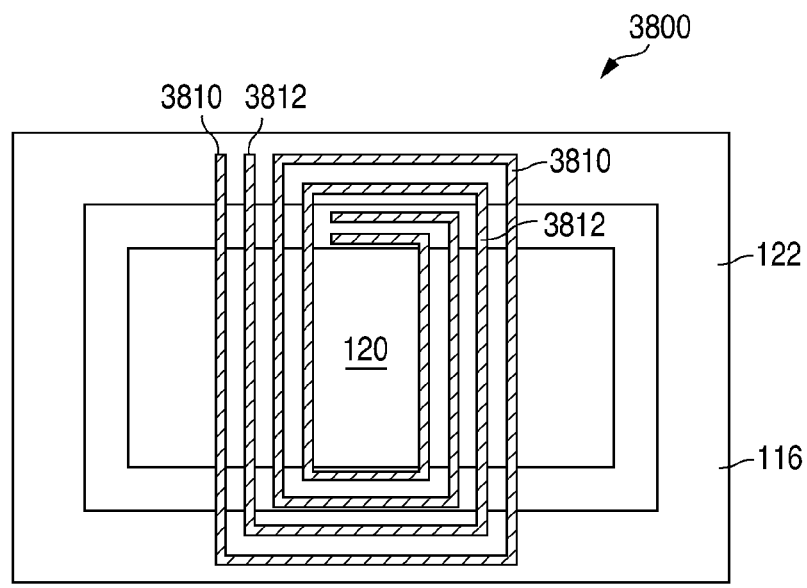
FIGS. 38A-38B are views illustrating an example of a transformer 3800 in accordance with an alternate embodiment of the present invention.
Figure 38B:
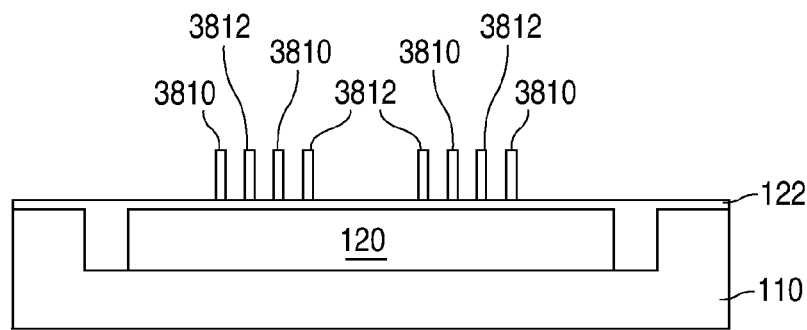

FIGS. 38A-38B show views that illustrate an example of a transformer 3800 in accordance with an alternate embodiment of the present invention. FIG. 38A shows a plan view, while FIG. 38B shows a cross-sectional view taken along line 38B-38B of FIG. 38A. FIGS. 38A-38B are similar to FIGS. 5A-5B and, as a result, utilize the same reference numerals to designate the structures which are common to both.

As shown in FIGS. 38A-38B, by modifying plating mold 132, a first coil structure 3810 and a second coil structure 3812 can be formed in lieu of single coil structure 126. Similarly, by modifying plating mold 152, two coil structures can be formed in lieu of coil structure 144. Thus, instead of the method illustrated in FIGS. 1A-20A through 1B-20B forming an inductor, the method can alternately form a transformer. Further, an integrated transformer device can also be formed by forming each of the coil structures, coil sections, and metal structures as two elements rather than one.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming an inductive structure on a conventional semiconductor structure comprising:
   providing a conventionally-formed semiconductor wafer with a cavity formed therein, the bottom surface of the cavity lined with a first non-conductive material;
   providing a first core structure, wherein the first core structure is formed in a conventional manner in a separate process, the first core structure is implemented in a material selected from alloys of (Co)NiFe, NiZn or MnZn;
   placing the first core structure in the cavity using a conventional pick and place machine and adhesively attaching the first core structure to the bottom of the cavity in the semiconductor wafer;
   depositing a second non-conductive layer to touch a top surface of the first core structure filling the remainder of the cavity;
   opening a plurality of openings in the second non-conductive layer to expose the top surface of the first core structure using conventional photolithographic methods;
   forming a first coil, having ends, to touch the second non-conductive layer and laying over a portion of the first core structure;
   depositing forming a third non-conductive layer to touch a top surface of the first coil structure, the top surface of the first core structure and the top surface of the second non-conductive layer;
   forming openings in the third non-conductive layer to expose the top surface of the first core structure using conventional photolithographic methods;
   providing a second core structure wherein the first core structure is formed in a conventional manner in a separate process, the second core structure is implemented in a material selected from alloys of (Co)NiFe, NiZn or MnZn;
   placing the second core structure in the openings in the third no-conductive layer to touch the top surface of the third non-conductive layer using a conventional pick and place machine and adhesively attaching the second core structure to the third non-conductive layer, the second core structure may touch, but is not attached to the first core structure;
   providing conventional back end processing steps, including formation of a passivation layer overlaying the inductive structure and forming openings that expose the top surfaces of the ends of the coil; and
   depositing a metal selected from the group of aluminum, aluminum-copper or gold on the ends of the coil prior to dicing and wire-bonding.

2. The method of claim 1 wherein no portion of the first core structure lies between any loops of the coil.

3. The method of claim 2 wherein a loop of the coil lies between a first portion and a second portion of the second core structure.

4. The method of claim 1, wherein forming the first coil includes: forming
   a first coil structure to touch the second non-conductive layer;
   forming the third non-conductive layer to touch the first coil structure;
   forming a trench opening that exposes the first coil structure using conventional photolithographic methods;
   forming a second coil structure to touch the third non-conductive layer and lie directly over the first coil structure, the second coil structure being electrically connected to the first coil structure.

5. The method of claim 1 and further comprising attaching an integrated circuit to the semiconductor structure.

6. The method of claim 5 and further comprising:
   forming a first metal structure that touches the coil;
   forming a second metal structure that touches the first metal structure and lies directly over the first metal structure; and
   forming a third metal structure that touches the second metal structure and the integrated circuit.

\* \* \* \* \*